US009256230B2

(12) United States Patent
Matsuoka et al.

(10) Patent No.: US 9,256,230 B2
(45) Date of Patent: Feb. 9, 2016

(54) HVAC SCHEDULE ESTABLISHMENT IN AN INTELLIGENT, NETWORK-CONNECTED THERMOSTAT

(71) Applicant: GOOGLE INC., Mountain View, CA (US)

(72) Inventors: Yoky Matsuoka, Palo Alto, CA (US); Anthony M. Fadell, Portola Valley, CA (US); Matthey L. Rogers, Los Gatos, CA (US); David Sloo, Menlo Park, CA (US); Eric A. Lee, Palo Alto, CA (US); Steven A. Hales, Palo Alto, CA (US); Mark D. Stefanski, Palo Alto, CA (US); Rangoli Sharan, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/842,048

(22) Filed: Mar. 15, 2013

(65) Prior Publication Data
US 2014/0058567 A1    Feb. 27, 2014

Related U.S. Application Data

(63) Continuation-in-part of application No. 13/632,041, filed on Sep. 30, 2012, now Pat. No. 8,630,740, and application No. 13/842,048, which is a continuation-in-part of application No. 13/269,501, (Continued)

(51) Int. Cl.
*G05D 23/19*    (2006.01)
*H04L 12/28*    (2006.01)
(Continued)

(52) U.S. Cl.
CPC ........ *G05D 23/1917* (2013.01); *G05D 23/1904* (2013.01); *H04L 12/2825* (2013.01); *H04L 12/40013* (2013.01); *F24F 2011/0071* (2013.01);
(Continued)

(58) Field of Classification Search
USPC ............... 700/83, 276, 27, 17, 82, 7, 278; 236/1 C, 94, 51, 18
See application file for complete search history.

(56) References Cited

U.S. PATENT DOCUMENTS 3,991,357 A  11/1976  Kaminski
4,183,290 A   1/1980  Kucharczyk
(Continued)

FOREIGN PATENT DOCUMENTS

CA    2202008    2/2000
EP     196069   12/1991
(Continued)

OTHER PUBLICATIONS

Aprilaire Electronic Thermostats Model 8355 User's Manual, Research Products Corporation, Dec. 2000, 16 pages.
(Continued)

*Primary Examiner* — Kidest Bahta
(74) *Attorney, Agent, or Firm* — Kilpatrick Townsend & Stockton LLP

(57) ABSTRACT

HVAC schedules may be programmed for a thermostat using a combination of pre-existing schedules or templates and automated schedule learning. For example, a pre-existing schedule may be initiated on the thermostat and the automated schedule learning may be used to update the pre-existing schedule based on users' interactions with the thermostat. The preexisting HVAC schedules may be stored on a device or received from a social networking service or another online service that includes shared HVAC schedules.

25 Claims, 41 Drawing Sheets

Related U.S. Application Data filed on Oct. 7, 2011, now Pat. No. 8,918,219, and a continuation-in-part of application No. 13/317,423, filed on Oct. 17, 2011, said application No. 13/269,501 is a continuation-in-part of application No. 13/033,573, filed on Feb. 23, 2011.

(60) Provisional application No. 61/550,346, filed on Oct. 21, 2011, provisional application No. 61/429,093, filed on Dec. 31, 2010, provisional application No. 61/429,093, filed on Dec. 31, 2010, provisional application No. 61/415,771, filed on Nov. 19, 2010.

(51) Int. Cl.
*H04L 12/40* (2006.01)
*F24F 11/00* (2006.01)

(52) U.S. Cl.
CPC . *F24F 2011/0072* (2013.01); *F24F 2011/0091* (2013.01); *H04L 2012/285* (2013.01)

(56) References Cited

U.S. PATENT DOCUMENTS

| | | | |
|---|---|---|---|
| 4,223,831 A | 9/1980 | Szarka | |
| 4,335,847 A | 6/1982 | Levine | |
| 4,408,711 A | 10/1983 | Levine | |
| 4,615,380 A | 10/1986 | Beckey | |
| 4,674,027 A | 6/1987 | Beckey | |
| 4,685,614 A | 8/1987 | Levine | |
| 4,751,961 A | 6/1988 | Levine et al. | |
| 4,897,798 A | 1/1990 | Cler | |
| 5,088,645 A | 2/1992 | Bell | |
| 5,211,332 A | 5/1993 | Adams | |
| 5,240,178 A | 8/1993 | Dewolf et al. | |
| 5,244,146 A | 9/1993 | Jefferson et al. | |
| 5,395,042 A | 3/1995 | Riley et al. | |
| 5,476,221 A | 12/1995 | Seymour | |
| 5,499,196 A | 3/1996 | Pacheco | |
| 5,555,927 A | 9/1996 | Shah | |
| 5,611,484 A | 3/1997 | Uhrich | |
| 5,808,294 A | 9/1998 | Neumann | |
| 5,902,183 A | 5/1999 | D'Souza | |
| 5,909,378 A | 6/1999 | De Milleville | |
| 5,918,474 A | 7/1999 | Khanpara et al. | |
| 5,977,964 A | 11/1999 | Williams et al. | |
| 6,062,482 A | 5/2000 | Gauthier et al. | |
| 6,066,843 A | 5/2000 | Scheremeta | |
| 6,072,784 A | 6/2000 | Agrawal et al. | |
| 6,095,427 A | 8/2000 | Hoium et al. | |
| 6,098,893 A | 8/2000 | Berglund et al. | |
| 6,216,956 B1 | 4/2001 | Ehlers et al. | |
| 6,349,883 B1 | 2/2002 | Simmons et al. | |
| 6,356,204 B1 | 3/2002 | Guindi et al. | |
| 6,370,894 B1 | 4/2002 | Thompson et al. | |
| 6,415,205 B1 | 7/2002 | Myron et al. | |
| 6,478,233 B1 | 11/2002 | Shah | |
| 6,595,430 B1 * | 7/2003 | Shah | 236/46 R |
| 6,645,066 B2 | 11/2003 | Gutta et al. | |
| 6,769,482 B2 | 8/2004 | Wagner et al. | |
| 6,824,069 B2 * | 11/2004 | Rosen | 236/94 |
| 6,868,293 B1 | 3/2005 | Schurr et al. | |
| 6,990,821 B2 | 1/2006 | Singh et al. | |
| 7,024,336 B2 | 4/2006 | Salsbury et al. | |
| 7,028,912 B1 * | 4/2006 | Rosen | 236/1 C |
| 7,114,554 B2 * | 10/2006 | Bergman et al. | 165/238 |
| 7,149,727 B1 | 12/2006 | Nicholls et al. | |
| 7,149,729 B2 | 12/2006 | Kaasten et al. | |
| 7,188,482 B2 | 3/2007 | Sadegh et al. | |
| 7,302,642 B2 * | 11/2007 | Smith et al. | 715/702 |
| 7,379,791 B2 | 5/2008 | Tamarkin et al. | |
| RE40,437 E | 7/2008 | Rosen | |
| 7,434,742 B2 * | 10/2008 | Mueller et al. | 236/46 C |
| 7,469,550 B2 | 12/2008 | Chapman, Jr. et al. | |
| 7,644,869 B2 | 1/2010 | Hoglund et al. | |
| 7,702,424 B2 | 4/2010 | Cannon et al. | |
| 7,784,704 B2 | 8/2010 | Harter | |
| 7,802,618 B2 | 9/2010 | Simon et al. | |
| 7,848,900 B2 | 12/2010 | Steinberg et al. | |
| 7,849,698 B2 | 12/2010 | Harrod et al. | |
| 7,854,389 B2 | 12/2010 | Ahmed | |
| 8,010,237 B2 | 8/2011 | Cheung et al. | |
| 8,019,567 B2 | 9/2011 | Steinberg et al. | |
| 8,037,022 B2 | 10/2011 | Rahman et al. | |
| 8,090,477 B1 | 1/2012 | Steinberg | |
| 8,091,375 B2 | 1/2012 | Crawford | |
| 8,131,497 B2 | 3/2012 | Steinberg et al. | |
| 8,174,381 B2 | 5/2012 | Imes et al. | |
| 8,180,492 B2 | 5/2012 | Steinberg | |
| 8,219,249 B2 | 7/2012 | Harrod et al. | |
| 2001/0052052 A1 | 12/2001 | Peng | |
| 2004/0015504 A1 | 1/2004 | Ahad et al. | |
| 2004/0117330 A1 * | 6/2004 | Ehlers et al. | 705/412 |
| 2004/0249479 A1 | 12/2004 | Shorrock | |
| 2005/0090915 A1 | 4/2005 | Geiwitz | |
| 2005/0120181 A1 | 6/2005 | Arunagirinathan et al. | |
| 2005/0128067 A1 | 6/2005 | Zakrewski | |
| 2005/0150968 A1 | 7/2005 | Shearer | |
| 2005/0189429 A1 | 9/2005 | Breeden | |
| 2005/0192915 A1 | 9/2005 | Ahmed et al. | |
| 2005/0280421 A1 | 12/2005 | Yomoda et al. | |
| 2006/0143236 A1 | 6/2006 | Wu | |
| 2006/0186214 A1 | 8/2006 | Simon et al. | |
| 2006/0196953 A1 | 9/2006 | Simon et al. | |
| 2006/0283965 A1 * | 12/2006 | Mueller et al. | 236/51 |
| 2007/0012793 A1 * | 1/2007 | Flood et al. | 236/51 |
| 2007/0043473 A1 * | 2/2007 | Anderson et al. | 700/265 |
| 2007/0045431 A1 | 3/2007 | Chapman, Jr. et al. | |
| 2007/0115902 A1 | 5/2007 | Shamoon et al. | |
| 2007/0205297 A1 | 9/2007 | Finkam et al. | |
| 2008/0015742 A1 | 1/2008 | Kulyk et al. | |
| 2008/0183335 A1 | 7/2008 | Poth et al. | |
| 2008/0191045 A1 | 8/2008 | Harter | |
| 2008/0273754 A1 | 11/2008 | Hick et al. | |
| 2008/0317292 A1 | 12/2008 | Baker et al. | |
| 2009/0001181 A1 | 1/2009 | Siddaramanna et al. | |
| 2009/0140062 A1 * | 6/2009 | Amundson et al. | 236/51 |
| 2009/0171862 A1 | 7/2009 | Harrod et al. | |
| 2009/0254225 A1 | 10/2009 | Boucher et al. | |
| 2009/0259713 A1 | 10/2009 | Blumrich et al. | |
| 2009/0297901 A1 | 12/2009 | Kilian et al. | |
| 2009/0327354 A1 | 12/2009 | Resnick et al. | |
| 2010/0019051 A1 | 1/2010 | Rosen | |
| 2010/0025483 A1 | 2/2010 | Hoeynck et al. | |
| 2010/0050004 A1 | 2/2010 | Hamilton, II et al. | |
| 2010/0070084 A1 | 3/2010 | Steinberg et al. | |
| 2010/0070086 A1 | 3/2010 | Harrod et al. | |
| 2010/0070234 A1 | 3/2010 | Steinberg et al. | |
| 2010/0076835 A1 | 3/2010 | Silverman | |
| 2010/0084482 A1 | 4/2010 | Kennedy et al. | |
| 2010/0167783 A1 | 7/2010 | Alameh et al. | |
| 2010/0179704 A1 | 7/2010 | Ozog | |
| 2010/0211224 A1 | 8/2010 | Keeling et al. | |
| 2010/0262298 A1 | 10/2010 | Johnson et al. | |
| 2010/0262299 A1 | 10/2010 | Cheung et al. | |
| 2010/0280667 A1 | 11/2010 | Steinberg | |
| 2010/0289643 A1 | 11/2010 | Trundle et al. | |
| 2010/0308119 A1 | 12/2010 | Steinberg et al. | |
| 2010/0318227 A1 | 12/2010 | Steinberg et al. | |
| 2011/0046792 A1 * | 2/2011 | Imes et al. | 700/278 |
| 2011/0046805 A1 | 2/2011 | Bedros et al. | |
| 2011/0046806 A1 | 2/2011 | Nagel et al. | |
| 2011/0077896 A1 | 3/2011 | Steinberg et al. | |
| 2011/0151837 A1 | 6/2011 | Winbush, III | |
| 2011/0160913 A1 | 6/2011 | Parker et al. | |
| 2011/0185895 A1 | 8/2011 | Freen | |
| 2011/0307103 A1 | 12/2011 | Cheung et al. | |
| 2011/0307112 A1 | 12/2011 | Barrilleaux | |
| 2012/0017611 A1 | 1/2012 | Coffel et al. | |
| 2012/0065935 A1 | 3/2012 | Steinberg et al. | |
| 2012/0085831 A1 | 4/2012 | Kopp | |
| 2012/0101637 A1 | 4/2012 | Imes et al. | |
| 2012/0158350 A1 | 6/2012 | Steinberg et al. | |

(56) References Cited

U.S. PATENT DOCUMENTS

| | | | |
|---|---|---|---|
| 2012/0165993 A1* | 6/2012 | Whitehouse | 700/278 |
| 2012/0221151 A1 | 8/2012 | Steinberg | |
| 2012/0252430 A1 | 10/2012 | Imes et al. | |

FOREIGN PATENT DOCUMENTS

| | | |
|---|---|---|
| JP | 59106311 | 6/1984 |
| JP | 01252850 | 10/1989 |
| KR | 1020070117874 | 12/2007 |

OTHER PUBLICATIONS

Braeburn 5300 Installer Guide, Braeburn Systems, LLC, Dec. 9, 2009, 10 pages.
Braeburn Model 5200, Braeburn Systems, LLC, Jul. 20, 2011, 11 pages.
Ecobee Smart Si Thermostat Installation Manual, Ecobee, Apr. 3, 2012, 40 pages.
Ecobee Smart Si Thermostat User Manual, Ecobee, Apr. 3, 2012, 44 pages.
Ecobee Smart Thermostat Installation Manual, Jun. 29, 2011, 20 pages.
Ecobee Smart Thermostat User Manual, May 11, 2010, 20 pages.
Electric Heat Lock Out on Heat Pumps, Washington State University Extension Energy Program, Apr. 2010, pp. 1-3.
Honeywell Installation Guide FocusPRO TH6000 Series, Honeywell International, Inc., Jan. 5, 2012, 24 pages.
Honeywell Operating Manual FocusPRO TH6000 Series, Honeywell International, Inc., Mar. 25, 2011, 80 pages.
Honeywell Prestige IAQ Product Data 2, Honeywell International, Inc., Jan. 12, 2012, 126 pages.
Honeywell Prestige THX9321 and TXH9421 Product Data, Honeywell International, Inc., 68-0311, Jan. 2012, 126 pages.
Honeywell Prestige THX9321-9421 Operating Manual, Honeywell International, Inc., Jul. 6, 2011, 120 pages.
Hunter Internet Thermostat Installation Guide, Hunter Fan Co., Aug. 14, 2012, 8 pages.
Introducing the New Smart Si Thermostat, Datasheet [online]. Ecobee, Mar. 2012 [retrieved on Feb. 25, 2013]. Retrieved from the Internet: <URL: https://www.ecobee.com/solutions/home/smart-si/>, Mar. 12, 2012, 4 pages.
Lennox ComfortSense 5000 Owners Guide, Lennox Industries, Inc., Feb. 2008, 32 pages.
Lennox ComfortSense 7000 Owners Guide, Lennox Industries, Inc., May 2009, 15 pages.
Lennox iComfort Manual, Lennox Industries, Inc., Dec. 2010, 20 pages.
Lux PSPU732T Manual, LUX Products Corporation, Jan. 6, 2009, 48 pages.
NetX RP32—WiFi Network Thermostat Consumer Brochure, Network Thermostat, May 2011, 2 pages.
NetX RP32—WiFi Network Thermostat Specification Sheet, Network Thermostat, Feb. 28, 2012, 2 pages.
RobertShaw Product Manual 9620, Maple Chase Company, Jun. 12, 2001, 14 pages.
RobertShaw Product Manual 9825i2, Maple Chase Company, Jul. 17, 2006, 36 pages.
SYSTXCCUIZ01-V Infinity Control Installation Instructions, Carrier Corp, May 31, 2012, 20 pages.
T8611G Chronotherm IV Deluxe Programmable Heat Pump Thermostat Product Data, Honeywell International Inc., Oct. 1997, 24 pages.
TB-PAC, TB-PHP, Base Series Programmable Thermostats, Carrier Corp, May 14, 2012, 8 pages.
The Perfect Climate Comfort Center PC8900A W8900A-C Product Data Sheet, Honeywell International Inc., Apr. 2001, 44 pages.
TP-PAC, TP-PHP, TP-NAC, TP-NHP Performance Series AC/HP Thermostat Installation Instructions, Carrier Corp, Sep. 2007, 56 pages.
Trane Communicating Thermostats for Fan Coil, Trane, May 2011, 32 pages.
Trane Communicating Thermostats for Heat Pump Control, Trane, May 2011, 32 pages.
Trane Install XL600 Installation Manual, Trane, Mar. 2006, 16 pages.
Trane XL950 Installation Guide, Trane, Mar. 2011, 20 pages.
Venstar T2900 Manual, Venstar, Inc., Apr. 2008, 113 pages.
Venstar T5800 Manual, Venstar, Inc., Sep. 7, 2011, 63 pages.
VisionPRO TH8000 Series Installation Guide, Honeywell International, Inc., Jan. 2012, 12 pages.
VisionPRO TH8000 Series Operating Manual, Honeywell International, Inc., Mar. 2011, 96 pages.
VisionPRO Wi-Fi Programmable Thermostat, Honeywell International, Inc., Operating Manual, Aug. 2012, 48 pages.
White Rodgers (Emerson) Model 1F81-261 Installation and Operating Instructions, White Rodgers, Apr. 15, 2010, 8 pages.
White Rodgers (Emerson) Model IF98EZ-1621 Homeowner's User Guide, White Rodgers, Jan. 25, 2012, 28 pages.
Akhlaghinia et al., "Occupancy Monitoring in Intelligent Environment through Integrated Wireless Localizing Agents", IEEE, 2009, 7 pages.
Akhlaghinia et al., "Occupant Behaviour Prediction in Ambient Intelligence Computing Environment", Journal of Uncertain Systems, vol. 2, No. 2, 2008, pp. 85-100.
Allen et al., "Real-Time Earthquake Detection and Hazard Assessment by ElarmS Across California", Geophysical Research Letters, vol. 36, L00B08, 2009, pp. 1-6.
Chatzigiannakis et al., "Priority Based Adaptive Coordination of Wireless Sensors and Actors", [online] Q2SWinet '06, Oct. 2, 2006 [Retrieved on Mar. 12, 2012]. Retrieved from the Internet: <URL: http://dl.acm.org/citation.cfm?id=1163681>.
Deleeuw, "Ecobee WiFi Enabled Smart Thermostat Part 2: The Features Review", Retrieved from <URL: http://www.homenetworkenabled.com/content.php?136-ecobee-WiFi-enabled-Smart-Thermostat-Part-2-The-Features-review>, Dec. 2, 2011, 5 pages.
Gao et al., "The Self-Programming Thermostat: Optimizing Setback Schedules Based on Home Occupancy Patterns", In Proceedings of the First ACM Workshop on Embedded Sensing Systems for Energy-Efficiency in Buildings, Nov. 3, 2009, 6 pages.
Loisos et al., "Buildings End-Use Energy Efficiency: Alternatives to Compressor Cooling", California Energy Commission, Public Interest Energy Research, Jan. 2000, 80 pages.
Lu et al., "The Smart Thermostat: Using Occupancy Sensors to Save Energy in Homes", In Proceedings of the 8th ACM Conference on Embedded Networked Sensor Systems, Nov. 3-5, 2010, pp. 211-224.
Mozer, "The Neural Network House: An Environmental that Adapts to It's Inhabitants", AAAI Technical Report SS-98-02, 1998, pp. 110-114.
International Patent Application No. PCT/US2011/061437, International Search Report & Written Opinion, mailed Apr. 10, 2012, 8 pages.
International Patent Application No. PCT/US2012/020026, International Search Report & Written Opinion, mailed May 3, 2012, 8 pages.
Ros et al., "Multi-Sensor Human Tracking with the Bayesian Occupancy Filter", IEEE, 2009, 8 pages.
Wong et al., "Maximum Likelihood Estimation of ARMA Model with Error Processes for Replicated Observations", National University of Singapore, Department of Economics, Working Paper No. 0217, 2002, 19 pages.

* cited by examiner

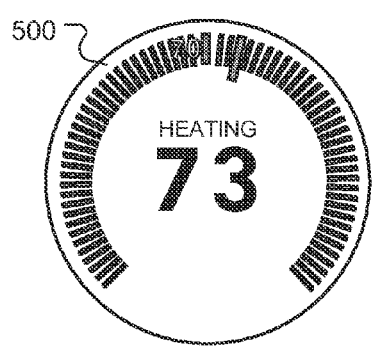
FIG. 5A-1
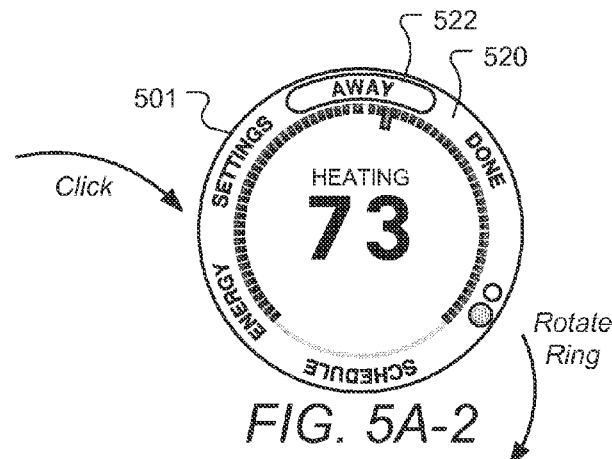
FIG. 5A-2
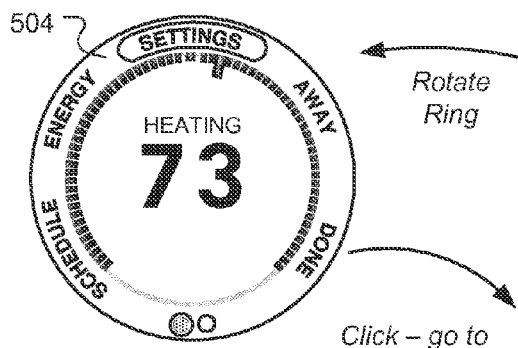
FIG. 5A-3
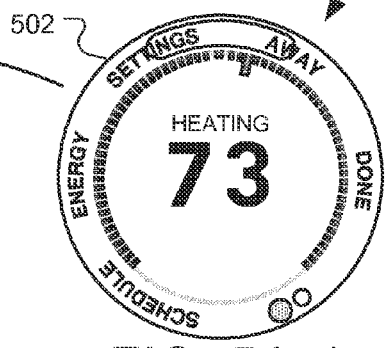
FIG. 5A-4
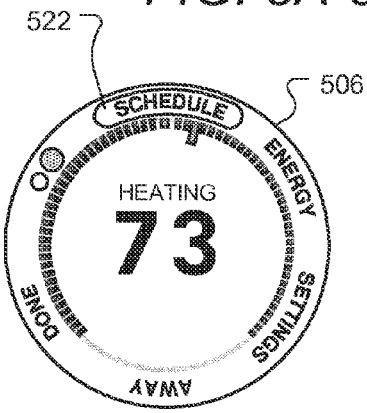
FIG. 5B
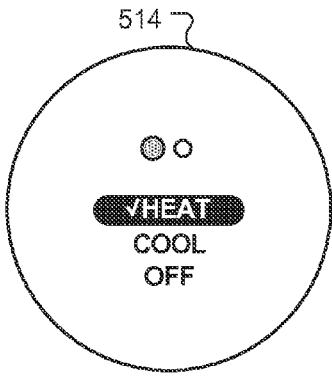
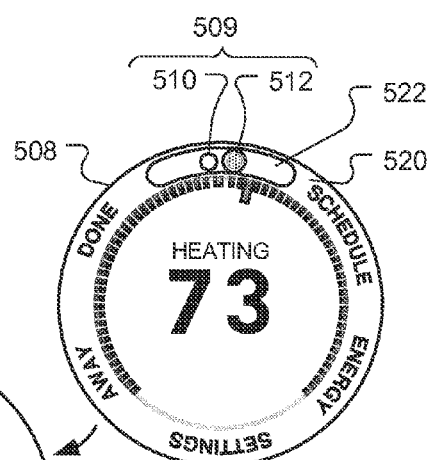
FIG. 5C FIGS. 8-39: (Intentionally left blank.)

HVAC SCHEDULE ESTABLISHMENT IN AN INTELLIGENT, NETWORK-CONNECTED THERMOSTAT

CROSS-REFERENCES TO RELATED APPLICATIONS

This application is a continuation-in-part of the following commonly assigned applications: U.S. application Ser. No. 13/632,041 filed Sep. 30, 2012; PCT/US2012/20026 filed Jan. 3, 2012; and U.S. application Ser. No. 13/269,501 filed Oct. 7, 2011. U.S. application Ser. No. 13/632,041 claims the benefit of U.S. Provisional Application No. 61/550,346 filed Oct. 21, 2011. International Application No. PCT/US2012/20026 claims the benefit of International Application No. PCT/US11/61437 filed Nov. 18, 2011, U.S. Ser. No. 13/317,423 filed Oct. 17, 2011, and U.S. Prov. Ser. No. 61/429,093 filed Dec. 31, 2010. U.S. application Ser. No. 13/269,501 is a continuation-in-part of U.S. application Ser. No. 13/033,573 filed Feb. 23, 2011 and furthermore claims the benefit of U.S. U.S. Prov. Ser. No. 61/429,093 and U.S. Prov. Ser. No. 61/415,771 filed Nov. 19, 2010. Each of the above-referenced applications is incorporated by reference herein.

The above-referenced patent applications are collectively referenced herein below as "the commonly assigned incorporated applications."

BACKGROUND OF THE INVENTION

This patent specification relates to systems, methods, and related computer program products for the monitoring and control of energy-consuming systems or other resource-consuming systems. More particularly, this patent specification relates to user interfaces for control units that govern the operation of energy-consuming systems, household devices, or other resource-consuming systems, including user interfaces for thermostats that govern the operation of heating, ventilation, and air conditioning (HVAC) systems.

While substantial effort and attention continues toward the development of newer and more sustainable energy supplies, the conservation of energy by increased energy efficiency remains crucial to the world's energy future. According to an October 2010 report from the U.S. Department of Energy, heating and cooling account for 56% of the energy use in a typical U.S. home, making it the largest energy expense for most homes. Along with improvements in the physical plant associated with home heating and cooling (e.g., improved insulation, higher efficiency furnaces), substantial increases in 5 energy efficiency can be achieved by better control and regulation of home heating and cooling equipment. By activating heating, ventilation, and air conditioning (HVAC) equipment for judiciously selected time intervals and carefully chosen operating levels, substantial energy can be saved while at the same time keeping the living space suitably comfortable for its occupants.

Some thermostats offer programming abilities that provide the potential for balancing user comfort and energy savings. However, users are frequently intimidated by a dizzying array of switches and controls. Thus, the thermostat may frequently resort to default programs, thereby reducing user satisfaction and/or energy-saving opportunities.

BRIEF SUMMARY OF THE INVENTION

Provided according to some embodiments are methods for programming a device, such as a thermostat, for control of an HVAC system. Configurations and positions of device components allow for the device to improve energy conservation and to simultaneously allow users to experience pleasant interactions with the device (e.g., to set preferences). HVAC schedules may be programmed for the device using a combination of pre-existing HVAC schedules or template schedules and automated schedule learning. For example, a pre-existing schedule may be initiated on the thermostat and the automated schedule learning may be used to update the pre-existing schedule based on users' interactions with the thermostat. The preexisting HVAC schedules may be stored on a device or received from a social networking service or another online service that includes shared HVAC schedules.

According to some embodiments, a method for programming an HVAC schedule for a thermostat is provided. The method includes generating one or more input options on a schedule interface; receiving input corresponding to one or more responses to the one or more input options, wherein the input is received at the schedule interface; selecting an HVAC schedule from one or more of a plurality of pre-existing HVAC schedules stored on the thermostat, wherein the selection of the HVAC schedule is based on the received input; associating the thermostat with the selected HVAC schedule, wherein associating includes initiating the selected HVAC schedule on the thermostat; receiving, during a time period subsequent to the association, input corresponding to one or more temperature control selections, wherein the input is received on a control interface; generating an updated HVAC schedule based on the selected HVAC schedule and the one or more temperature control selections; and associating the thermostat with the updated HVAC schedule, wherein associating includes initiating the updated HVAC schedule on the thermostat.

According to some embodiments, a method for programming an HVAC schedule for a thermostat is provided. The method includes receiving input corresponding to a selection of a pre-existing HVAC schedule, wherein the pre-existing HVAC schedule was shared on a social networking service, associating the thermostat with the selected pre-existing HVAC schedule, wherein associating includes initiating the selected pre-existing HVAC schedule on the thermostat; receiving, during a time period subsequent to the association, input corresponding to one or more temperature control selections, wherein the input is received on a control interface; generating an updated HVAC schedule based on the selected pre-existing HVAC schedule and the one or more temperature control selections; and associating the thermostat with the updated HVAC schedule, wherein associating includes initiating the updated HVAC schedule on the thermostat.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 5A-1-FIG. 5C illustrates user adjustment of setpoint times based on rotation of the outer ring along with an ensuing user interface display according to one embodiment;

FIG. 13A-1 illustrates steps of a method 4500 for selecting a pre-existing HVAC schedule for a thermostat based on a setup interview according to embodiments of the present invention;

FIG. 13A-2 illustrates steps of method 4500 for updating a selected HVAC schedule initiated on a thermostat using automated schedule learning according to embodiments of the present invention;

FIG. 19A-1 illustrates steps of a method 5100 for selecting HVAC schedules shared on a social networking service according to embodiments of the present invention;

FIG. 19A-2 illustrates steps of method 5100 for updating a selected HVAC schedule initiated on a thermostat using automated schedule learning according to embodiments of the present invention.

DETAILED DESCRIPTION OF THE INVENTION

Figure 1A:
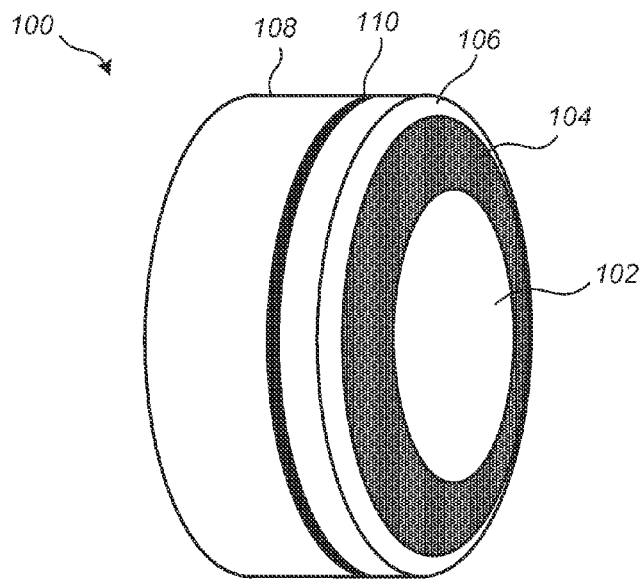
FIG. 1A illustrates a perspective view of a versatile sensing and control unit (VSCU unit) according to an embodiment.

The present invention will now be described in detail with reference to certain embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known details have not been described in detail in order not to unnecessarily obscure the present invention.

Provided according to one or more embodiments are systems, methods, computer program products, and related business methods for controlling and/or programming one or more HVAC systems based on one or more versatile sensing and control units (VSCU units), each VSCU unit being configured and adapted to provide sophisticated, customized, energy-saving HVAC control functionality while at the same time being visually appealing, non-intimidating, elegant to behold, and delightfully easy to use. The term "thermostat" is used hereinbelow to represent a particular type of VSCU unit (Versatile Sensing and Control) that is particularly applicable for HVAC control in an enclosure. Although "thermostat" and "VSCU unit" may be seen as generally interchangeable for the contexts of HVAC control of an enclosure, it is within the scope of the present teachings for each of the embodiments hereinabove and hereinbelow to be applied to VSCU units having control functionality over measurable characteristics other than temperature (e.g., pressure, flow rate, height, position, velocity, acceleration, capacity, power, loudness, brightness) for any of a variety of different control systems involving the governance of one or more measurable characteristics of one or more physical systems, and/or the governance of other energy or resource consuming systems such as water usage systems, air usage systems, systems involving the usage of other natural resources, and systems involving the usage of various other forms of energy. Each VSCU unit includes a user-interface component, such as a rotatable ring. Using the ring, a user can easily navigate through and select between selection options (e.g., to set a temperature setpoint or identify preferences). For example, a user may rotate a ring (e.g., in a clockwise direction); a processing system may dynamically identify a setpoint temperature value (e.g., higher than a previous value) based on rotational input; an electronic display may dynamically display a digital numerical value representative of the identified setpoint temperature value. Further, the user may be able to view and/or navigate through a menuing system using the ring. For example, a user input (e.g., inwards pressure on the ring) may result in a presentation of a menuing system on the display. A user may rotate the ring to, e.g., scroll through selection options and select an option by pressing on the ring. Inwards pressure on the ring may cause a distinct sensory response (e.g., a clicking sound or feel) that may confirm to the user that the selection has been made. In some instances, the ring is the primary or only user-input component within the VSCU. Thus, a user will not be intimidated by a large number of controls and will be able to easily understand how to interact with the unit.

Nevertheless, each VSCU unit may be advantageously provided with a selectively layered functionality, such that unsophisticated users are only exposed to a simple user interface, but such that advanced users can access and manipulate many different energy-saving and energy tracking capabilities. For example, an advanced user may be able to set a plurality of time-dependent temperature setpoints (i.e., scheduled setpoints) through thermostat interactions via the rotatable ring, while an unsophisticated user may limit such interactions to only set seemingly or actually static setpoints. Importantly, even for the case of unsophisticated users who are only exposed to the simple user interface, the VSCU unit provides advanced energy-saving functionality that runs in the background, the VSCU unit quietly using multi-sensor technology to "learn" about the home's heating and cooling environment and optimizing the energy-saving settings accordingly.

The VSCU unit also "learns" about the users themselves through user interactions with the device (e.g., via the rotatable ring) and/or through automatic learning of the users' preferences. For example, in a congenial "setup interview", a user may respond to a few simple questions (e.g., by rotating the rotatable ring to a position at which a desired response option is displayed). Multi-sensor technology may later be employed to detect user occupancy patterns (e.g., what times of day they are home and away), and a user's control over set temperature on the dial may be tracked over time. The multi-sensor technology is advantageously hidden away inside the VSCU unit itself, thus avoiding the hassle, complexity, and intimidation factors associated with multiple external sensor-node units. On an ongoing basis, the VSCU unit processes the learned and sensed information according to one or more advanced control algorithms, and then automatically adjusts its environmental control settings to optimize energy usage while at the same time maintaining the living space at optimal levels according to the learned occupancy patterns and comfort preferences of the user. Even further, the VSCU unit is programmed to promote energy-saving behavior in the users themselves by virtue of displaying, at judiciously selected times on its visually appealing user interface, information that encourages reduced energy usage, such as historical energy cost performance, forecasted energy costs, and even fun game-style displays of congratulations and encouragement.

Advantageously, the selectively layered functionality of the VSCU unit allows it to be effective for a variety of different technological circumstances in home and business environments, thereby making the same VSCU unit readily saleable to a wide variety of customers. For simple environments having no wireless home network or internet connectivity, the VSCU unit operates effectively in a standalone mode, being capable of learning and adapting to its environment based on multi-sensor technology and user input, and optimizing HVAC settings accordingly. However, for environments that do indeed have home network or internet connectivity, the VSCU unit can operate effectively in a network-connected mode to offer a rich variety of additional capabilities.

It is to be appreciated that while one or more embodiments is detailed herein for the context of a residential home, such as a single-family house, the scope of the present teachings is not so limited, the present teachings being likewise applicable, without limitation, to duplexes, townhomes, multi-unit apartment buildings, hotels, retail stores, office buildings, industrial buildings, and more generally any living space or work space having one or more HVAC systems. It is to be further appreciated that while the terms user, customer, installer, homeowner, occupant, guest, tenant, landlord, repair person, and the like may be used to refer to the person or persons who are interacting with the VSCU unit or other device or user interface in the context of some particularly advantageous situations described herein, these references are by no means to be considered as limiting the scope of the present teachings with respect to the person or persons who are performing such actions. Thus, for example, the terms user, customer, purchaser, installer, subscriber, and homeowner may often refer to the same person in the case of a single-family residential dwelling, because the head of the household is often the person who makes the purchasing decision, buys the unit, and installs and configures the unit, and is also one of the users of the unit and is a customer of the utility company and/or VSCU data service provider. However, in other scenarios, such as a landlord-tenant environment, the customer may be the landlord with respect to purchasing the unit, the installer may be a local apartment supervisor, a first user may be the tenant, and a second user may again be the landlord with respect to remote control functionality. Importantly, while the identity of the person performing the action may be germane to a particular advantage provided by one or more of the embodiments—for example, the password-protected temperature governance functionality described further herein may be particularly advantageous where the landlord holds the sole password and can prevent energy waste by the tenant—such identity should not be construed in the descriptions that follow as necessarily limiting the scope of the present teachings to those particular individuals having those particular identities.

It is to be appreciated that although exemplary embodiments are presented herein for the particular context of HVAC system control, there are a wide variety of other resource usage contexts for which the embodiments are readily applicable including, but not limited to, water usage, air usage, the usage of other natural resources, and the usage of other (i.e., non-HVAC-related) forms of energy, as would be apparent to the skilled artisan in view of the present disclosure. Therefore, such application of the embodiments in such other resource usage contexts is not outside the scope of the present teachings.

As used herein, "setpoint" or "temperature setpoint" or "temperature selections" may refer to a target temperature setting of a temperature control system, such as one or more of the VSCU units described herein, as set by a user or automatically according to a schedule. As would be readily appreciated by a person skilled in the art, many of the disclosed thermostatic functionalities described hereinbelow apply, in counterpart application, to both the heating and cooling contexts, with the only different being in the particular setpoints and directions of temperature movement. To avoid unnecessary repetition, some examples of the embodiments may be presented herein in only one of these contexts, without mentioning the other. Therefore, where a particular embodiment or example is set forth hereinbelow in the context of home heating, the scope of the present teachings is likewise applicable to the counterpart context of home cooling, and vice versa, to the extent such counterpart application would be logically consistent with the disclosed principles as adjudged by the skilled artisan.

The detailed description includes three subsections: (1) overview of VSCU unit & smart-home environment, (2) automated control-schedule learning in the context of a VSCU unit, and (3) HVAC schedule establishment in a VSCU unit. The first subsection provides a description of one area technology that offers many opportunities for of application and incorporation of automated-control-schedule-learning methods. The second subsection provides a detailed description of automated control-schedule learning, including a first, general implementation. The third subsection provides specific examples of establishing HVAC schedules using a combination of pre-existing HVAC schedules and automated control-schedule learning.

Overview of VSCU Unit & Smart-Home Environment

FIG. 1A illustrates a perspective view of a versatile sensing and control unit (VSCU unit) or thermostat 100 according to an embodiment. Unlike so many prior art thermostats, the VSCU unit 100 preferably has a sleek, elegant appearance that does not detract from home decoration, and indeed can serve as a visually pleasing centerpiece for the immediate location in which it is installed. The VSCU unit 100 comprises a main body 108 that is preferably circular with a diameter of about 8 cm, and that has a visually pleasing outer finish, such as a satin nickel or chrome finish. Separated from the main body 108 by a small peripheral gap 100 is a cap-like structure comprising a rotatable outer ring 106, a sensor ring 104, and a circular display monitor 102.

The outer ring 106 preferably has an outer finish identical to that of the main body 108, while the sensor ring 104 and circular display monitor 102 have a common circular glass (or plastic) outer covering that is gently arced in an outward direction and that provides a sleek yet solid and durable-looking overall appearance. The outer ring 106 may be disposed along a front face of a housing of the VSCU unit 100. The front face may be circular, and the housing may be disk-like in shape. The outer ring may substantially surround the circular display monitor or substantially surround a portion of the circular display monitor visible to a user. The outer ring 106 may be generally coincident with an outer lateral periphery of said disk-like shape, as illustrated, e.g., in FIGS. 1A-1C.

The sensor ring 104 contains any of a wide variety of sensors including, without limitation, infrared sensors, visible-light sensors, and acoustic sensors. Preferably, the glass (or plastic) that covers the sensor ring 104 is smoked or mirrored such that the sensors themselves are not visible to the user. An air venting functionality is preferably provided, such as by virtue of the peripheral gap 100, which allows the ambient air to be sensed by the internal sensors without the need for visually unattractive "gills" or grill-like vents.

Figures 1B, 1C:
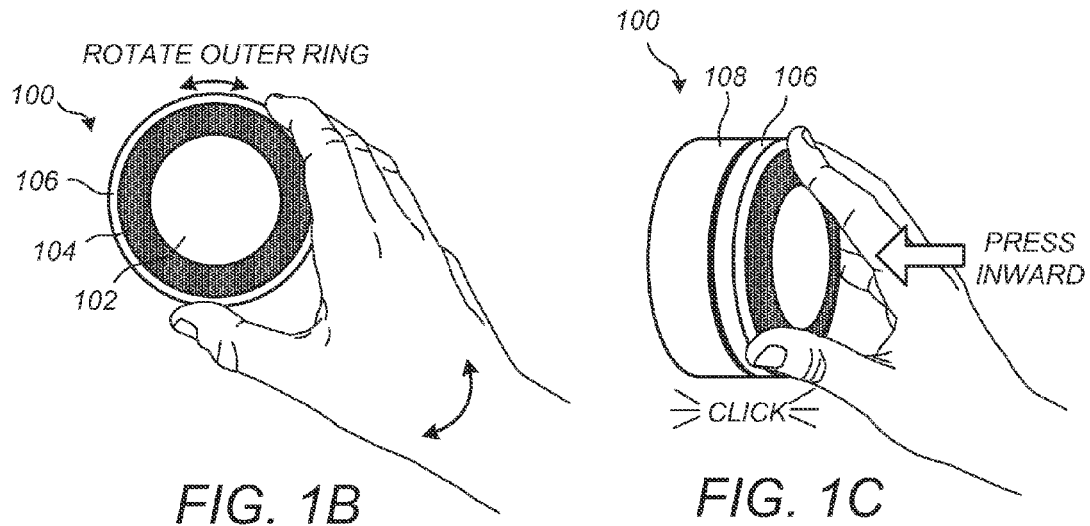
FIGS. 1B-1C illustrate the VSCU unit as it is being controlled by the hand of a user according to an embodiment.

FIGS. 1B-1C illustrate the VSCU unit 100 as it is being controlled by the hand of a user according to an embodiment. In one embodiment, for the combined purposes of inspiring user confidence and further promoting visual and functional elegance, the VSCU unit 100 is controlled by only two types of user input, the first being a rotation of the outer ring 106 (FIG. 1B), and the second being an inward push on the outer ring 106 (FIG. 1C) until an audible and/or tactile "click" occurs. For some embodiments, an interior dome switch (not shown) disposed in mechanical communication with the outer ring 106 provides the audible and/or tactile "click" associated with a completed inward pressing of the ring, the dome switch also providing an associated outward restorative force.

For one embodiment, the inward push of FIG. 1C only causes the outer ring 106 to move forward, while in another embodiment the entire cap-like structure, including both the outer ring 106 and the glass covering of the sensor ring 104 and circular display monitor 102, move inwardly together when pushed. Preferably, the sensor ring 104, the circular display monitor 102, and their common glass covering do not rotate with outer ring 106.

By virtue of user rotation of the outer ring 106 (referenced hereafter as a "ring rotation") and the inward pushing of the outer ring 106 (referenced hereinafter as an "inward click") responsive to intuitive and easy-to-read prompts on the circular display monitor 102, the VSCU unit 100 is advantageously capable of receiving all necessary information from the user for basic setup and operation. Preferably, the outer ring 106 is mechanically mounted in a manner that provides a smooth yet viscous feel to the user, for further promoting an overall feeling of elegance while also reducing spurious or unwanted rotational inputs. According to various implementations, the outer ring 106 rotates on plastic bearings and uses an optical digital encoder to measure the rotational movement and/or rotational position of the outer ring 106. In accordance with alternate implementations, other technologies such as mounting the outer ring 106 on a central shaft may be employed. For one embodiment, the VSCU unit 100 recognizes three fundamental user inputs by virtue of the ring rotation and inward click: (1) ring rotate left, (2) ring rotate right, and (3) inward click.

According to some implementations, multiple types of user input may be generated depending on the way a pushing inward of head unit front including the outer ring 106 is effectuated. In some implementations a single brief push inward of the outer ring 106 until the audible and/or tactile click occurs followed by a release (single click) can be interpreted as one type of user input (also referred to as an "inward click"). In other implementations, pushing the outer ring 106 in and holding with an the inward pressure for an amount of time such as 1-3 seconds can be interpreted as another type of user input (also referred to as a "press and hold"). According to some further implementations, other types of user input can be effectuated by a user such as double and/or multiple clicks, and pressing and holding for longer and/or shorter periods of time. According to other implementations, speed-sensitive or acceleration-sensitive rotational inputs may also be implemented to create further types of user inputs (e.g., a very large and fast leftward rotation specifies an "Away" occupancy state, while a very large and fast rightward rotation specifies an "Occupied" occupancy state).

Although the scope of the present teachings is not so limited, it is preferred that there not be provided a discrete mechanical HEAT-COOL toggle switch, or HEAT-OFF-COOL selection switch, or HEAT-FAN-OFF-COOL switch anywhere on the VSCU unit 100, this omission contributing to the overall visual simplicity and elegance of the VSCU unit 100 while also facilitating the provision of advanced control abilities that would otherwise not be permitted by the existence of such a switch. It is further highly preferred that there be no electrical proxy for such a discrete mechanical switch (e.g., an electrical push button or electrical limit switch directly driving a mechanical relay). Instead, it is preferred that the switching between these settings be performed under computerized control of the VSCU unit 100 responsive to its multi-sensor readings, its programming (optionally in conjunction with externally provided commands/data provided over a data network), and/or the above-described "ring rotation" and "inward click" user inputs.

The VSCU unit 100 comprises physical hardware and firmware configurations, along with hardware, firmware, and software programming that is capable of carrying out the functionalities described explicitly herein or in one of the commonly assigned incorporated applications. In view of the instant disclosure, a person skilled in the art would be able to realize the physical hardware and firmware configurations and the hardware, firmware, and software programming that embody the physical and functional features described herein without undue experimentation using publicly available hardware and firmware components and known programming tools and development platforms. Similar comments apply to described devices and functionalities extrinsic to the VSCU unit 100, such as devices and programs used in remote data storage and data processing centers that receive data communications from and/or that provide data communications to the VSCU unit 100. By way of example, references hereinbelow to machine learning and mathematical optimization algorithms, as carried out respectively by the VSCU unit 100 in relation to home occupancy prediction and setpoint optimization, for example, can be carried out using one or more known technologies, models, and/or mathematical strategies including, but not limited to, artificial neural networks, Bayesian networks, genetic programming, inductive logic programming, support vector machines, decision tree learning, clustering analysis, dynamic programming, stochastic optimization, linear regression, quadratic regression, binomial regression, logistic regression, simulated annealing, and other learning, forecasting, and optimization techniques.

Figure 2A:
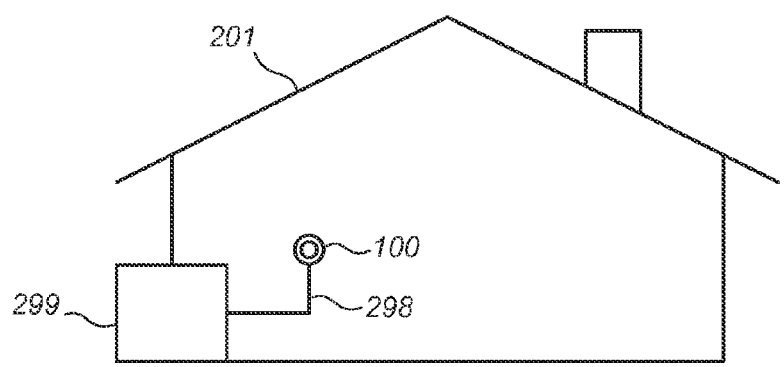
FIG. 2A illustrates the VSCU unit as installed in a house having an HVAC system and a set of control wires extending therefrom.

FIG. 2A illustrates the VSCU unit 100 as installed in a house 201 having an HVAC system 299 and a set of control wires 298 extending therefrom. The VSCU unit 100 is, of course, extremely well suited for installation by contractors in new home construction and/or in the context of complete HVAC system replacement. However, one alternative key business opportunity leveraged according to one embodiment is the marketing and retailing of the VSCU unit 100 as a replacement thermostat in existing homes, wherein the customer (and/or an HVAC professional) disconnects their old thermostat from the existing wires 298 and substitutes in the VSCU unit 100.

In either case, the VSCU unit 100 can advantageously serve as an "inertial wedge" for inserting an entire energy-saving technology platform into the home. Simply stated, because most homeowners understand and accept the need for home to have a thermostat, even the most curmudgeonly and techno-phobic homeowners will readily accept the simple, non-intimidating, and easy-to-use VSCU unit 100 into their homes. Once in the home, of course, the VSCU unit 100 will advantageously begin saving energy for a sustainable planet and saving money for the homeowner, including the curmudgeons. Additionally, however, as homeowners "warm up" to the VSCU unit 100 platform and begin to further appreciate its delightful elegance and seamless operation, they will be more inclined to take advantage of its advanced features, and they will furthermore be more open and willing to embrace a variety of compatible follow-on products and services as are described further hereinbelow. This is an advantageous win-win situation on many fronts, because the planet is benefiting from the propagation of energy-efficient technology, while at the same time the manufacturer of the VSCU unit and/or their authorized business partners can further expand their business revenues and prospects. For clarity of disclosure, the term "VSCU Efficiency Platform" refers herein to products and services that are technologically compatible with the VSCU unit 100 and/or with devices and programs that support the operation of the VSCU unit 100.

Some implementations of the VSCU unit 100 incorporate one or more sensors to gather data from the environment associated with the house 201. Sensors incorporated in VSCU unit 100 may detect occupancy, temperature, light and other environmental conditions and influence the control and operation of HVAC system 299. VSCU unit 100 uses a grille member (not shown in FIG. 2A) implemented in accordance with the present invention to cover the sensors. In part, the grille member of the present invention adds to the appeal and attraction of the VSCU unit 100 as the sensors in the VSCU unit 100 do not protrude, or attract attention from occupants of the house 201 and the VSCU unit 100 fits with almost any decor. Keeping sensors within the VSCU unit 100 also reduces the likelihood of damage and loss of calibration during manufacture, delivery, installation or use of the VSCU unit 100. Yet despite covering these sensors, the specialized design of the grille member facilitates accurately gathering occupancy, temperature and other data from the environment. Further details on this design and other aspects of the grille member are also described in detail later herein.

Figure 2B:
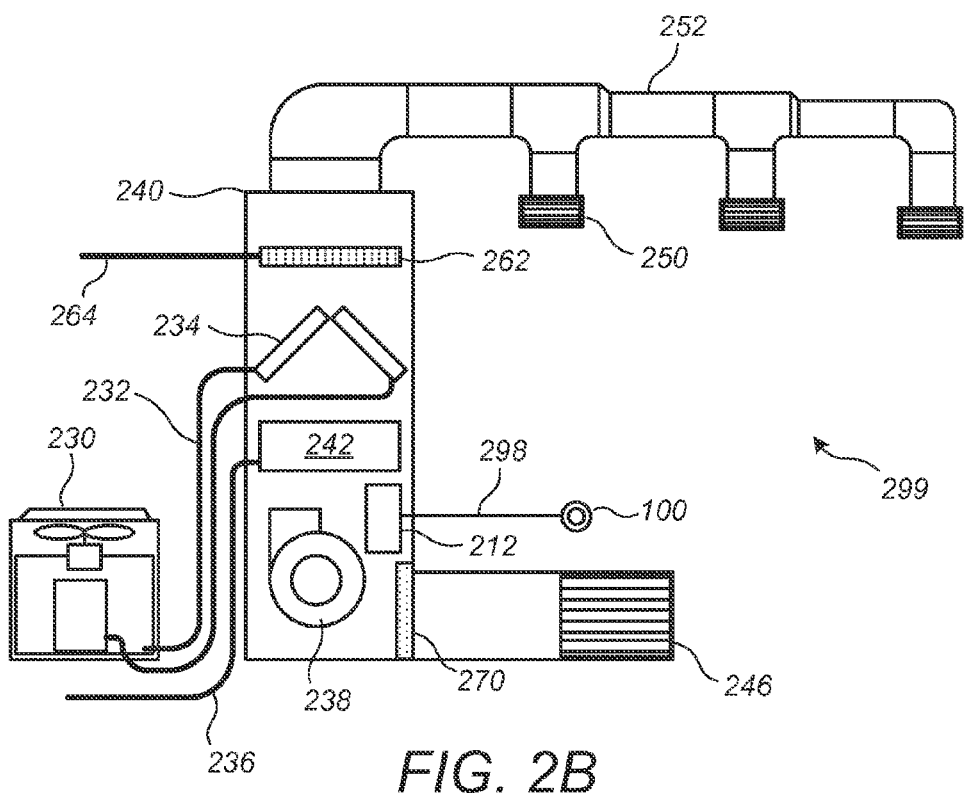
FIG. 2B illustrates an exemplary diagram of the HVAC system of FIG. 2A.

FIG. 2B illustrates an exemplary diagram of the HVAC system 299 of FIG. 2A. HVAC system 299 provides heating, cooling, ventilation, and/or air handling for an enclosure, such as the single-family home 201 depicted in FIG. 2A. The HVAC system 299 depicts a forced air type heating system, although according to other embodiments, other types of systems could be used. In heating, heating coils or elements 242 within air handler 240 provide a source of heat using electricity or gas via line 236. Cool air is drawn from the enclosure via return air duct 246 through filter 270 using fan 238 and is heated by the heating coils or elements 242. The heated air flows back into the enclosure at one or more locations through a supply air duct system 252 and supply air grills such as grill 250. In cooling, an outside compressor 230 passes a gas such as Freon through a set of heat exchanger coils to cool the gas. The gas then goes via line 232 to the cooling coils 234 in the air handlers 240 where it expands, cools and cools the air being circulated through the enclosure via fan 238. According to some embodiments a humidifier 262 is also provided which moistens the air using water provided by a water line 264. Although not shown in FIG. 2B, according to some embodiments the HVAC system for the enclosure has other known components such as dedicated outside vents to pass air to and from the outside, one or more dampers to control airflow within the duct systems, an emergency heating unit, and a dehumidifier.

The HVAC system is selectively actuated via control electronics 212 that communicate with the VSCU unit 100 over control wires 298. Thus, for example, as known in the art, for a typical simple scenario of a four-wire configuration in which the control wires 298 consist of power (R), heat (W), cool (Y), and fan (G), the VSCU unit 100 will short-circuit W to R to actuate a heating cycle (and then disconnect W from R to end the heating cycle), will short-circuit Y to R to actuate a cooling cycle (and then disconnect Y from R to end the cooling cycle), and will short-circuit G to R to turn on the fan (and then disconnect G from R to turn off the fan). For a heating mode, when VSCU unit 100 determines that an ambient temperature is below a lower threshold value equal to a setpoint temperature minus a swing value, the heating cycle will be actuated until the ambient temperature rises to an upper threshold value equal to the setpoint value plus the swing value. For a cooling mode, when VSCU unit 100 determines that an ambient temperature is above an upper threshold value equal to a setpoint temperature plus a swing value, the cooling cycle will be actuated until the ambient temperature lowers to a lower threshold value equal to the setpoint value minus the swing value. Without limitation, the swing values for heating and cooling can be the same or different, the upper and lower swing amounts can be symmetric or asymmetric, and the swing values can be fixed, dynamic, or user-programmable, all without departing from the scope of the present teachings.

FIGS. 3A-3K illustrate user temperature adjustment based on rotation of the outer ring 106 along with an ensuing user interface display according to one embodiment. For one embodiment, prior to the time depicted in FIG. 3A in which the user has walked up to the VSCU unit 100, the VSCU unit 100 has set the circular display monitor 102 to be entirely blank ("dark"), which corresponds to a state of inactivity when no person has come near the unit. As the user walks up to the display, their presence is detected by one or more sensors in the VSCU unit 100 (e.g., via a motion sensor) at which point the circular display monitor 102 is automatically turned on.

Figure 3A:
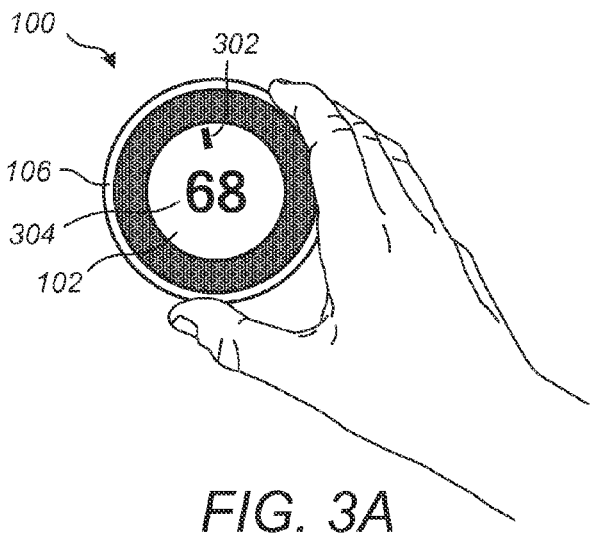
FIGS. 3A-3K illustrate user temperature adjustment based on rotation of the outer ring along with an ensuing user interface display according to one embodiment.

When this happens, as illustrated in FIG. 3A, the circular display monitor 102 (e.g., an electronic display) displays a digital numerical representation of the current setpoint in a large font at a center readout 304. The representation may be rounded to the nearest degree F. (or half-degree C.), or otherwise include a different number of significant digits as compared to an actual internally used current setpoint temperature.

Also displayed is a setpoint icon 302 disposed along a periphery of the circular display monitor 102 at a location that is spatially representative the current setpoint. Although it is purely electronic, the setpoint icon 302 is reminiscent of older mechanical thermostat dials, and advantageously imparts a feeling of familiarity for many users as well as a sense of tangible control.

Notably, the example of FIG. 3A assumes a scenario for which the actual current temperature of 68 is equal to the setpoint temperature of 68 when the user has walked up to the VSCU unit 100. For a case in which the user walks up to the VSCU unit 100 when the actual current temperature is different than the setpoint temperature, the display would also include an actual temperature readout and a trailing icon, which are described further below in the context of FIGS. 3B-3K.

Figure 3B:
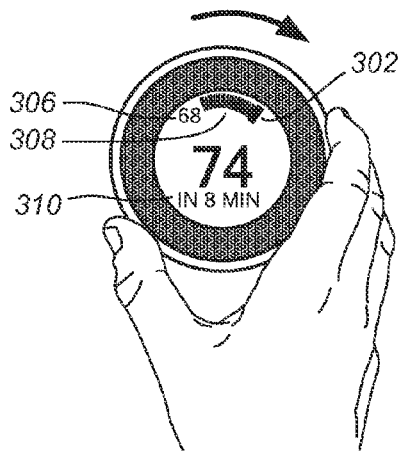
Figure 3C:
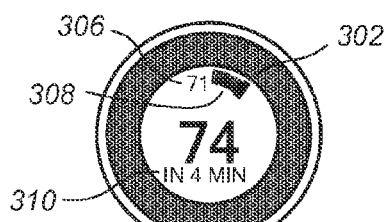
Figure 3D:
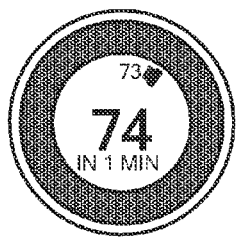

Referring now to FIG. 3B, as the user turns the outer ring 106 clockwise, a digital numerical representation of the increasing value of the setpoint temperature is instantaneously provided at the center readout 304, and the setpoint icon 302 moves in a clockwise direction around the periphery of the circular display monitor 102 to a location representative of the increasing setpoint. Thus, a user receives instant feedback about an effect of his rotation and may thus tailor a degree of his ring rotation accordingly. Relationships between ring rotations and selection options may be pre-established. For example, there may be a constant or non-constant relationship between a degree of ring rotation and a change in temperature setpoints. Defining the relationship based on angular rotation rather than an absolute angular position allows for the ring to easily be used for multiple variable options.

Whenever the actual current temperature is different than the setpoint temperature, a representation (e.g., a digital numeric representation) of an actual temperature readout 306 is provided in relatively small digits along the periphery of the circular a location spatially representative the actual current temperature. Further provided is a trailing icon 308, which could alternatively be termed a tail icon or difference-indicating, that extends between the location of the actual temperature readout 306 and the setpoint icon 302. Further provided is a time-to-temperature readout 310 that is indicative of a prediction, as computed by the VSCU unit 100, of the time interval required for the HVAC system to bring the temperature from the actual current temperature to the setpoint temperature.

Figure 3E:
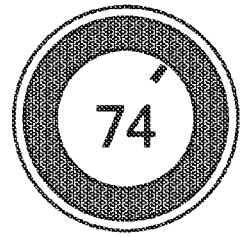
Figure 3F:
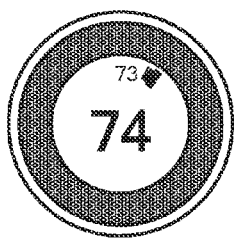
Figure 3G:
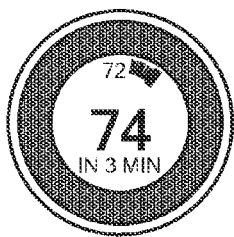
Figure 3H:
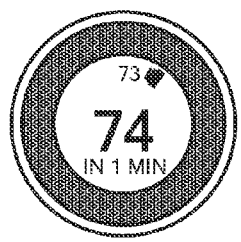
Figure 3I:
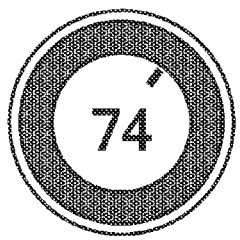
Figure 3J:
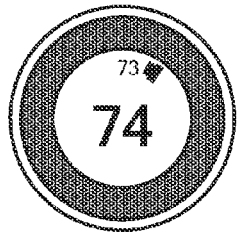
Figure 3K:
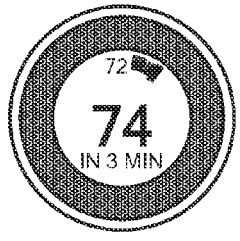

FIGS. 3C-3K illustrate views of the circular display monitor 102 at exemplary instants in time after the user setpoint change that was completed in FIG. 3B (assuming, of course, that the circular display monitor 102 has remained active, such as during a preset post-activity time period, responsive to the continued proximity of the user, or responsive the detected proximity of another occupant). Thus, at FIG. 3C, the current actual temperature is about halfway up from the old setpoint to the new setpoint, and in FIG. 3D the current actual temperature is almost at the setpoint temperature. As illustrated in FIG. 3E, both the trailing icon 308 and the actual temperature readout 306 disappear when the current actual temperature reaches the setpoint temperature and the heating system is turned off. Then, as typically happens in home heating situations, the actual temperature begins to sag (FIG. 3F) until the permissible temperature swing is reached (which is 2 degrees in this example, see FIG. 3G), at which point the heating system is again turned on and the temperature rises to the setpoint (FIGS. 3H-3I) and the heating system is turned off. The current actual temperature then begins to sag again (FIGS. 3J-3K), and the cycle continues. Advantageously, by virtue of the user interface functionality of FIGS. 3A-3K including the time-to-temperature readout 310, the user is provided with a fast, intuitive, visually pleasing overview of system operation, as well as a quick indication of how much longer the heating system (or cooling system in counterpart embodiments) will remain turned on. It is to be appreciated that the use of 2 degrees as the permissible temperature swing in FIGS. 3C-3K is only for purposes of example, and that different amounts of permissible temperature swing may be applicable at different times according to the particular automated control algorithms, defaults, user settings, user overrides, etc. that may then be in application at those times.

Figure 4A:
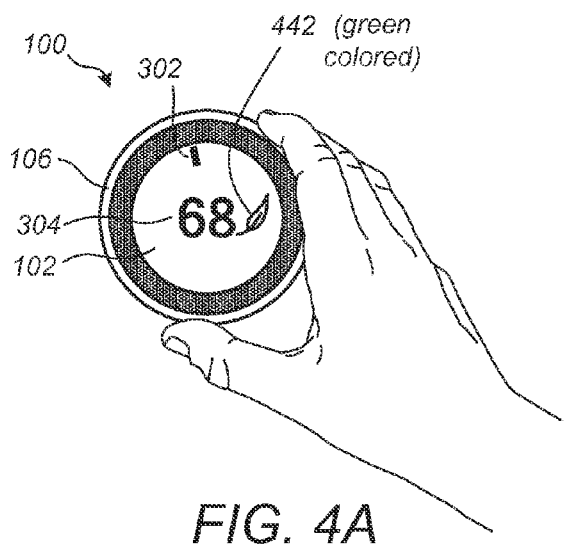
FIGS. 4A-4D illustrates a dynamic user interface for encouraging reduced energy use according to a preferred embodiment.
Figure 4B:
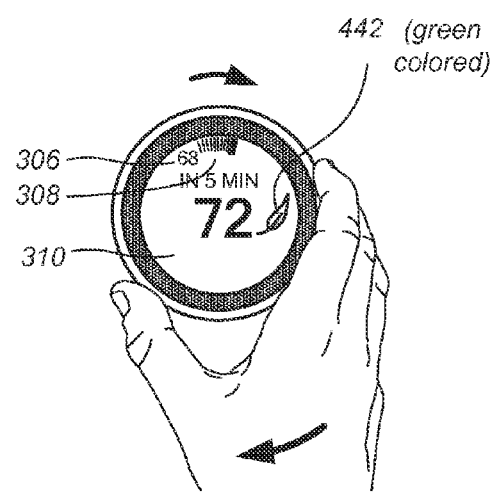
Figure 4C:
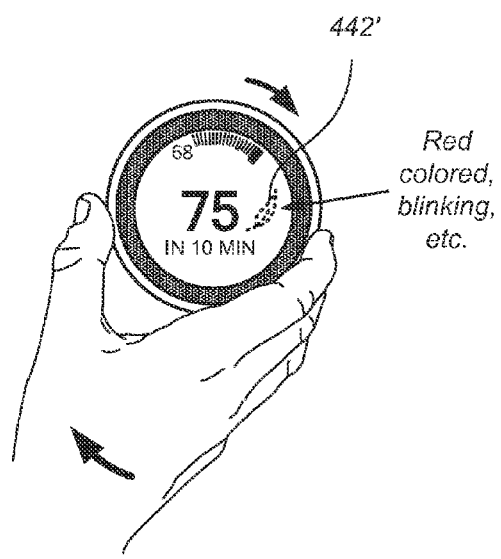
Figure 4D:
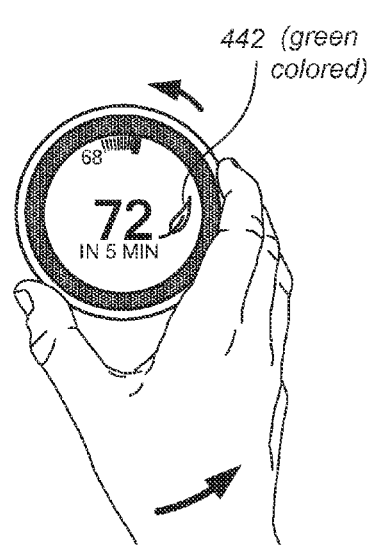

In some embodiments, user interactions with the VSCU unit 100 by virtue of manipulations of the outer ring 106 are analyzed and non-numeric indicators (e.g., related to environmental favorability of the action) are presented to the user. FIGS. 4A-D illustrate a dynamic user interface for encouraging reduced energy use according to a preferred embodiment. The method of FIGS. 4A-D are preferably incorporated into the time-to-temperature user interface method of FIGS. 3A-3K, supra, although the scope of the present teachings is not so limited. As would be readily appreciated by a person skilled in the art, disclosure relating to the heating context could similarly apply to a cooling context. Where, as in FIG. 4A, the heating setpoint is currently set to a value known to be within a first range known to be good or appropriate for energy conservation, a pleasing positive-reinforcement icon such as the green leaf 442 is displayed. As the user turns up the heat (see FIG. 4B) the green leaf continues to be displayed as long as the setpoint remains in that first range. However, as the user continues to turn up the setpoint to a value greater than the first range (see FIG. 4C), there is displayed a negatively reinforcing icon indicative of alarm, consternation, concern, or other somewhat negative emotion, such icon being, for example, a flashing red version 442' of the leaf, or a picture of a smokestack, or the like. It is believed that the many users will respond to the negatively reinforcing icon 442' by turning the setpoint back down, and as illustrated in FIG. 4D, if the user returns the setpoint to a value lying in the first range, they are "rewarded" by the return of the green leaf 442. Many other types of positive-emotion icons or displays can be used in place of the green leaf 442, and likewise many different negatively reinforcing icons or displays can be used in place of the flashing red leaf 1742', while remaining within the scope of the present teachings.

For one embodiment, the VSCU unit 100 is designed to be entirely silent unless a user has walked up and begun controlling the unit. Advantageously, there are no clicking-type annoyances when the heating or cooling units are activated as with conventional prior art thermostats. Optionally, the VSCU unit 100 can be configured to synthesize artificial audible clicks, such as can be output through a piezoelectric speaker, to provide "tick" feedback as the user dials through different temperature settings. Thus, in some instances, VSCU unit 100 includes an audio output device configured to output synthesized audible ticks through said audio output device in correspondence with user rotation of the outer ring 106.

Via the single outer ring 106, a user may easily be able to perform multiple types of interactions with the VSCU unit 100. For example, as described above, the user may be able to set a setpoint temperature value. Other types of interactions may additionally be performed using the rotating and clicking features of the same outer ring 106. A selection component (e.g., ring 106) and electronic display 102 may enable a user to, e.g.: (1) identify a type of variable to be set or information to be input; and/or (2) identify a value for one or more variables and/or for one or more information fields.

For example, an HVAC system may include a plurality of variable categories (e.g., energy, schedule, settings, heating/cooling mode, etc.). As described in greater detail below, display 102 may be configured to present a circular menu: as the user rotates outer ring 106, a different category may appear at or near a top of the display. A user may select a particular type of category by clicking outer ring 106. Selection of some categories allows a user to view available sub-menus. For example, rotation of outer ring 106 may cause an apparent translation of the entire screen, such that a first sub-menu moves off of the screen as a second sub-menu moves on to the screen. In some instances, the user may be able to instantly interact with the displayed sub-menu even without clicking ring 106.

Each variable and/or information field may be defined by a value. The value may include, e.g., a numeric value (e.g., a setpoint-temperature variable is set at "75"), a word (e.g., a password is set as "Password"), a letter (e.g., a thermostat is identified as Thermostat "A"), a selection amongst a plurality of options (e.g., smart learning is "Enabled"), etc. An active variable/field may be identified based on a user's selection of the variable/field, a default thermostat state and/or other information.

Various value options may then be presented to the user. For example, a list of options may be presented in a grid-like fashion on the display, and a user may move a highlighted option by rotating outer ring 106. As another example, alphanumeric characteristics may be accurately presented around an outer border of electronic display 316. In some embodiments, the options are indicatively presented (e.g., by presenting a series of tick marks, representing options of evenly spaced values), and one or more options (e.g., a highlighted option) may be expressly presented (e.g., by displaying a value of the highlighted option at or near a center of the display). A user may rotate outer ring 106 until a desired option is highlighted. When a selection is highlighted, the selection may be confirmed by an inward click input on the outer ring 106.

Figure 8A:
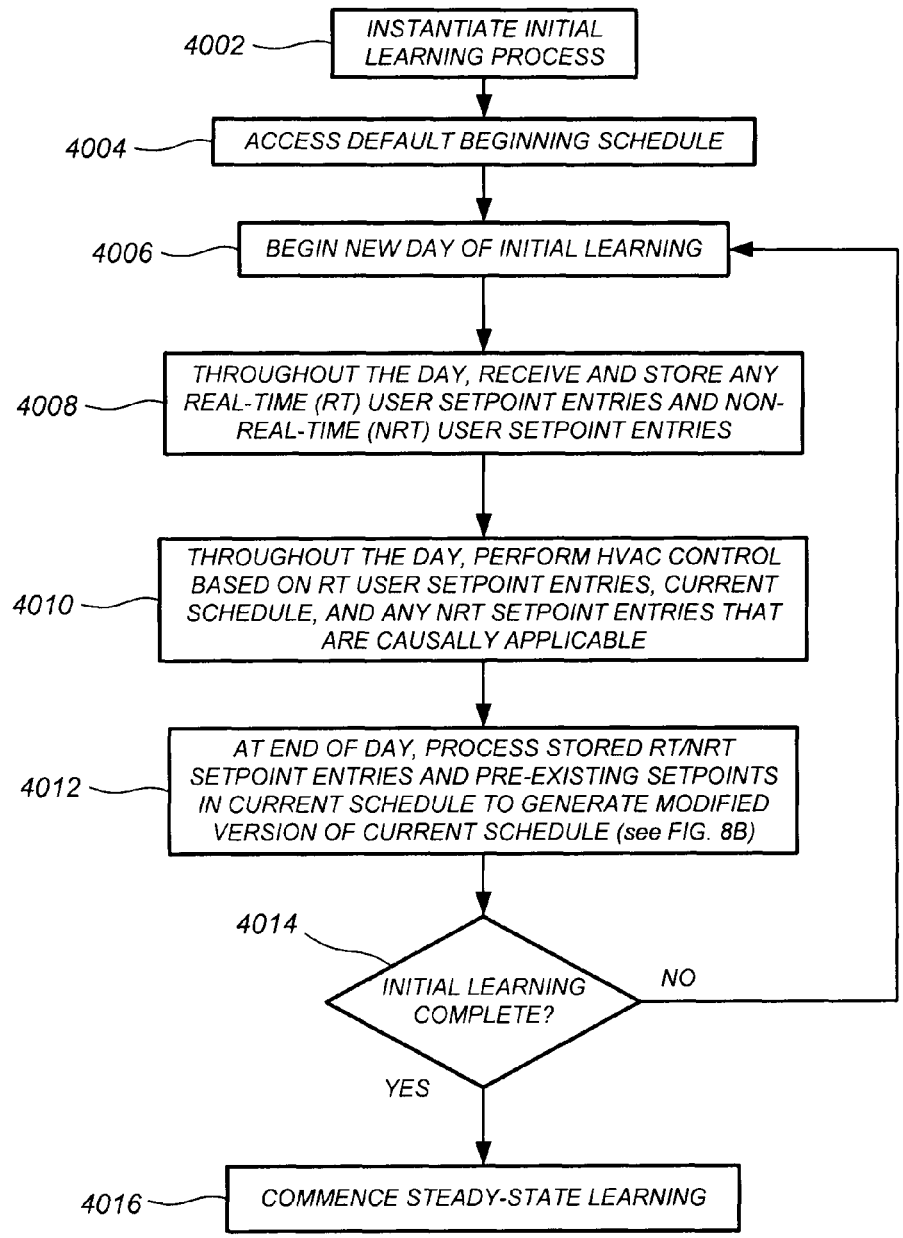
FIG. 8A-FIG. 8D-2 illustrate steps for achieving initial learning.
Figure 8B:
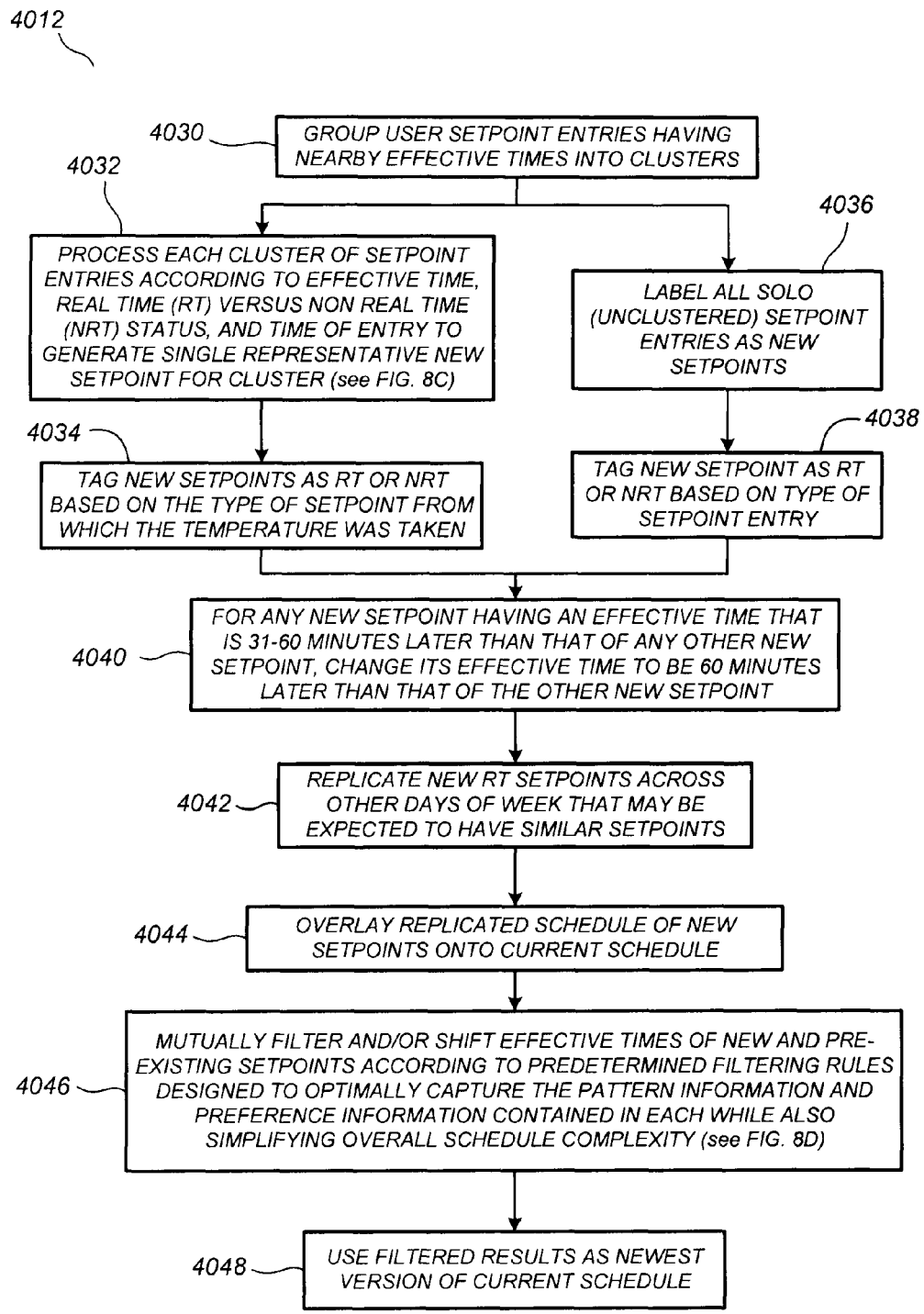
Figure 8C:
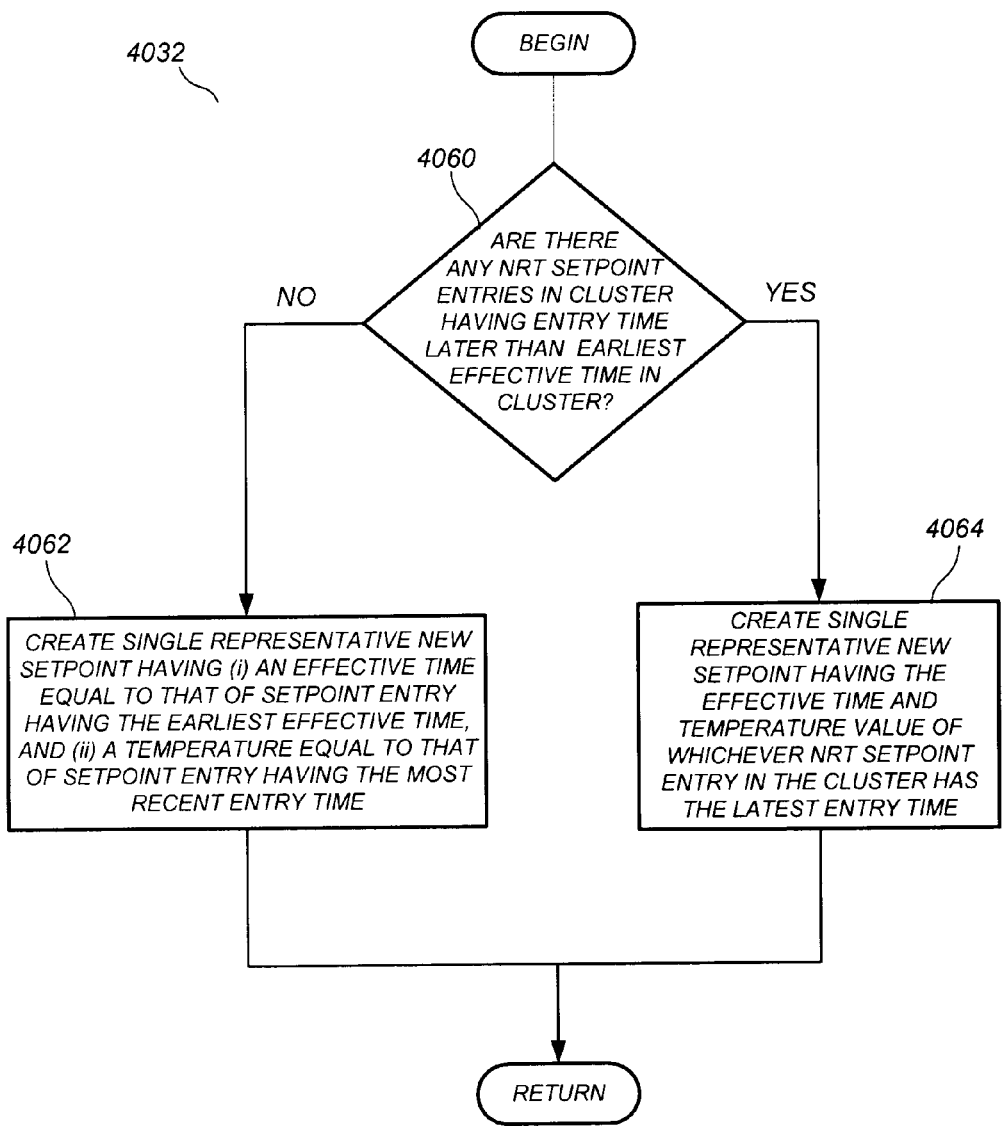
Figures 1, 8D:
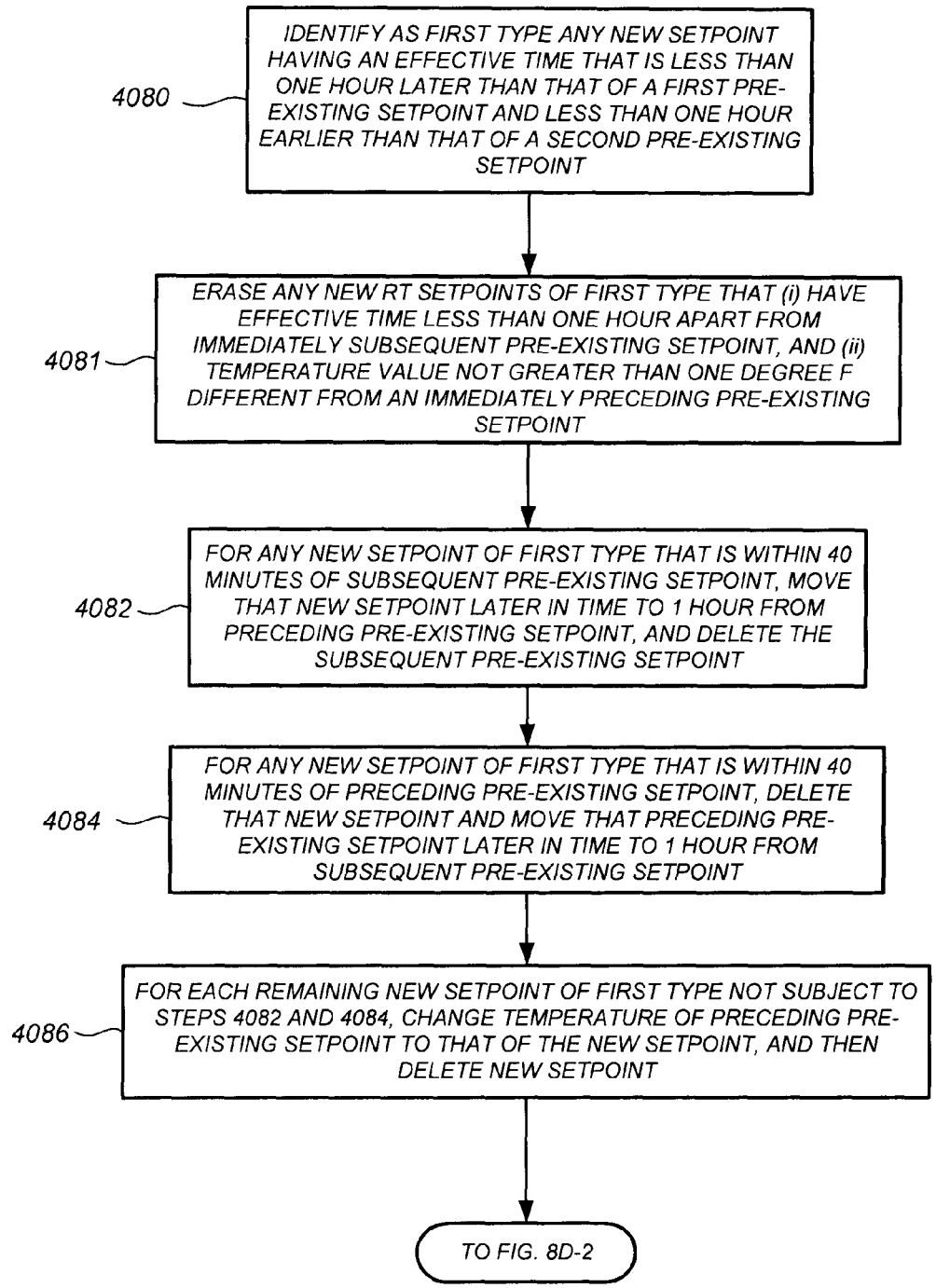

FIG. 5A-1-FIG. 5C show example screens of an interactive thermostat menuing system include a rotatable main menu, according to some preferred embodiments. As described in further detail below, the menuing system may be accessible to a user by an inward pressing of ring 106 (i.e. an inward click), and the user may be able to navigate through the menuing system by virtue of rotations and inward clicks of the outer ring 106.

The screens shown, according to some embodiments, are displayed on a thermostat 100 on a round dot-matrix electronic display 102 having a rotatable ring 106. FIG. 5A-1-FIG. 5C shows an example screen 500 in normal operations. An inward click from the normal display screen 500 causes a circumferential main menu 520 to appear as shown in screen 501. In this example the main menu 520 displays about the perimeter of the circular display area various menu names such as "SETTINGS," "ENERGY," "SCHEDULE," "AWAY," "DONE," as well one or more icons. The top of the circular menu 520 includes an active window 522 that shows the user which menu item will be selected if an inward click is performed at that time. Window 522 is highlighted, filled in, circumscribed, or otherwise marked such that a user can easily identify that a menu item within this window is active.

Upon user rotation of the rotatable ring 106 (see FIG. 3A, supra) the menu items turn clockwise or counter clockwise, matching the direction of the rotatable ring 106, so as to allow different menu items to be selected. For example, screen 502 and 504 show examples displayed in response to a clockwise rotation of the rotatable ring 106. One example of a rotating menu that rotates responsive to ring rotations according to some embodiments is illustrated in the commonly assigned U.S. Ser. No. 29/399,632, supra. From screen 504, if an inward click is performed by the user, then the Settings menu is entered. It has been found that a circular rotating menu such as shown, when combined with a rotatable ring and round display area, allows for highly intuitive and easy input, and so therefore greatly enhances the user interface experience for many users.

Menu items may include text (e.g., "Schedule") and/or icons (e.g., disks 510 and 512). FIG. 5B shows an example screen 506 that allows for the schedule mode to be entered. FIG. 5C shows the selection of a mode icon 509 representing a heating/cooling/off mode screen, the mode icon 509 comprising two disks 510 and 512 and causing the display of a mode menu if it appears in the active window 522 when the user makes an inward click. In screen 508, a small blue disk 510 represents cooling mode and a small orange-red disk 512 represents heating mode. According to some embodiments the colors of the disks 510 and 512 match the background colors used for the thermostat, as described in greater detail below.

Menu items may further indicate a currently active selection or mode of operation. For example, one of disks 510 and 512, in this case the heating disk 512, is highlighted with a colored outline, to indicate the current operating mode (i.e. heating or cooling) of the thermostat. In one alternative embodiment, the mode icon 509 can be replaced with the text string "HEAT/COOL/OFF" or simply the word "MODE".

If in inward click is performed from screen 508, a menu screen 514 appears (e.g. using a "coin flip" transition). In screen 514 the user can view the current mode (marked with a check mark). Screen 514 illustrates another way in which rotatable ring 106 may be used to make a selection. A plurality of selection options may be presented, with one or more options being emphasized (e.g., highlighted). A user may highlight a different option by rotating rotatable ring 106. For example, as a user rotates rotatable ring 106 in a clockwise fashion, options further down the list become highlighted. Once the user is satisfied that the desired option is highlighted, they may click the ring to confirm the selection. Thus, in the example shown in screen 514, a user may rotate rotatable ring 106 clockwise to move the highlighting from "HEAT" to "COOL" or "OFF." The user may then establish the selection by clicking the ring, and thereby change the mode. If "COOL" is selected then the thermostat will change over to cooling mode (such changeover as might be performed in the springtime), and the cooling disk icon will highlighted on screens 514 and 508. The menu can also be used to turn the thermostat off by selecting "OFF." In cases the connected HVAC system only has heating or cooling but not both, the words "HEAT" or "COOL" or "OFF" are displayed on the menu 520 instead of the colored disks.

Figure 6A:
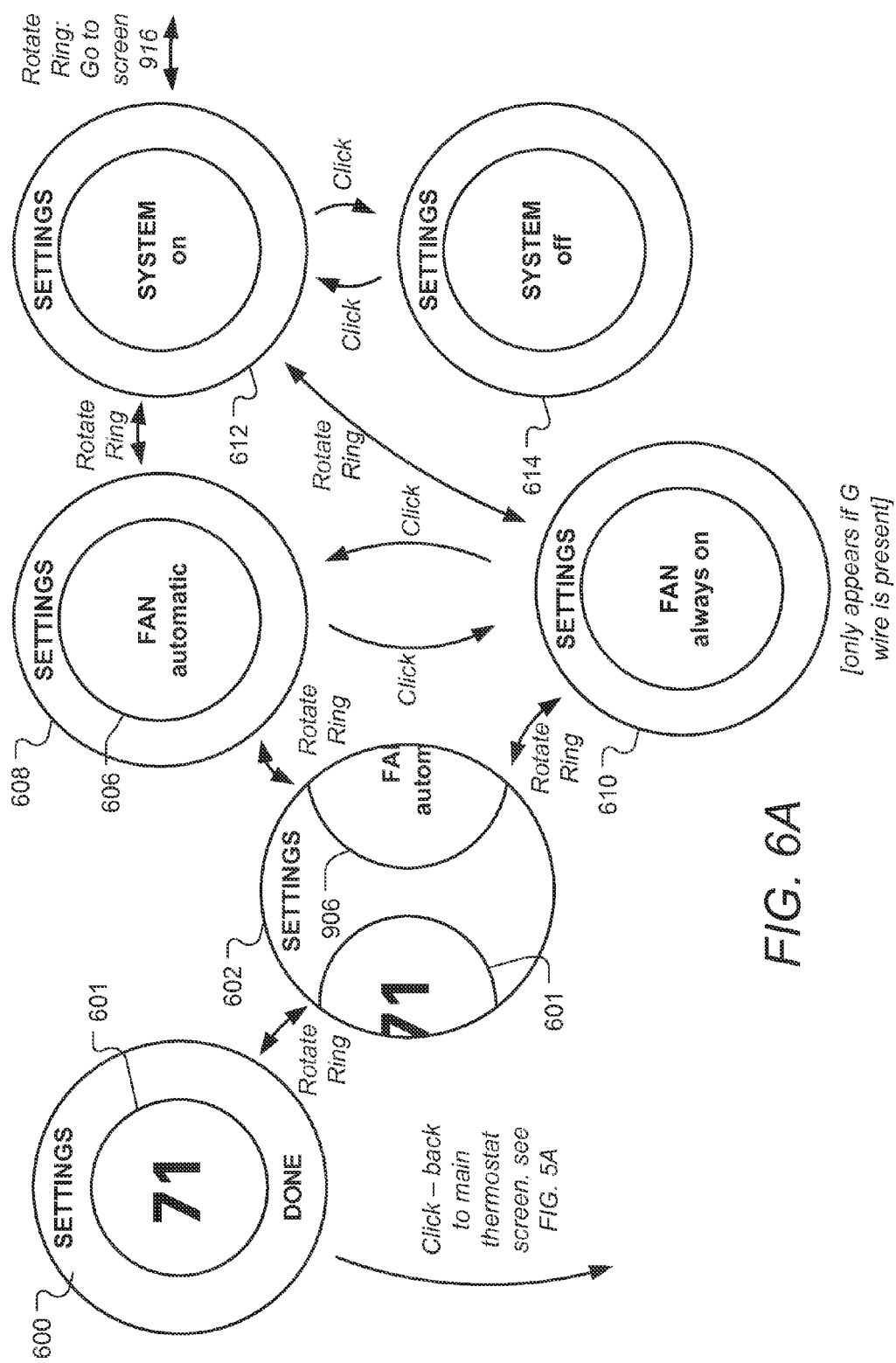
FIG. 6A-6B illustrate example user interface screens on a user-friendly programmable thermostat for making various settings, according to some embodiments.
Figure 6B:
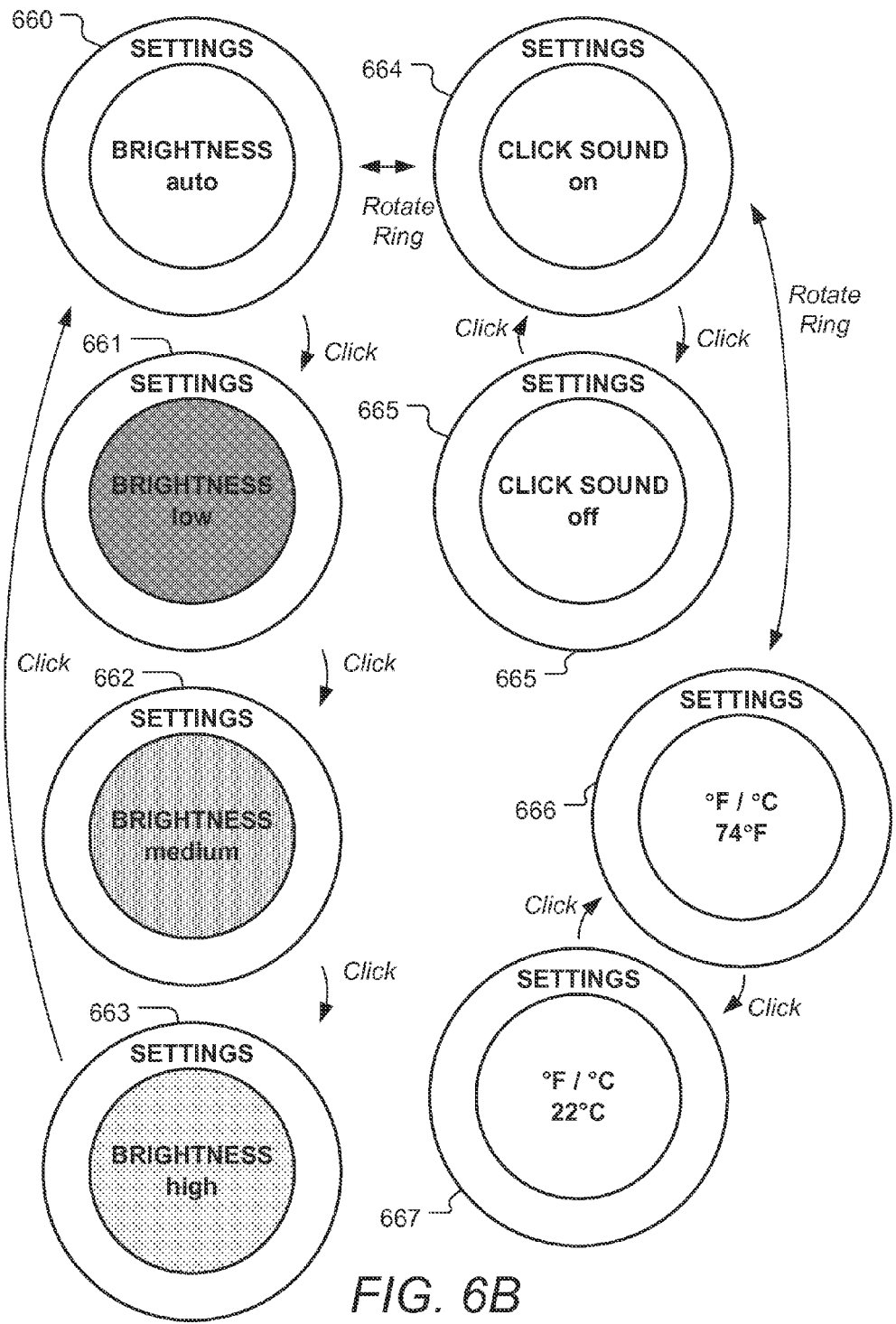

FIGS. 6A-6B and FIGS. 7A-7C further illustrate possible operation and versatile uses of outer ring 106. FIGS. 6A-6B illustrate example user interface screens for making various settings, according to some embodiments. The screens shown, according to some embodiments, are displayed on a thermostat 100 on a round dot-matrix electronic display 102 having a rotatable ring 106. In FIG. 6A, screen 600 is initially displayed following a user selection of "SETTINGS" from the main menu, such as shown in screen 504 of FIG. 5A-1- FIG. 5C. The general layout of the settings menu in this example is a series of sub-menus that are navigated using the rotatable ring 106. For example, with reference to FIG. 6A, the user can cause the initial screen 600 to be shifted or translated to the left by a clockwise rotation of the rotatable ring 106, as shown in the succession of screens 602 and 608. The animated translation or shifting effect is illustrated in FIG. 6A by virtue of a portion of the previous screen disk 601 and a portion of the new screen disk 606 shifting as shown, and is similar to the animated shifting translation illustrated in the commonly assigned U.S. Ser. No. 29/399,621, supra. Further rotation of the ring leads to successive sub-menu items such as "system on" screen 612, and lock setting screen 616 (see FIG. 6B). Rotating the ring in the opposite direction, i.e., counterclockwise, translates or shifts the screens in the opposite direction (e.g., from 616 to 608 to 600). The "initial screen" 600 is thus also used as a way to exit the settings menu by an inward click. This exit function is also identified by the "DONE" label on the screen 600. Note that inner disk 601 shows the large central numerals that correspond to the current setpoint temperature and can include a background color to match the thermostat background color scheme, so as to indicate to a user, in an intuitive way, that this screen 600 is a way of exiting the menu and going "back" to the main thermostat display. According to some embodiments, another initial/done screen such as screen 600 is displayed at the other end (the far end) of the settings menu, so as to allow means of exit from the settings menu from either end. According to some embodiments, the sub-menus are repeated with continued rotation in one direction, so that they cycle through in a circular fashion and thus any sub menu can eventually be accessed by rotating the ring continuously in either one of the two directions.

Screen 608 has a central disk 606 indicating the name of the sub-menu, in this case the Fan mode. Some sub menus only contain a few options which can be selected or toggled among by inward clicking alone. For example, the Fan sub-menu 608 only has two settings "automatic" (shown in screen 608) and "always on" (shown in screen 610). In this case the fan mode is changed by inward clicking, which simply toggles between the two available options. Ring rotation shifts to the next (or previous) settings sub-menu item. Thus rotating the ring from the fan sub-menu shift to the system on/off sub-menu shown in screens 612 (in the case of system "ON") and 614 (in the case of system "OFF"). The system on/off sub-menu is another example of simply toggling between the two available options using the inward click user input.

FIG. 6B shows sub-menu screen examples for settings for brightness, click sounds and Celsius/Fahrenheit units, according to some embodiments. Screens 660, 661, 662 and 663 toggle among four different brightness settings using the inward click input as shown in FIG. 6B. Specifically, the settings for auto-brightness, low, medium and high can be selected. According to some embodiments, the brightness of the display is changed to match the current selection so as to aid the user in selecting an appropriate brightness setting. Screens 664 and 665 toggle between providing, and not providing, audible clicking sounds as the user rotates the rotatable ring 106, which is a form of sensory feedback that some users prefer and other users do not prefer.

Screens 666 and 667 are used to toggle between Celsius and Fahrenheit units, according to some embodiments. According to some embodiments, if Celsius units is selected, then half-degrees are displayed by the thermostat when numerical temperature is provided (for example, a succession of 21, 215, 22, 225, 23, 235, and so forth in an example in which the user is turning up the rotatable ring on the main thermostat display). According to another embodiment, there is another sub-menu screen disk (not shown) that is equivalent to the "Brightness" and "Click Sound" disks in the menu hierarchy, and which bears one of the two labels "SCREEN ON when you approach" and "SCREEN ON when you press," the user being able to toggle between these two options by an inward click when this disk is displayed. When the "SCREEN ON when you approach" is active, the proximity sensor-based activation of the electronic display screen 102 is provided (as described above with the description accompanying FIG. 5C), whereas when the "SCREEN ON when you press" option is selected, the electronic display screen 102 does not turn on unless there is a ring rotation or inward click.

Figure 7A:
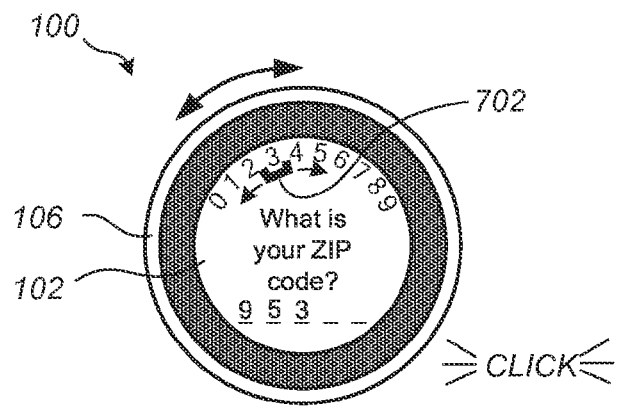
FIG. 7A illustrates a data input functionality provided by the user interface of the VSCU unit according to an embodiment.

FIG. 7A illustrates a data input functionality provided by the user interface of the VSCU unit 100 according to an embodiment, for a particular non-limiting example in which the user is asked, during a congenial setup interview (which can occur at initial VSCU unit installation or at any subsequent time that the user may request), to enter their ZIP code. Responsive to a display of digits 0-9 distributed around a periphery of the circular display monitor 102 along with a selection icon 702, the user turns the outer ring 106 to move the selection icon 702 to the appropriate digit, and then provides an inward click command to enter that digit. In some embodiments, the menuing system that is navigated by virtue of ring rotations and ring inward clicks may be configured to further allow the user to: provide the unit with information necessary to connect to an Internet network; provide an address; provide a current date; provide a type of location (home versus business); provide occupancy patterns; provide information about heating/cooling equipment; identify qualitative or quantitative heating or cooling preferences (e.g., heating or cooling temperatures when away); set a password; scheduling learning; set a brightness, sound or unit property; initiate an equipment test; and/or view select informational content (e.g., how to set up wiring). Additional detail related to the types of interactions that may be enabled by the outer ring 106 is provided in U.S. Ser. No. 13/269,501.

For one embodiment, the VSCU unit 100 is programmed to provide a software lockout functionality, wherein a person is required to enter a password or combination before the VSCU unit 100 will accept their control inputs. The user interface for password request and entry can be similar to that shown in FIG. 7A. The software lockout functionality can be highly useful, for example, for Mom and Dad in preventing their teenager from making unwanted changes to the set temperature, for various landlord-tenant scenarios, and in a variety of other situations.

Figure 7B:
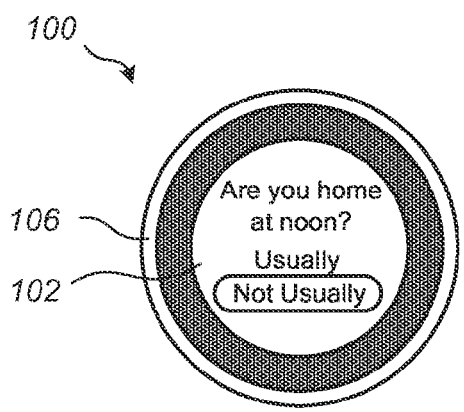
FIGS. 7B-7C illustrate a similar data input functionality provided by the user interface of the VSCU unit for answering various questions during the setup interview.
Figure 7C:
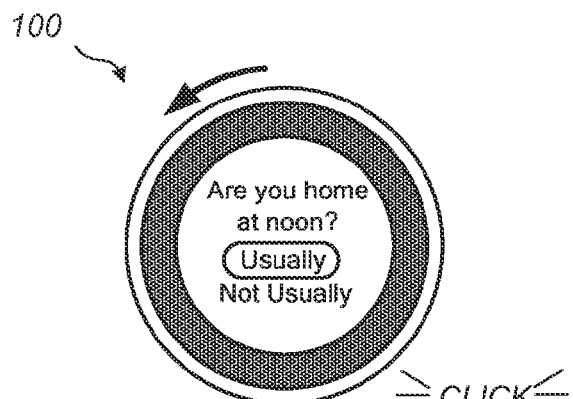

FIGS. 7B-7C illustrate a similar data input functionality provided by the user interface of the VSCU unit 100 for answering various questions during the setup interview. The user rotates the outer ring 106 until the desired answer is highlighted, and then provides an inward click command to enter that answer. The setup interview may be used to accomplish a number of different objectives. For example, as described in details below concerning FIGS. 11A-13A-1, the setup interview may be used to snap a preexisting template schedule to VSCU unit 100.

Thus, as exemplified in FIGS. 3-7, the menuing system as navigated by outer-ring rotations and inward clicks may be used to receive many types of user inputs. The menuing system may further be configured to receive variable inputs from a user. For example, a menu may be displayed subsequent to a click on the ring, and a user may be able to navigate between variables (e.g., a menu, a sub-menu, a setpoint, a setting, etc.) using the outer ring 106. As another example, a double click on the ring may allow a user to view and select between various types of settings (e.g., single setpoints, time-dependent setpoints, user profiles, etc.). These advanced opportunities may nevertheless remain hidden from a user wishing to enter only the simplest information.

Automated Control Schedule Learning in the Context of a VSCU Unit

As described below, an implementation of automated control-schedule learning is included in the aforementioned VSCU unit 100. For example, VSCU unit 100 includes intelligent features that learn about the users, beginning with a setup dialog (e.g., the setup interview as mentioned above and further described in the paragraphs below corresponding to FIGS. 11A-13A-1) in which the user answers a few simple questions, and then continuing, over time, using multi-sensor technology to detect user occupancy patterns and to track the way the user controls the temperature using schedule changes and immediate-temperature control selections or inputs. In addition to being intelligent, as described above, VSCU unit 100 may also be connected to a network.

As mentioned above, for simple environments having no wireless home network or internet connectivity, VSCU unit 100 operates effectively in a standalone mode, learning and adapting to an environment based on multi-sensor technology and user input. However, for environments that have home network or Internet connectivity, the intelligent thermostat operates effectively in a network-connected mode to offer additional capabilities. For example, when VSCU unit 100 is connected to the Internet via a home network, such as through IEEE 802.11 (Wi-Fi) connectivity, the intelligent thermostat may: (1) provide real-time or aggregated home energy performance data to a utility company, intelligent thermostat data service provider, intelligent thermostats in other homes, or other data destinations; (2) receive real-time or aggregated home energy performance data from a utility company, intelligent thermostat data service provider, intelligent thermostats in other homes, or other data sources; (3) receive new energy control instructions and/or other upgrades from one or more intelligent thermostat data service providers or other sources; (4) receive current and forecasted weather information for inclusion in energy-saving control algorithm processing; (5) receive user control commands from the user's computer, network-connected television, smart phone, and/or other stationary or portable data communication appliance; (6) provide an interactive user interface to a user through a digital appliance; (7) receive control commands and information from an external energy management advisor, such as a subscription-based service aimed at leveraging collected information from multiple sources to generate energy-saving control commands and/or profiles for their subscribers; (8) receive control commands and information from an external energy management authority, such as a utility company to which limited authority has been voluntarily given to control the intelligent thermostat in exchange for rebates or other cost incentives; (9) provide alarms, alerts, or other information to a user on a digital appliance based on intelligent thermostat-sensed HVAC-related events; (10) provide alarms, alerts, or other information to the user on a digital appliance based on intelligent thermostat-sensed non-HVAC related events; and (11) provide a variety of other useful functions enabled by network connectivity. Additional features and details concerning the networking of VSCU unit 100 are described in the paragraphs below corresponding to FIGS. 14A-16.

Next, an implementation of the above-described automated-control-schedule-learning methods for VSCU unit 100 is provided.

FIG. 8A-FIG. 8D-2 illustrate steps for achieving initial learning according a preferred embodiment. FIGS. 9A-9M illustrate a progression of conceptual views of a thermostat or HVAC schedule as processing is performed according to selected steps of FIG. 8A-FIG. 8D-2, for an exemplary scenario of a particular day of initial learning. For one preferred embodiment, the steps FIG. 8A-FIG. 8D-2 are carried out by the head unit microprocessor of VSCU unit 100, and advantageously can be carried out even in the event there is no internet connectivity. However, it is to be appreciated that the scope of the present teachings is not so limited, and that in other preferred embodiments one or more of the steps of FIG. 8A-FIG. 8D-2 can be carried out by a cloud server to which the VSCU unit 100 has network connectivity. While the example presented in FIGS. 9A-9M is for a heating schedule scenario, it is to be understood that the method is likewise applicable for cooling schedule learning, and further can be readily extended by a person skilled in the art, in view of the present teachings, to HVAC schedules containing setpoints or temperature selections, e.g., mixtures of heating setpoints, cooling setpoints, and/or "range" setpoints (i.e., setpoints having both upper and lower temperature boundaries. It is to be further appreciated that while the examples of FIGS. 8A-9M are presented in the particular context of establishing a weekly schedule, which represents one particularly appropriate time basis for HVAC schedule establishment and execution, the scope of the present teachings is in no way to be considered as so limited, and that in other preferred embodiments there may be established a bi-weekly HVAC schedule, a semi-weekly HVAC schedule, a monthly HVAC schedule, a bi-monthly HVAC schedule, a seasonal HVAC schedule, and so forth based on the described teachings and principles. It is to be further appreciated that while the examples of FIGS. 8A-9M are presented and/or discussed in terms of a typical residential installation (e.g., "the user arrives home from work," "the user is asleep"), this is only for purpose of clarity of explanation and should not be considered as limiting the methods to residential applications, as the methods are indeed applicable for a wide variety of other types of enclosures such as retail stores, business offices, industrial settings, and so forth. In the discussion that follows, as will be appreciated by the skilled reader in view of the context, the "time" of a particular user action or setpoint entry will most often connote both the day and the time of day of that action or entry, while the term "time of day" will generally only connote a particular time of day.

The initial learning process represents an "aggressive learning" approach in which the goal is to quickly establish a basic and at least roughly appropriate HVAC schedule for the user based on a very brief period of automated observation and tracking of user behavior. Once the initial learning process is established, the VSCU unit 100 then switches over to a different mode of automated learning, termed herein steady-state learning, which is directed to perceiving and adapting to longer-term repeated behaviors of the user, and which is described further infra with respect to FIGS. 10A through 10B. In most cases, the initial learning process will be instantiated (step 4002) responsive to a new installation and startup of the VSCU unit 100 in an enclosure, such as a residence, and more particularly subsequent to a user-friendly "setup interview", which is described further in U.S. Ser. No. 13/269,501, supra. Initial learning can also be instantiated, however, upon some other event which "clears out" the existing HVAC schedule (hereinafter simply termed a "schedule"), such as a factory reset of the VSCU unit 100, or at the explicit request of the user who may wish for the VSCU unit 100 to start over again with a clean slate.

Figure 9A:
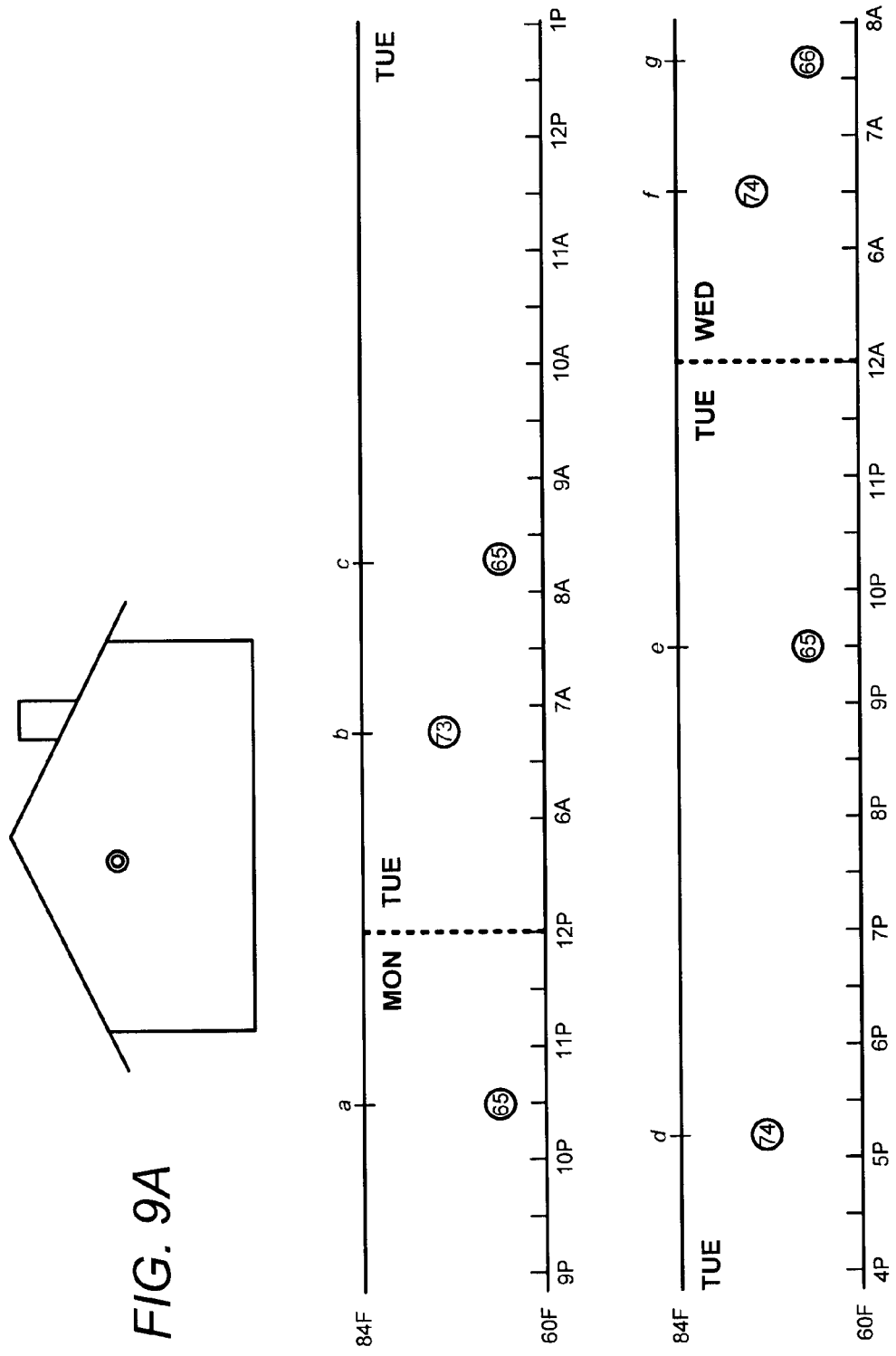
FIGS. 9A-M illustrate a progression of conceptual views of a thermostat control schedule.

At step 4004, a default beginning schedule is accessed, which can be thought of as a sort of "clay" that will be quickly formed into an at least roughly appropriate schedule for the user by the initial learning process. For one preferred embodiment, the beginning schedule is simply a single setpoint that takes effect at 8 AM each day, having a single setpoint temperature. This single setpoint temperature is dictated by a user response that is provided near the end of the setup interview, or upon re-instantiation of initial learning, where the user is simply asked whether they want their thermostat to start learning a heating schedule or a cooling schedule. If the user chooses heating, then the initial single setpoint temperature is set to 68 degrees F. (or some other appropriate heating setpoint temperature), and if the user chooses cooling, then the initial single setpoint temperature is set to 80 degrees F. (or some other appropriate cooling setpoint temperature). In other preferred embodiments, the default beginning schedule can be one of a plurality of predetermined or pre-existing "HVAC schedules" or "template schedules" selected directly or indirectly by the user at the initial setup interview (e.g., "single-person household"; "working family", "retired couple", etc.). FIG. 9A illustrates an example of a default beginning schedule having heating setpoints (hereinafter simply termed "setpoints" for the examples presented) labeled "a" through "g".

At step 4006, a new day of initial learning is instantiated. The selection of a one-day period as a basis for initial learning has been found to provide good results. As used herein, a "basis" time period means the period of time over which user behavior is observed and captured before it is processed to produce a next version, iteration, or refinement of the schedule. While a basis period of one day has been found to provide good results, it is to be appreciated that the periodic basis for learning can be other periods of time, such multi-day blocks of time, sub-day blocks of time (e.g., 6 hours at a time), time intervals (e.g., weekdays and weekends), any other suitable period as 6-hour blocks of time, and can even be variable, random, or continuous. For example, when performed in a continuous basis, any user setpoint change or scheduled setpoint input can be used as a trigger for processing that information in conjunction with the present schedule to produce a next version, iteration, or refinement of the schedule. For one preferred embodiment in which the VSCU unit 100 is a power-stealing thermostat having a rechargeable battery, the period of one day has been found to provide a suitable balance between the freshness of the schedule revisions and the need to maintain a modest computing load on the head unit microprocessor to preserve battery power. Therefore, in the discussion that follows, it is to be appreciated that the use of a "day" as the basis period is not to be construed as limiting the scope of the present teachings.

At step 4008, throughout the day, the VSCU unit 100 (hereinbelow simply "thermostat") receives and stores both real-time (RT) and non-real time (NRT) user setpoint entries. As used herein, a real-time (RT) user setpoint entry corresponds to a user-entered setpoint that is to take effect immediately upon entry. Thus, for example, any time the user walks up to the dial and changes the current setpoint temperature by a ring rotation, as shown in FIGS. 3A-3B supra, the resulting entry stored by the thermostat is an RT user setpoint entry. Likewise, if the user accesses the thermostat remotely using their smartphone, tablet, or computer web browser (either directly or through a cloud server that is in network communication with the thermostat) to achieve the equivalent of the dial rotation of FIGS. 3A-3B, that entry is an RT user setpoint entry. In contrast, as used herein, a non-real-time (NRT) user setpoint entry corresponds to a user-entered setpoint that entered using a scheduling facility and that is to take effect at a time and/or date that is different than the time at which the user is providing that input. The scheduling facility used to create NRT setpoints can be at the walk-up user interface of the thermostat (see, for example, FIG. 30, supra), or can be remotely through a smartphone, tablet, or computer web browser (either directly with the thermostat or with a cloud server that is in network communication with the thermostat). The effective time of an RT user setpoint entry will necessarily be the same as its entry time, while the effective time of an NRT user setpoint entry will necessarily be different than its entry time.

Figure 9B:
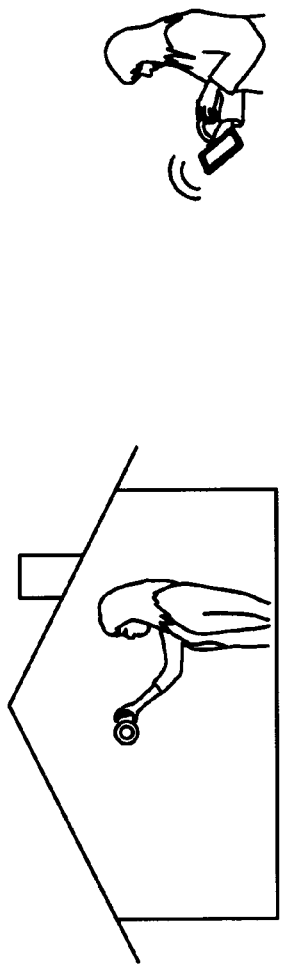
Figure 9B:
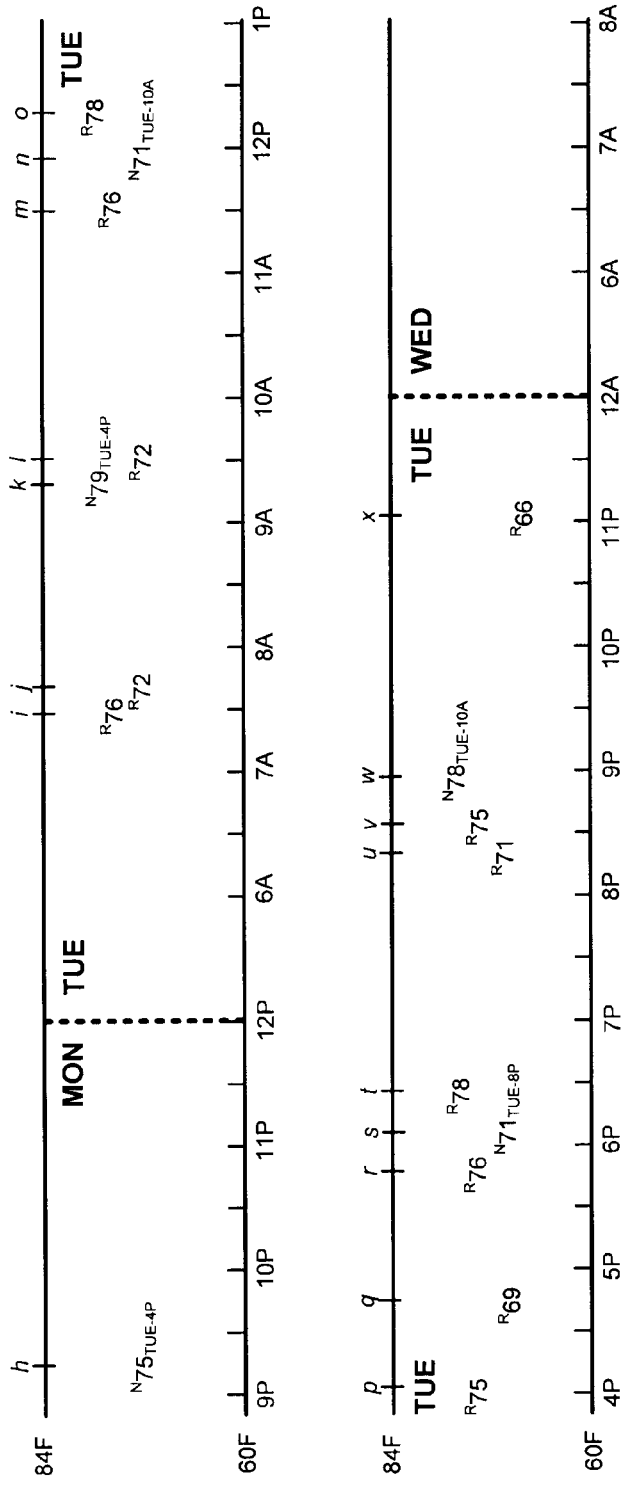

Shown in FIG. 9B is a graphical representation of a plurality of RT and NRT user setpoint entries that were made on a typical day of initial learning, which happens to be a Tuesday in this example. For convenience, the discussion herein uses the term "setpoint entry" in place of "user setpoint entry." In the accompany drawings including FIGS. 9A-9M, a preceding superscript "N" identifies an NRT setpoint entry, a preceding superscript "R" identifies an RT setpoint entry, and an encircled number represents a pre-existing scheduled setpoint. For each NRT setpoint, there is also provided a succeeding subscript that identifies the entry time of that NRT setpoint. Notably, there is no such subscript needed for RT setpoints, since their horizontal position on the schedule is indicative of both their effective time and their entry time. Thus, for the example of FIG. 9B, at 7:30 AM the user made an RT setpoint entry "i" having a temperature value of 76 degrees F., at 7:40 AM made another RT setpoint entry "j" having a temperature value of 72 degrees F., at 9:30 AM made another RT setpoint entry "l" having a temperature value of 72 degrees F., at 11:30 AM made another RT setpoint entry "m" having a temperature value of 76 degrees F., and so on. Also for the example of FIG. 9B, it can be seen that, on Tuesday at 10 AM, the user entered into their scheduling facility (either on the walk-up user interface or through their smartphone or web browser), and created an NRT setpoint entry "n" that is to take effect on Tuesdays at 12:00 PM, and furthermore created an NRT setpoint entry "w" that is to take effect on Tuesdays at 9:00 PM. Subsequently, on Tuesday at 4 PM, the user entered into their scheduling facility and created an NRT setpoint entry "h" that is to take effect on Mondays at 9:15 PM, and furthermore created an NRT setpoint entry "k" that was to take effect on Tuesdays at 9:15 AM. Finally, on Tuesday at 8 PM, the user entered into their scheduling facility and created an NRT setpoint entry "s" that is to take effect on Tuesdays at 6:00 PM.

Referring now to step 4010, throughout the day of initial learning, the thermostat proceeds to control the HVAC system according to (i) whatever current version of the schedule is then in effect, which would be the default beginning schedule from step 4004 if this is indeed the first day of initial learning, as well as (ii) whatever RT setpoint entries are made by the user, as well as (iii) whatever NRT setpoint entries have been made that are causally applicable. The effect of an RT setpoint entry on the current setpoint temperature is maintained until the next pre-existing setpoint is encountered, until a causally applicable NRT setpoint is encountered, or until a subsequent RT setpoint entry is made. Thus, with reference to FIGS. 9A-9B, on Tuesday morning at 6:45 PM the current operating setpoint of the thermostat changes to 73 degrees F. due to pre-existing setpoint "b", then at 7:30 AM the current operating setpoint changes to 76 degrees F. due to RT setpoint entry "i", then at 7:45 AM the current operating setpoint changes to 72 degrees F. due to RT setpoint entry "j", then at 8:15 AM the current operating setpoint changes to 65 degrees F. due to pre-existing setpoint entry "c", then at 9:30 AM the current operating setpoint changes to 72 degrees F. due to RT setpoint entry "l", then at 11:30 AM the current operating setpoint changes to 76 degrees F. due to RT setpoint entry "m", then at 12:00 PM the current operating setpoint changes to 71 degrees F. due to NRT setpoint entry "n", then at 12:15 PM the current operating setpoint changes to 78 degrees F. due to RT setpoint entry "o", and so forth. Notably, at 9:15 AM, there is no change in the current setpoint due to NRT setpoint entry "k" because it did not yet exist, i.e., was not causally applicable, since it did not get entered by the user until 4 PM that day. In contrast, the NRT setpoint entry "n" was causally applicable because it had been entered by the user at 10 AM that day, and so it took effect at its designated effective time of 12:00 PM.

According to one optional alternative embodiment, step 4010 can be carried out such that any RT setpoint entry is only effective for a maximum of 2 hours (or other relatively brief interval) in terms of the actual operating setpoint temperature, and then the operating setpoint temperature is returned to whatever would be dictated by the pre-existing setpoints on the current schedule, or whatever would be dictated by any causally applicable NRT setpoint entries. This optional alternative embodiment is designed to encourage the user to make more RT setpoint entries during the initial learning period, such that the learning process can be achieved more quickly. As an additional optional alternative, the default beginning schedule at step 4004 is assigned with relatively low-energy setpoints (i.e., relatively cold in winter, such as 62 degrees or 65 degrees), which can result in a lower-energy total schedule since any higher-energy setpoints would necessarily be resulting from the explicit wishes of the user. As yet another additional optional alternative, during the first few days, instead of reverting to any pre-existing setpoints after 2 hours that would otherwise be applicable, the operating setpoint instead reverts to a lowest-energy pre-existing setpoint in the schedule. For simplicity and clarity of disclosure, however, it is presumed in the following description that these "forcible low-energy" optional alternative embodiments are not activated.

Referring now to step 4012, at the end of the day (or other suitable basis period as discussed above), the stored RT and NRT setpoints are processed against each other and against the schedule of pre-existing setpoints in the schedule that was in effect that day to generate a modified version, iteration, or refinement of that schedule, the particular steps for which are set forth in FIG. 8B, infra. This processing can be carried out, for example, at 11:50 PM of the learning day, or some other time near or around midnight. If it is determined that the initial learning is not yet complete at step 4014, then the modified version of the schedule is used for another day of initial learning at steps 4006-4010 and is yet again modified at step 4012, and the process continues until initial learning is complete. If initial learning is complete, then steady-state learning is commenced at step 4016, which is described further infra with respect to FIGS. 10A-10B.

For some embodiments, the decision at step 4014 as to whether initial or "aggressive" schedule learning is complete is based on both the passage of time and whether there has been a sufficient amount of user behavior to observe. For one preferred embodiment, the initial learning is considered to be complete only if both of the following criteria are met: (i) two days of initial learning have passed, and (ii) there have been ten separate one-hour intervals for which there has been at least one user setpoint entry. Any of a variety of different criteria can be used for judging whether there has been enough observed user setpoint entry behavior to conclude initial learning without departing from the scope of the present teachings.

Figure 9C:
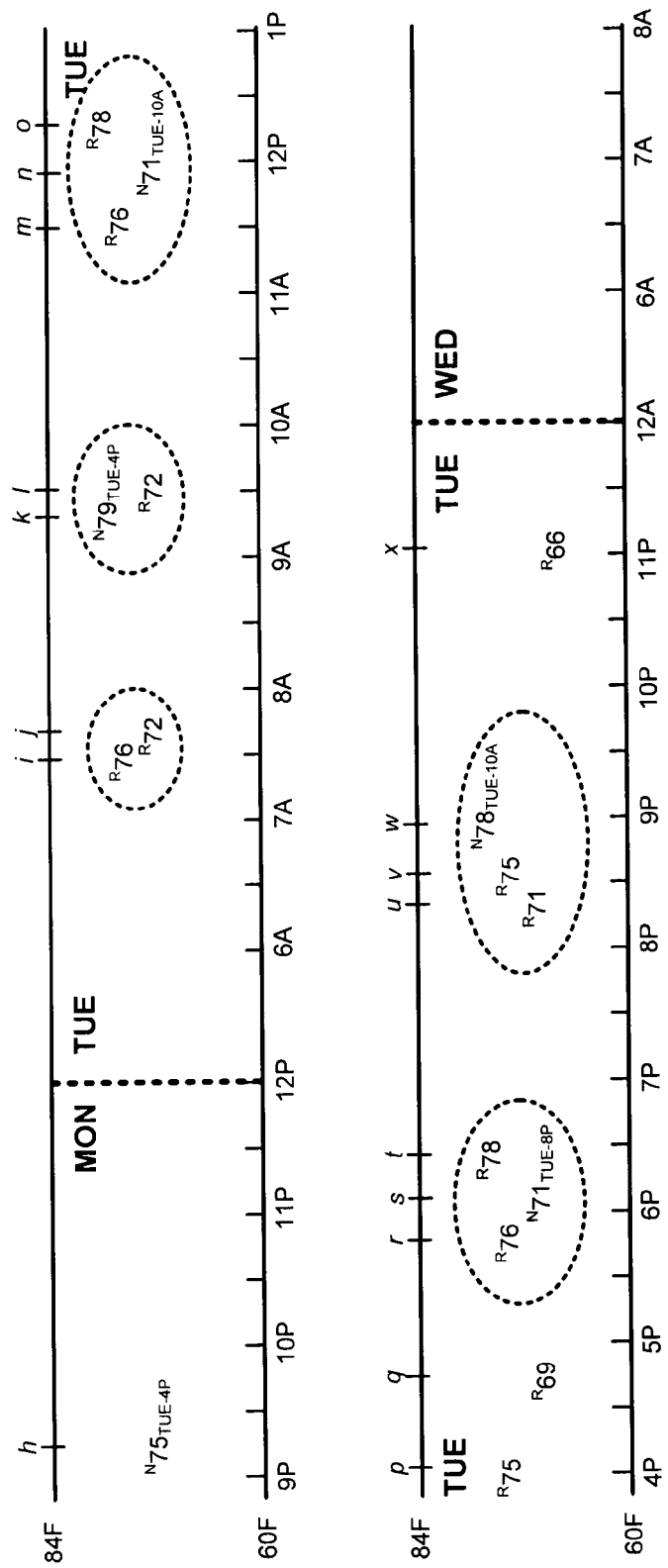

FIG. 8B illustrates steps for processing stored RT and NRT setpoints against each other and against the schedule of pre-existing setpoints to generate a modified version, iteration, or refinement of that schedule according to a preferred embodiment, which corresponds generally to step 4012 of FIG. 8A, supra. At step 4030, setpoint entries having nearby effective times are grouped into clusters, as illustrated in FIG. 9C. By way of example and not by way of limitation, any set of two or more setpoint entries for which the effective time of each member is separated by less than 30 minutes from that of at least one other member constitutes a single cluster.

At step 4032, each cluster of setpoint entries is processed to generate a single new setpoint that represents the entire cluster in terms of effective time and temperature value. This process, which could be called setpoint entry harmonization or fighting resolution, is directed to simplifying the schedule while at the same time best capturing the true intent of the user by virtue of their setpoint entry behavior. While a variety of different approaches (e.g., averaging of temperature values and effective times of cluster members) could be used without necessarily departing from the scope of the present teachings, one particularly effective method for carrying out the objective of step 4032, which is described in more detail in FIG. 8C, takes into account the NRT vs. RT status of each setpoint entry, the effective time of each setpoint entry, and the entry time of each setpoint entry, and may be thought of as a harmonization process among.

Referring now to FIG. 8C, which corresponds to step 4032 of FIG. 8B, it is first determined at step 4060 whether there are any NRT setpoint entries in the cluster having an entry time that is later than the earliest effective time in the cluster. If this is the case, then at step 4064 the single representative setpoint is assigned with both the effective time and the temperature value of the latest-entered NRT setpoint entry. This is believed to suitably capture the real wishes of the user, who has actually taken the time to go into the scheduling facility after the time in question and specifically entered their desired setpoint temperature for that time. If at step 4060 there are no such NRT setpoint entries, then at step 4062 the single representative setpoint is assigned with (i) the effective time of the earliest effective cluster member, and (ii) the setpoint temperature equal to that cluster member having the latest entry time. This is believed to suitably capture the wishes of the user who has not otherwise declared their wishes explicitly in a subsequent scheduling facility entry, in that the earliest effective time tends to represent the "when" of the setpoint (the recognition that something needed to be changed), while the latest-entered temperature value tends to represent the "what" of the setpoint (since it was the "last word" of the user with regard to that neighborhood of time).

Referring now again to FIG. 8B, at step 4034 the new representative setpoint that was determined at step 4032 is tagged with an "RT" or "NRT" moniker based on the type of setpoint entry from which its temperature value was assigned. Thus, in accordance with the logic of FIG. 8C, if it was an NRT setpoint that had the latest-occurring time of entry out of all the setpoint entries in the cluster, then the new setpoint is tagged as "NRT", whereas if it was an RT setpoint with the latest-occurring time of entry, then the new setpoint is tagged as "RT". At steps 4036-4038, any "solo" setpoint entries that are not clustered with other setpoint entries are simply carried through as new setpoints to the next phase of processing at step 4040.

Thus, referring now to FIGS. 9C-9D, it can be seen that for the "ij" cluster, which has only RT setpoint entries, the single representative setpoint "ij" is assigned to have the earlier effective time of RT setpoint entry "i" while having the temperature value of the later-entered RT setpoint entry "j," representing an application of step 4062 of FIG. 8C, and that new setpoint "ij" is assigned an "RT" label at step 4034. It can further be seen that that for the "kl" cluster, which has an NRT setpoint "k" with an entry time later than the earliest effective time in that cluster, the single representative setpoint "kl" is assigned to have both the effective time and temperature value of the NRT setpoint entry "k," representing an application of step 4064 of FIG. 8C, and that new setpoint "kl" is assigned an "NRT" label at step 4034. It can further be seen that that for the "mno" cluster, which has an NRT setpoint "n" but with an entry time earlier than the earliest effective time in that cluster, the single representative setpoint "mno" is assigned to have the earliest effective time of RT setpoint entry "m" while having the temperature value of the latest-entered setpoint entry "o," again representing an application of step 4062 of FIG. 8C, and that new setpoint "mno" is assigned an "RT" label at step 4034. The remaining results shown in FIG. 9D, all of which are also termed "new setpoints" at this stage, also follow from the methods of FIGS. 8B-8C.

Figure 9D:
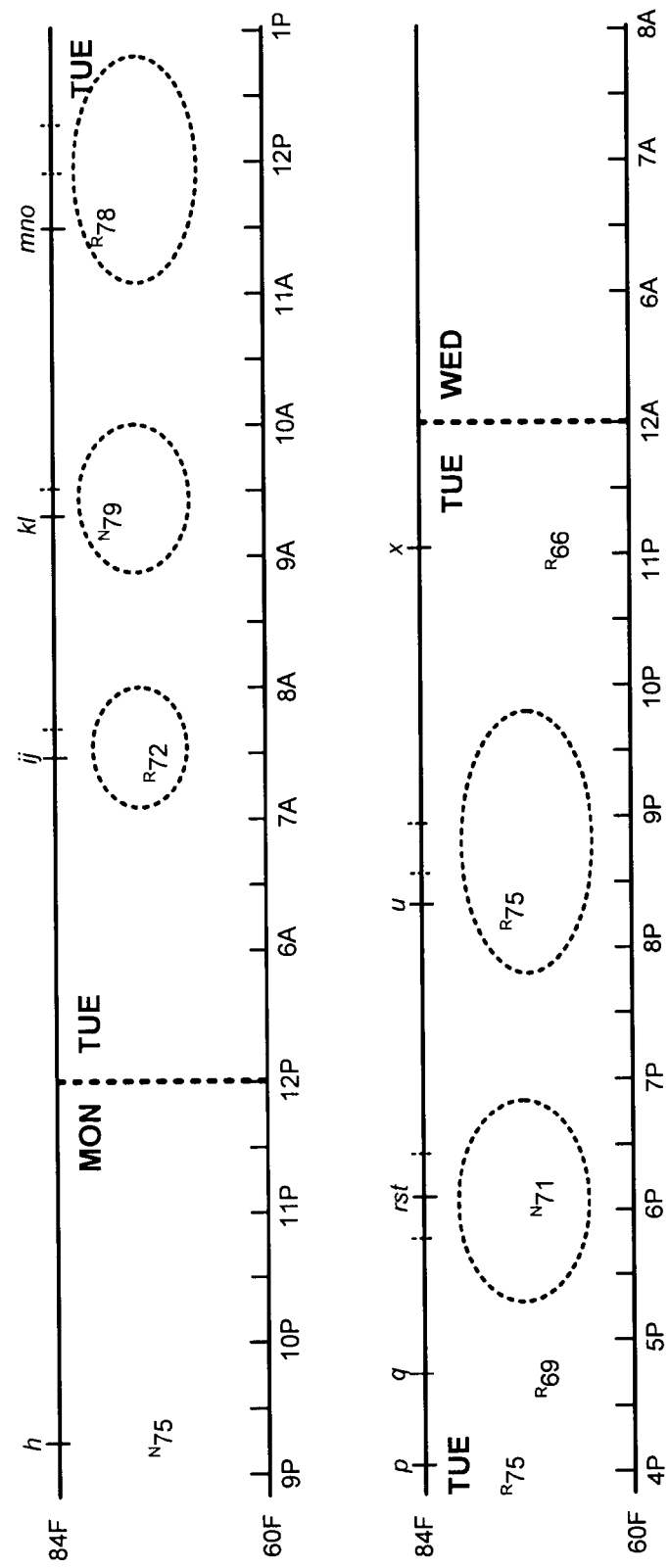
Figure 9E:
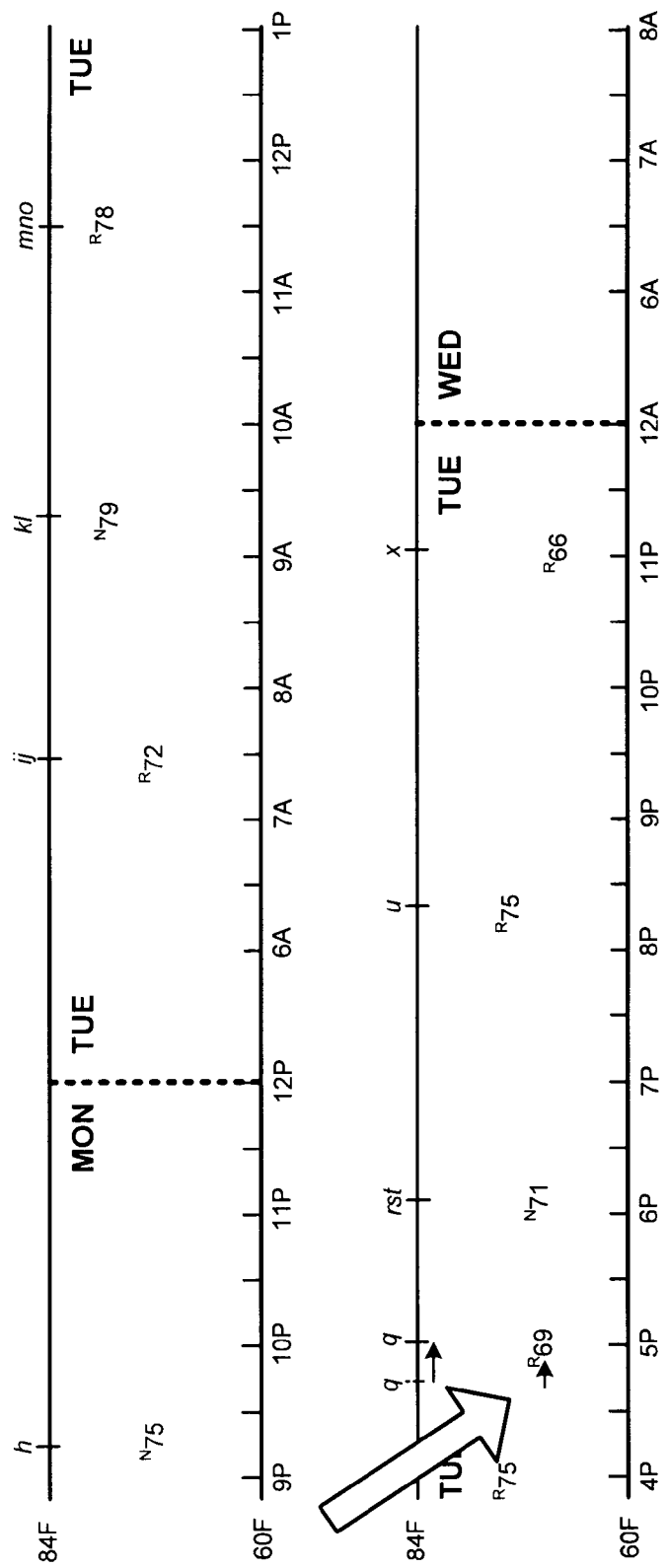

Referring now again to FIG. 8B, step 4040 is next carried out after steps 4034 and 4038 and applied to the new setpoints as a group, which are shown for example in FIG. 9D. At step 4040, any new setpoint having an effective time that is 31-60 minutes (i.e., or other suitable interval just outside the "clustering range") later than that of any other new setpoint is moved in time to have a new effective time that is 60 minutes later that that of the other new setpoint. This is shown in FIG. 9E as being applied to the new setpoint "q", whose effective time is being moved to 5:00 PM so that it is 60 minutes away from the 4:00 PM effective time of the new setpoint "p". Preferably, this process is only performed a single time based on an instantaneous snapshot of the schedule at the beginning of step 4040, that is, there is no iterative "cascading" effect of these new setpoint separations. Accordingly, while step 4040 will result in a time distribution of new setpoint effective times that are mostly separated by at least one hour, there may still be some new setpoints having effective times separated by less than one hour. These minor variances from a "clean" set of new setpoints has been found to be tolerable, and generally more preferable than deleterious effects that have been found with "cascading" to achieve total one-hour separations. Furthermore, it has been found that these one-hour separations (or other suitable separation interval) can be successfully completed later in the algorithm after processing against the pre-existing schedule setpoints as disclosed further infra.

Referring now to step 4042 of FIG. 8B, consistent with the "aggressive" purpose of the initial learning algorithm of quickly building a new schedule, the new setpoints that have now been established for the current learning day are then replicated across other days of the week that may be expected to have similar setpoints, if those new setpoints have been tagged as "RT" setpoints. Preferably, new setpoints tagged as "NRT" are not replicated, since there is a good probability that the user, who created the underlying NRT setpoint entry using a scheduling facility, has already created any similar NRT setpoint entries that they wanted to create using that scheduling facility, and that if they abstained from creating such similar setpoints, they abstained for a reason that should probably not be overridden by the initial learning process. For some embodiments that have been found to be well suited for the creation of a weekly schedule, a predetermined set of replication rules is applied that depends on which day of the week the initial learning process was first started. These replication rules are optimized to take into account the practical schedules of a large population of expected users, for which weekends will often be differently structured than weekdays, while at the same time being aggressive in quickly establishing an initial schedule within a short period of time so that steady-state learning can take effect. For one preferred embodiment, the replication rules set forth in Table 1 are applicable.

TABLE 1

| If The First Initial Learning Day Was . . . | And the Current Learning Day Is . . . | Then Replicate New Setpoints Onto . . . |
| --- | --- | --- |
| Any Day Mon-Thu | Any Day Mon-Fri | All Days Mon-Fri |
|  | Sat or Sun | Sat and Sun |
| Friday | Fri | All 7 Days |
|  | Sat or Sun | Sat and Sun |
|  | Any Day Mon-Thu | All Days Mon-Fri |
| Saturday | Sat or Sun | Sat and Sun |
|  | Any Day Mon-Fri | All Days Mon-Fri |
| Sunday | Sun | All 7 Days |
|  | Mon or Tue | All 7 Days |
|  | Any Day Wed-Fri | All Days Mon-Fri |
|  | Sat | Sat and Sun |

Figure 9F:
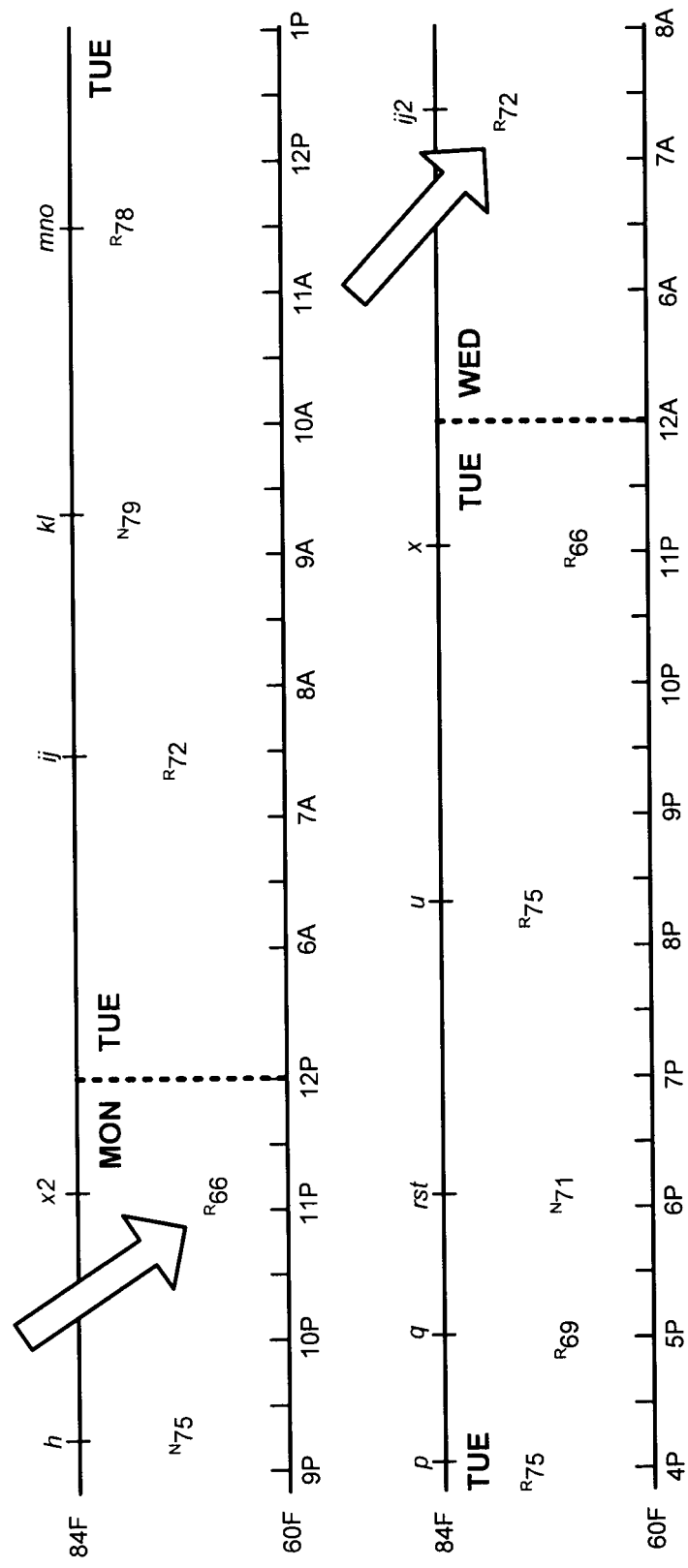

Illustrated in FIG. 9F are the effects of the replication of the RT-tagged new setpoints of FIG. 9E, which is a Tuesday, onto the displayed portions of neighboring days Monday and Wednesday. Thus, for example, the RT-tagged new setpoint "x" having an effective time of 11:00 PM is replicated as new setpoint "x2" on Monday (and all other weekdays), and the RT-tagged new setpoint "ij" having an effective time of 7:30 AM is replicated as new setpoint "ij2" on Wednesday (and all other weekdays). As per the rules of Table 1, all of the other RT-tagged new setpoints ("mno", "p", "q", and "u") are also replicated across all other weekdays. Notably, neither of the NRT-tagged new setpoints "kl" or "rst" are replicated. It is also notable that the NRT user setpoint entry "h", which was entered on Tuesday by the user who desired it to be effective on Mondays, is not replicated.

Figures 2, 8D:
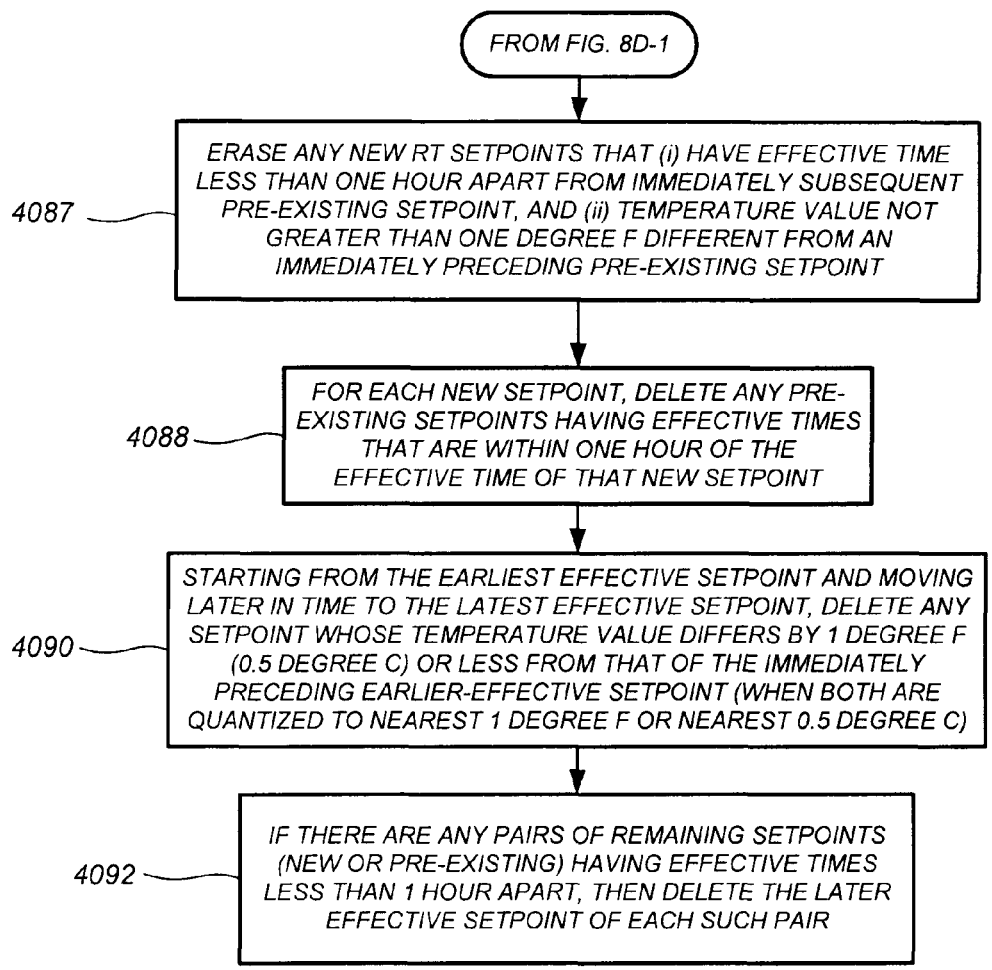
Figure 9G:
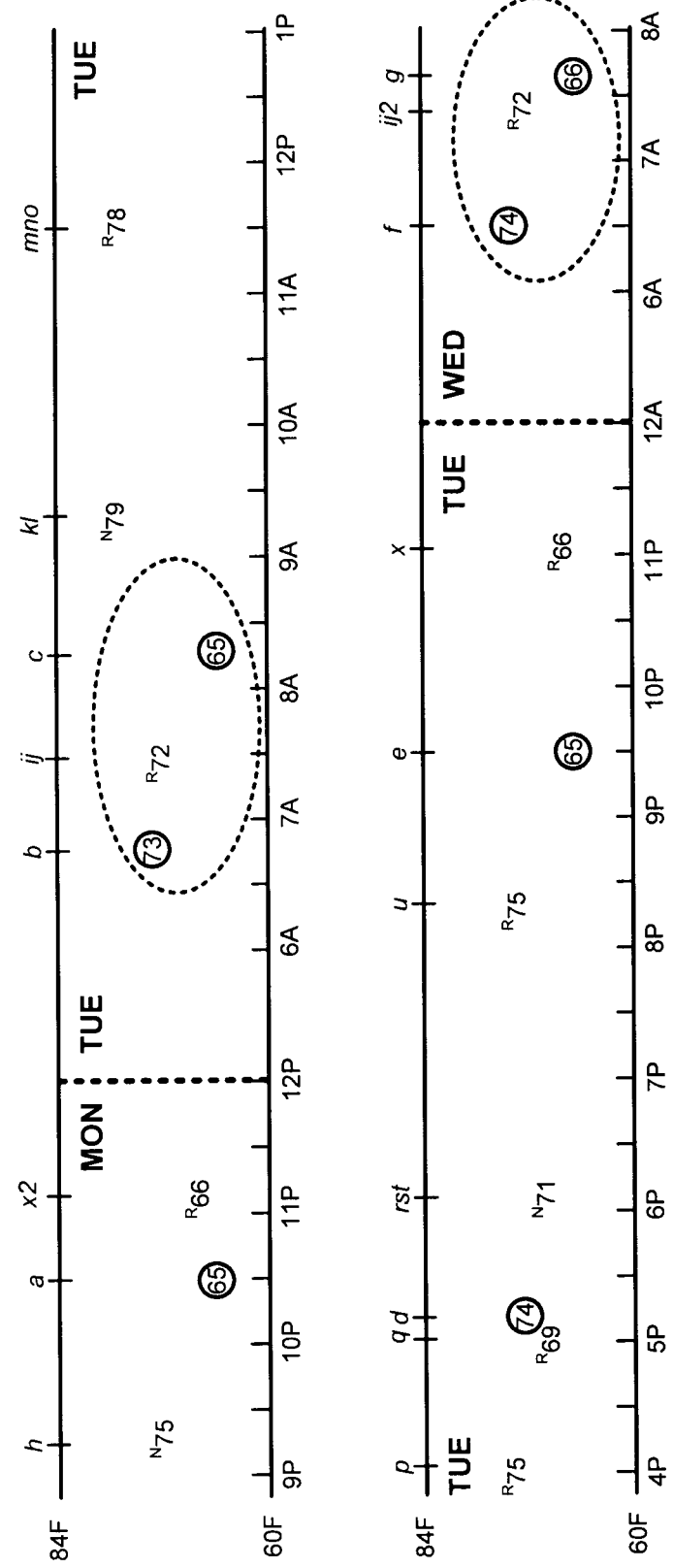

Referring now to step 4044 of FIG. 8B, the new setpoints and replicated new setpoints are overlaid onto the current schedule of pre-existing setpoints, as illustrated in FIG. 9G, which shows the pre-existing setpoints encircled and the new setpoints not encircled. Notably, in many of the subsequent steps the RT-tagged and NRT-tagged new setpoints are treated the same, and if so then the "RT" and "NRT" monikers are not used in describing such steps. At step 4046, there is performed a mutual filtering and/or effective time shifting of the new and pre-existing setpoints according to predetermined filtering rules that are designed to optimally capture the pattern information and preference information contained in each, while also simplifying overall schedule complexity. While a variety of different approaches could be used without necessarily departing from the scope of the present teachings, one particularly effective method for carrying out the objective of step 4046, which is described in more detail in FIGS. 8D-1 & 8D-2. Finally, at step 4048, the results of step 4046 become the newest version of the current schedule that is then either further modified by another initial learning day, or that is used as the starting schedule in the steady-state learning process.

Figure 9H:
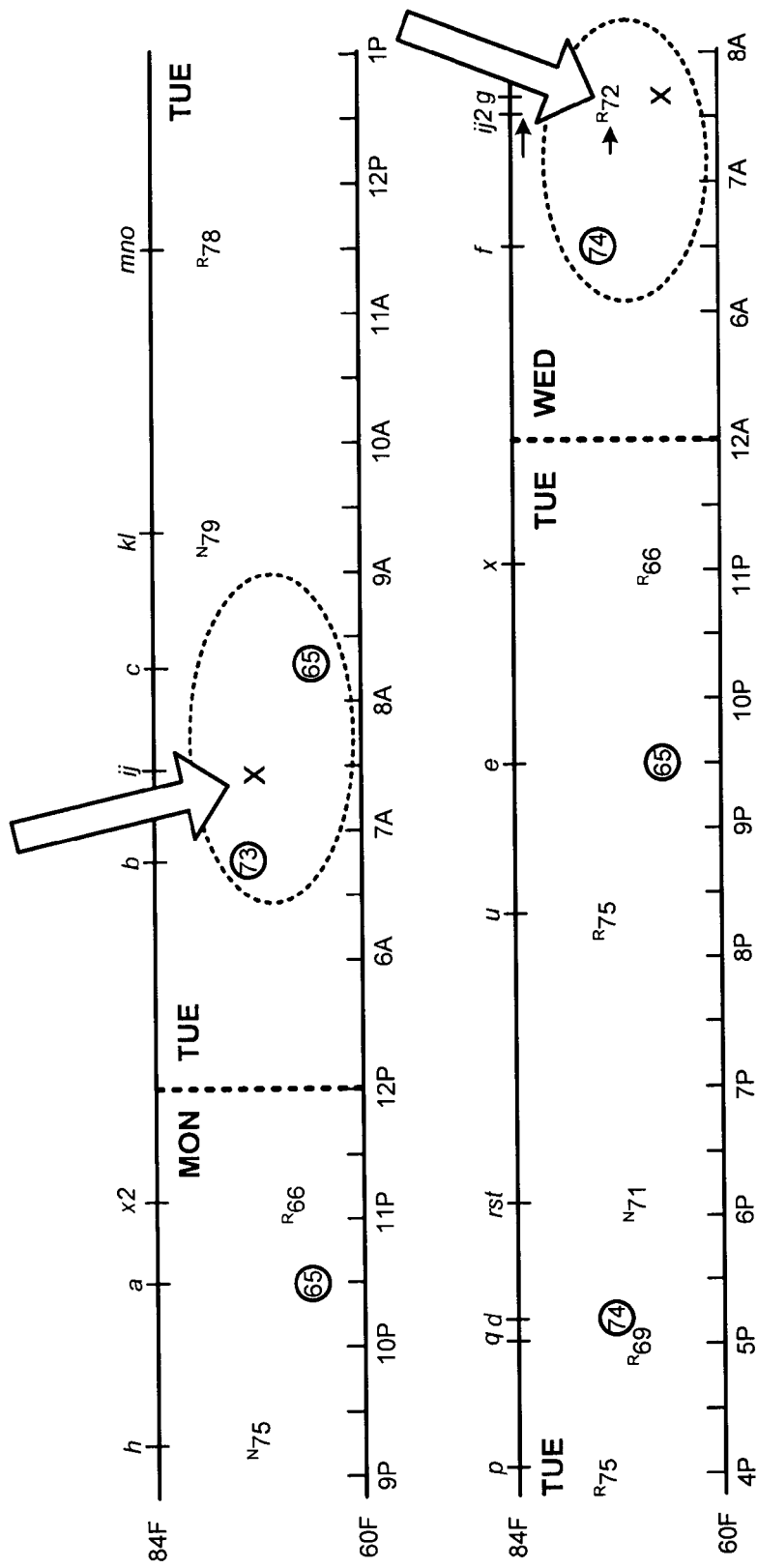

Referring now to in FIGS. 8D-1 & 8D-2, which sets forth one particularly effective method for carrying out the processing of step 4046 of FIG. 8C, at step 4080 there is identified as a "first type" any new setpoint having an effective time that is less than one hour (or other suitable proximity interval) later than that of a first pre-existing setpoint and less than one hour (or other suitable proximity interval) earlier than that of a second pre-existing setpoint. Examples of such new setpoints of the "first type" are circled in dotted lines in FIG. 9G. Notably, the steps of in FIGS. 8D-1 & 8D-2 are carried out for the entire weeklong schedule, even though only a portion of that schedule being shown in FIG. 9G for explanatory purposes. At step 4081, any new setpoints of the first type are simply deleted if both of the following two conditions are met: (i) they have effective times less than one hour earlier than the immediately subsequent pre-existing setpoint, and they have a temperature value that is not more than one degree F. away (or other suitable different indicative of a "similar" or "like" temperature value) from that of the immediately preceding pre-existing setpoint. Preferably, for purposes of step 4081 and any steps disclosed further herein in which there is "nearness" or "similarity" evaluation between the temperature values of two setpoints, the comparison of the setpoint values is carried out with respect rounded versions of their respective temperature values, the rounding being to the nearest one degree F. or to the nearest 0.5 degree C., even though the temperature values of the setpoints may be maintained to a precision of 0.2 degrees F. or 0.1 degrees C. for other operational purposes. When using this rounding, for example, two setpoint temperatures of 77.6 degrees F. and 79.4 degrees F. will be considered as 1 degree F. apart when each is first rounded to the nearest degree F., and therefore not greater than 1 degree F. apart. Likewise, two setpoint temperatures of 20.8 degrees C. and 21.7 degrees C. will be considered as 0.5 degree C. apart when each is first rounded to the nearest 0.5 degree C., and therefore not greater than 0.5 degree C. apart. When applied to the example scenario at FIG. 9G, it can be seen that new setpoint "ij" falls within the purview of the rule in step 4081, and that new setpoint "ij" is thus deleted as shown in FIG. 9H.

Subsequent to the deletion of any new setpoints (of the first type) pursuant to step 4081, at step 4082 there is identified any new setpoint of the first type that has an effective time that is within 30 minutes (or other suitable nearness interval) of the immediately subsequent pre-existing setpoint, and if so, that new setpoint is moved later in time to one hour (or other suitable proximity interval greater than the suitable nearness interval) later than the immediately preceding pre-existing setpoint, and the immediately subsequent pre-existing setpoint is deleted. When applied to the example scenario at FIG. 9G, it can be seen that new setpoint "ij2" falls within the purview of the rule in step 4082, and that new setpoint "ij2" is thus moved later in time to one hour from the earlier pre-existing setpoint "f", and the subsequent pre-existing setpoint "g" is deleted as shown in FIG. 9H. Subsequently at step 4084, there is identified any new setpoint of the first type that has an effective time that is within 30 minutes (or other suitable nearness interval) of the immediately preceding pre-existing setpoint, and if so, that new setpoint is moved earlier in time to one hour (or other suitable proximity interval greater than the suitable nearness interval) earlier than the immediately subsequent pre-existing setpoint, and the immediately preceding pre-existing setpoint is deleted. At step 4086, for each remaining new setpoint of the first type that is not subject to the purview of steps 4082 or 4084 (i.e., it is greater than 30 minutes from each of the immediately preceding and immediately subsequent pre-existing setpoints), then the setpoint temperature of the immediately preceding pre-existing setpoint is changed to that of the new setpoint, and that new setpoint is simply deleted.

Figure 9I:
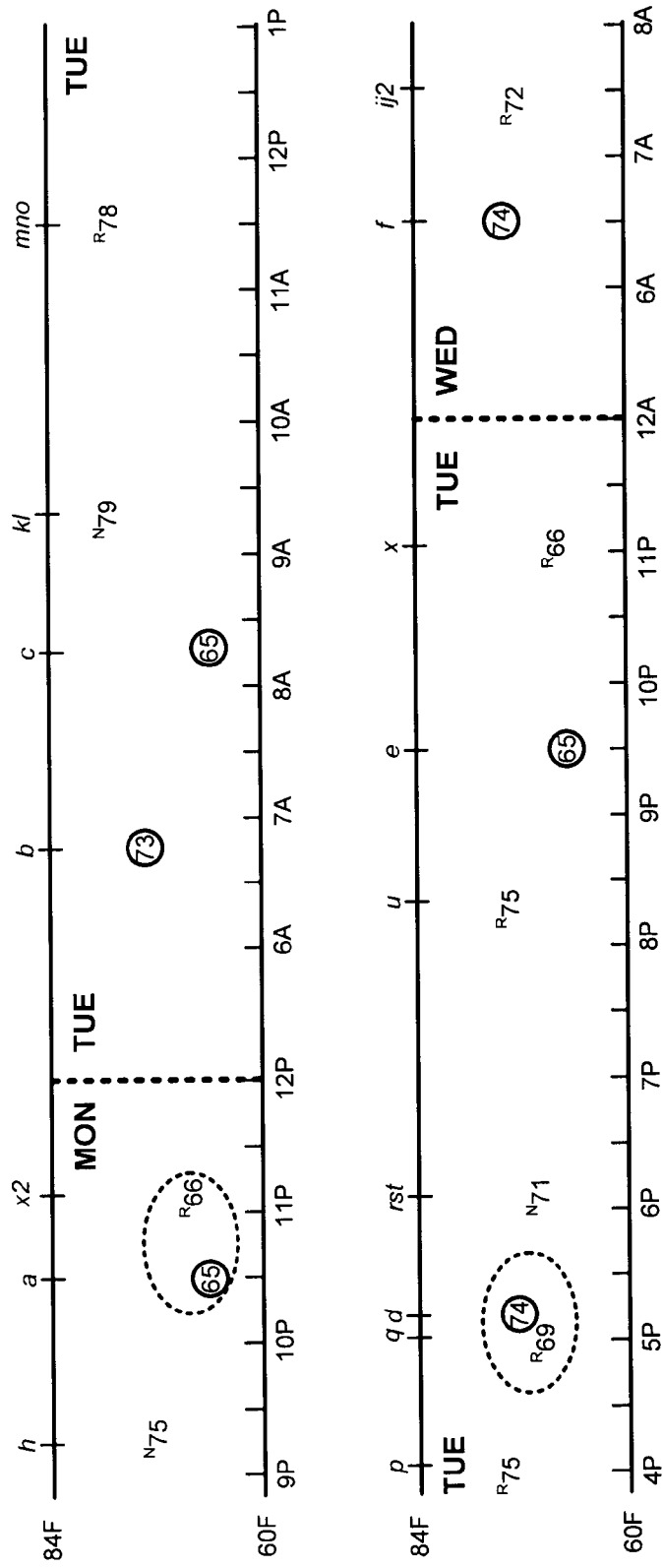
Figure 9J:
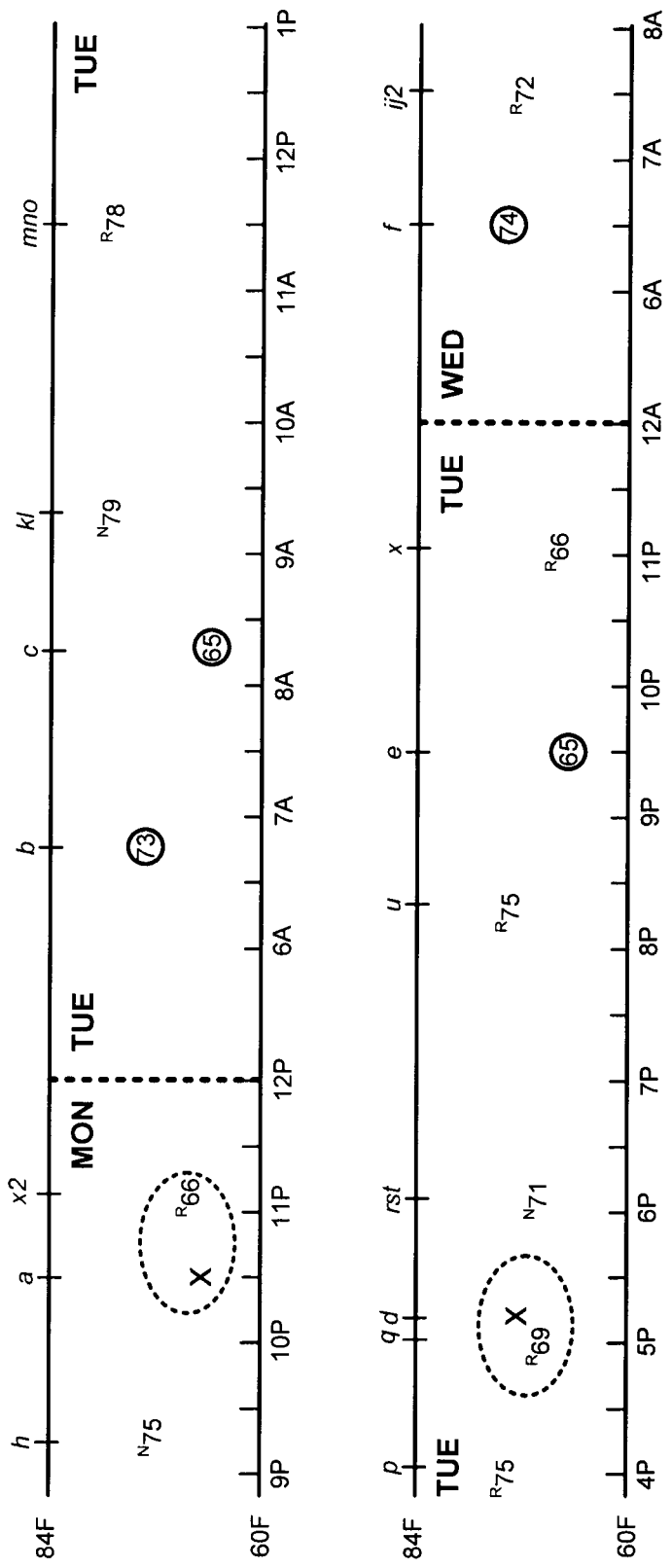

Subsequently to step 4086, at step 4087 there is identified and deleted any RT-tagged new setpoint that is within one hour (or other suitable proximity interval) of an immediately subsequent pre-existing setpoint and that has a temperature value not greater than one degree F. (or other suitable temperature similarity value) different from an immediately preceding pre-existing setpoint. Subsequently to step 4087, step 4088 is carried in which, for each new setpoint, any pre-existing setpoint that is within one hour (or other suitable proximity interval) of that new setpoint is deleted. Thus, for example, shown in FIG. 9I is the pre-existing setpoint "a" that is less than one hour away from the new setpoint "x2", and so that pre-existing setpoint "a" is deleted in FIG. 9J. Likewise, the pre-existing setpoint "d" is less than one hour away from the new setpoint "q", and so that pre-existing setpoint "d" is deleted in FIG. 9J.

Figure 9K:
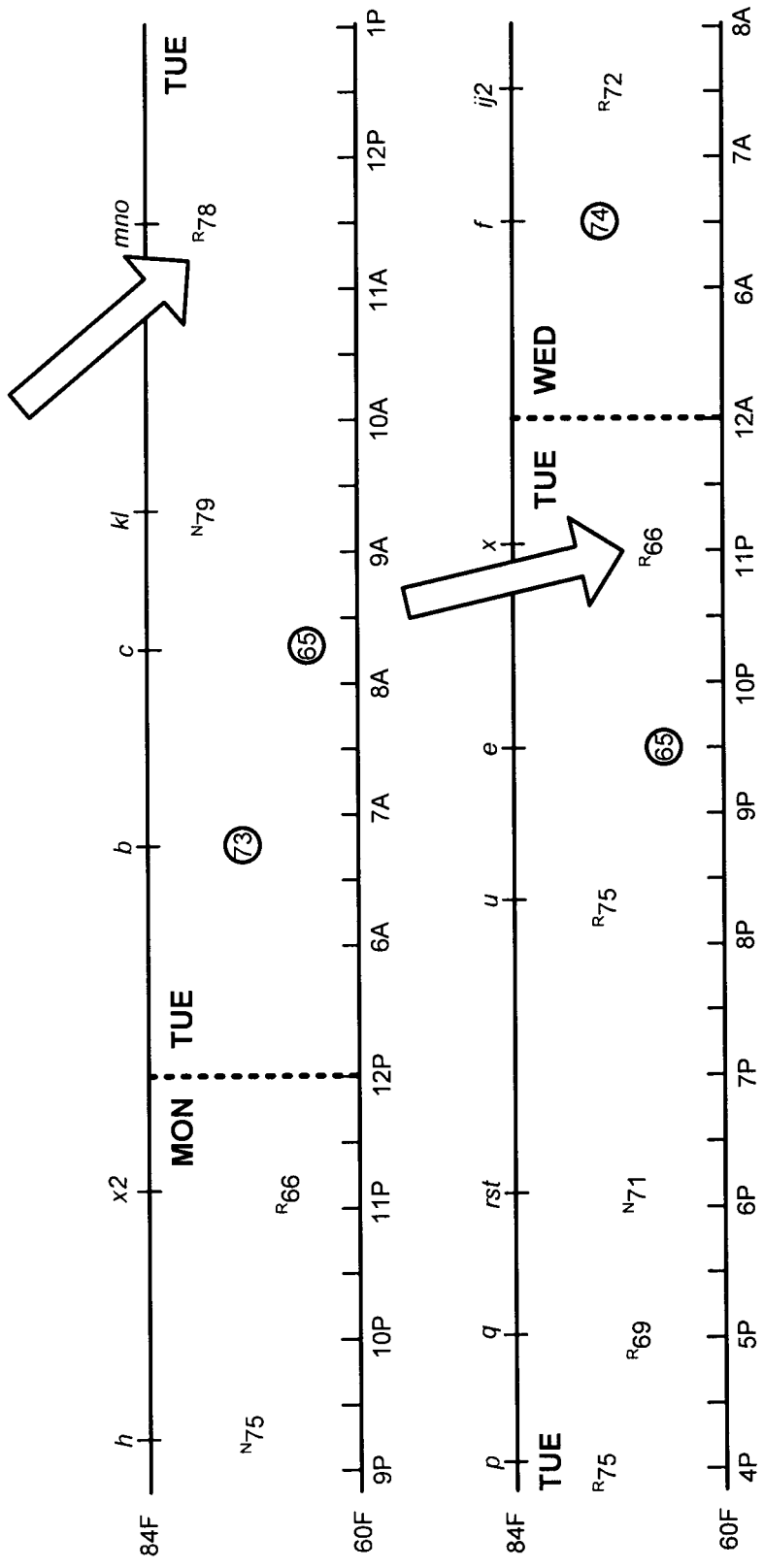
Figure 9L:
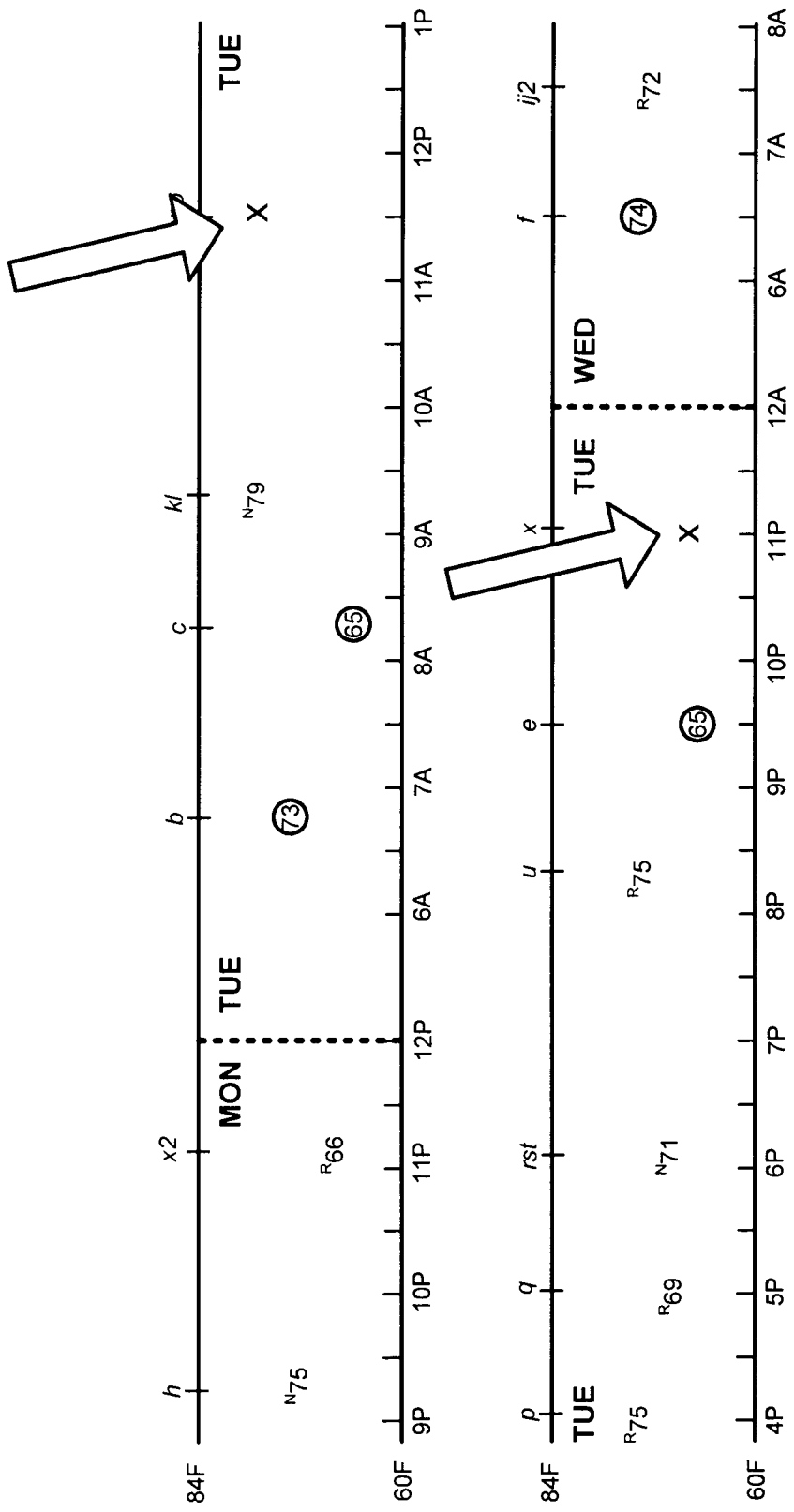
Figure 9M:
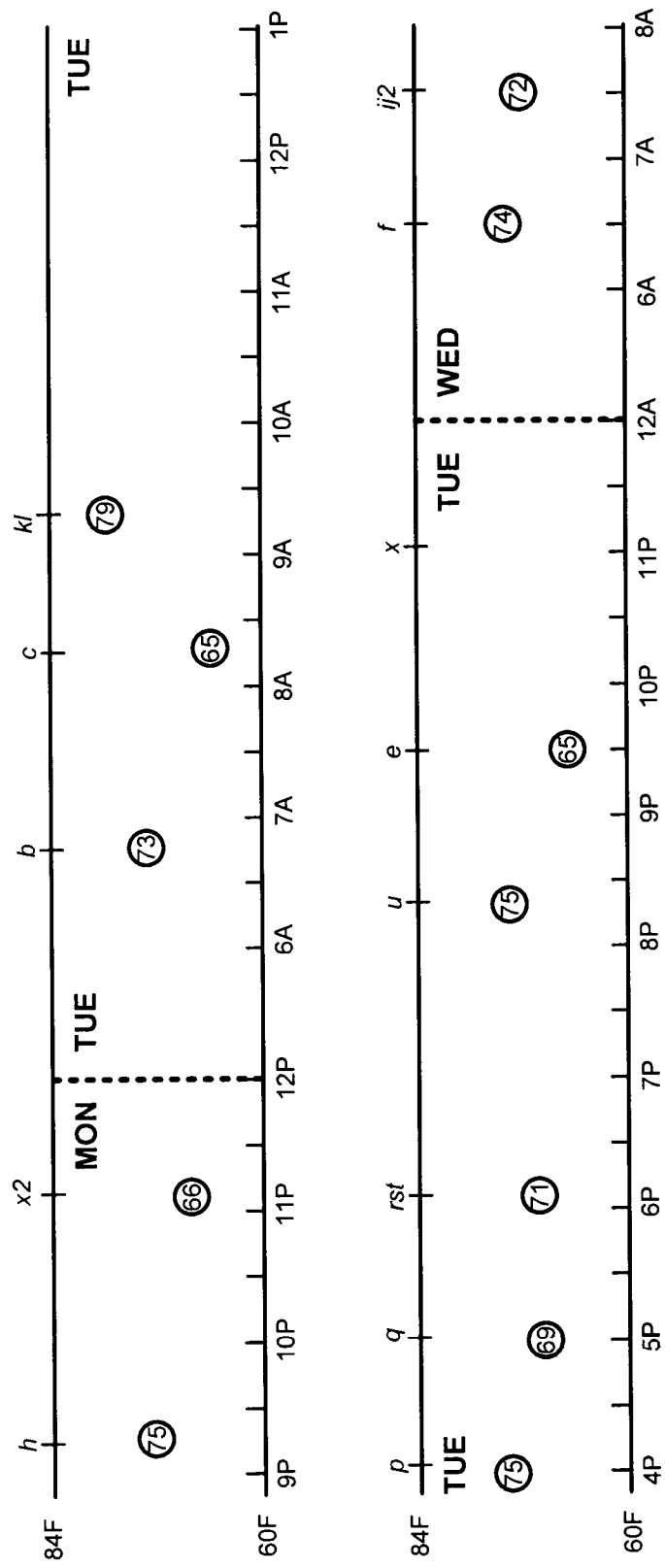

Subsequently to step 4088, step 4090 is carried out in which, starting from the earliest effective setpoint time in the schedule and moving later in time to the latest effective setpoint time, any setpoint (new or pre-existing) is deleted if that setpoint has a temperature value that differs by not more than 1 degree F. or 0.5 degree C. from that of the immediately preceding setpoint (when quantized to the nearest 1 degree F. or 0.5 degree C. as discussed above). Thus, for example, shown in FIG. 9K are the setpoints "mno" and "x" that are each not more than one degree F. from the immediately preceding setpoints, and so those setpoints "mno" and "x" are deleted in FIG. 9L. Finally, at step 4092, if there are any remaining pairs of setpoints (new or pre-existing) having effective times that are less than one hour (or other suitable proximity metric) apart, then the later effective setpoint of that pair is deleted. The surviving setpoints are then established as members of the current schedule as indicated in FIG. 9M, all of them becoming labeled as "pre-existing setpoints" for subsequent iterations of the initial learning process of FIG. 8A or, if that process is complete, for subsequent application of the steady-state learning algorithm described hereinbelow.

Figure 10A:
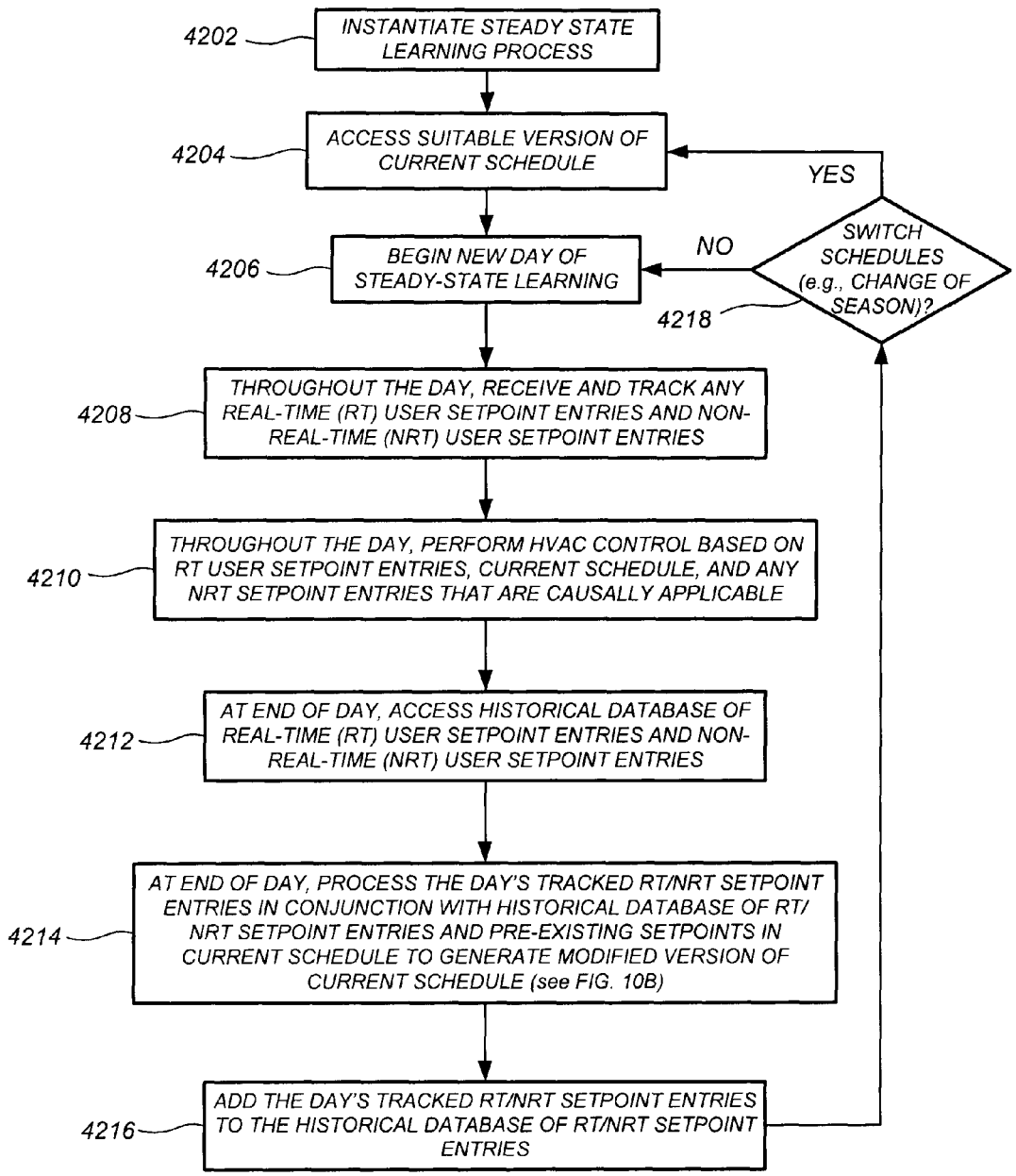
FIGS. 10A-10B illustrate steps for steady-state learning.
Figure 10B:
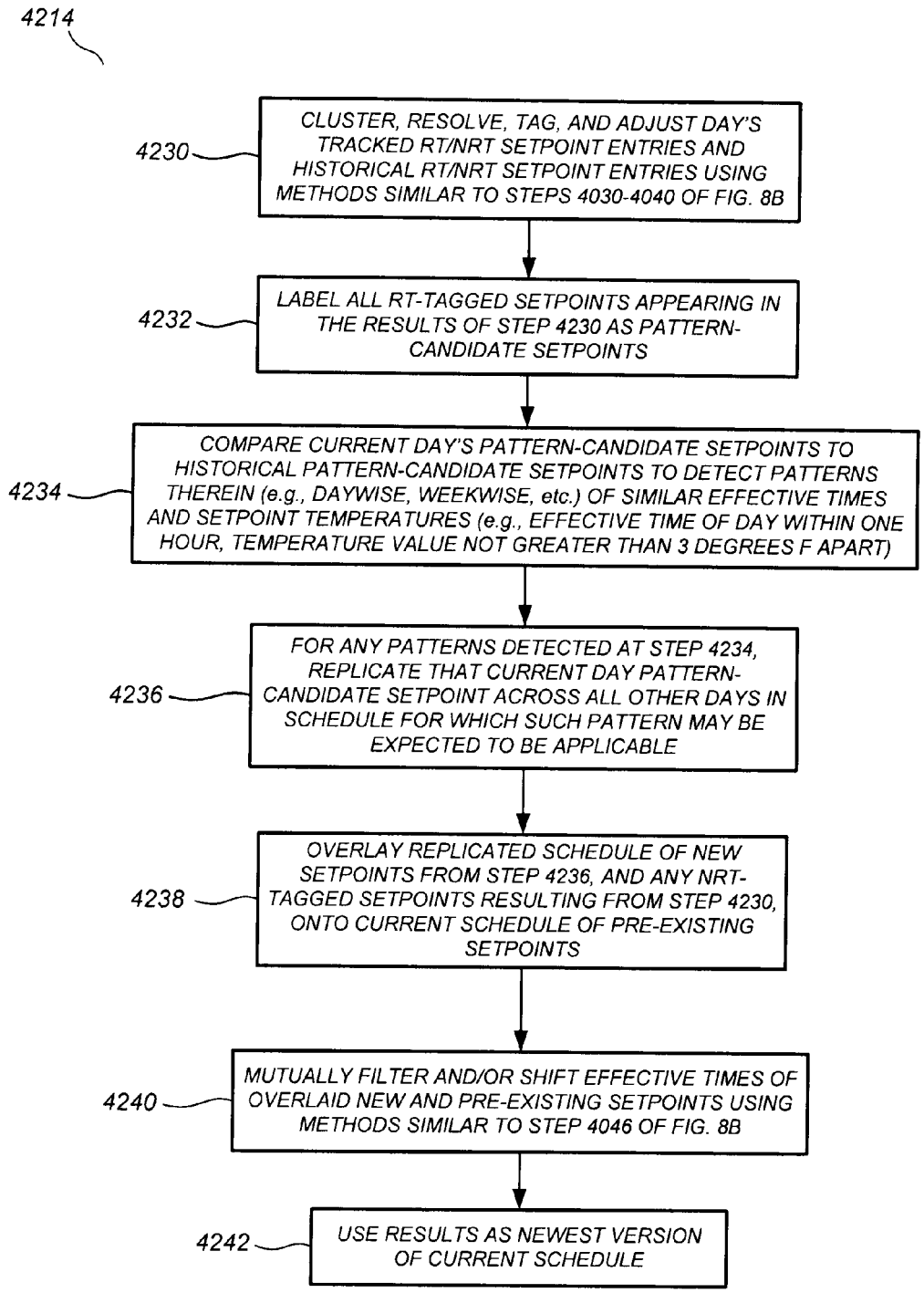

FIGS. 10A-10B illustrate steps for steady-state learning according a preferred embodiment. Many of the same concepts and teachings described supra for the initial learning process are applicable for steady-state learning, including the tracking of real-time (RT) user setpoint entries and non-real time (NRT) user setpoint entries, and further including clustering, resolving, replicating, overlaying, and final filtering and shifting. Similar teachings regarding the time basis for behavior observation intervals (i.e., the use of a "day" as the period for observation followed by processing is given by way of example and not by way of limitation), the time period of the overall schedule (i.e., the use of a "week" as the schedule period is given by way of example and not by way of limitation), and temperature value quantization prior to comparison are all applicable, and will not be repeated in the description hereinbelow.

Certain differences do arise between initial and steady state learning, however, in that for the steady state learning process there is an attention to the detection of historical patterns in the setpoint entries, an increased selectivity in the target days across which the detected setpoint patterns are replicated, and other differences as described further hereinbelow. Referring now to FIG. 10A, at step 4202 the steady state learning process is instantiated, which can correspond to the completion of the initial learning process (FIG. 8A, step 4016), and which can optionally correspond to a resumption of steady-state learning after a user-requested pause in learning. At step 4204, a suitable version of the current schedule is accessed. If the steady-state learning is being invoked immediately following initial learning, which will often be the case for a new thermostat installation, then the "suitable" schedule will be the current schedule as it stood at the completion of initial learning.

However, it is within the scope of the present teachings that there can be a previously established schedule that is accessed at step 4204. By way of example, there can be stored in the VSCU unit 100, or alternatively in a cloud server to which it has a network connection, a plurality of different schedules that were previously built up by the VSCU unit 100 over a similar period in the preceding year. For example, there can be a "January" schedule that was built up over the preceding January and then stored to memory on January 31. If step 4204 is being carried out on January 1 of the following year, then that previously stored "January" schedule can be accessed. It is within the scope of the present teachings for the VSCU unit 100 to build up and store schedules that are applicable for any of a variety of time periods (e.g., by month, by season, etc.) and then to later access those schedules at step 4204 for use as the next current schedule. Similar storage and recall methods are applicable for the historical RT/NRT setpoint entry databases that are discussed further hereinbelow.

At step 4206, a new day (or other suitable observation period, see discussion supra) of steady-state learning is begun. At step 4208, throughout the day, the thermostat receives and tracks both real-time (RT) and non-real time (NRT) user setpoint entries. At step 4210, throughout the day, the thermostat proceeds to control the HVAC system according to (i) the current version of the schedule, (ii) whatever RT setpoint entries are made by the user, and (iii) whatever NRT setpoint entries have been made that are causally applicable.

According to one optional alternative embodiment, step 4210 can be carried out such that any RT setpoint entry is only effective for a maximum of 4 hours (or other interval that is reasonably extensive but not permanent) in terms of the actual operating setpoint temperature, and then the operating setpoint temperature is returned to whatever would be dictated by the pre-existing setpoints on the current schedule, or whatever would be dictated by any causally applicable NRT setpoint entries. As another optional alternative, instead of reverting to any pre-existing setpoints after 4 hours that would otherwise be applicable, the operating setpoint instead reverts to a relatively low energy value, such as a lowest pre-existing setpoint in the schedule. This kind of "low-energy bias" operation, which can optionally be a user-settable mode of operation such that the user can activate it and de-activate it, can advantageously serve to drive the schedule to a kind of low-energy steady-state resulting schedule, which can save energy and money for the user. For simplicity and clarity of disclosure, however, it is presumed in the following description that such four hour reversions and/or "low-energy bias" modes are not activated.

At the end of the steady-state learning day such as at or around midnight, processing steps 4212-4216 are carried out. At step 4212, a historical database of RT and NRT user setpoint entries, which preferably extends back at least two weeks, is accessed. At step 4214, the day's tracked RT/NRT setpoint entries are processed in conjunction with the historical database of RT/NRT setpoint entries and the pre-existing setpoints in the current schedule to generate a modified version of the current schedule, using steps that are described further infra with respect to FIG. 10B. At step 4216, the day's tracked RT/NRT setpoint entries are then added to the historical database for subsequent use in the next iteration of the method, which continues onward into the future. Notably, at step 4218, it is determined whether there should be a substitution of the current schedule to something that is more appropriate and/or preferable, such as for a change of season (or a change of month, and so forth), and if so then that suitable schedule is accessed at step 4204 before the next iteration, and if not then the next iteration is begun at step 4206 using the most recently computed schedule. It is within the scope of the present teachings for the step 4218 to be carried out based on direct user instruction (e.g. through the cloud server or at the walk-up dial), based on remote instruction from an automated program running on the associated cloud server, based on remote instruction from a utility company, automatically based on the present date and/or current/forecasted weather trends, or any combination of the above.

Referring now to FIG. 10B, which corresponds to step 4214 of FIG. 10A, at step 4230 there is carried out steps similar to those of steps 4030-4040 of FIG. 8B, supra, to cluster, resolve, tag, and adjust the day's tracked RT/NRT setpoint entries and historical RT/NRT setpoint entries. At step 4232, all RT-tagged setpoints appearing in the results of step 4232 are identified as "pattern-candidate setpoints." At step 4234, the current day's pattern-candidate setpoints are compared to historical pattern-candidate setpoints to detect F therein, such as daywise or weekwise patterns, of similar effective times (e.g., within one hour of each other) and similar setpoint temperatures (e.g., not greater than 3 degrees F. apart). At step 4236, for any such patterns detected at step 4234 that include a current day pattern-candidate setpoint, that current day pattern-candidate setpoint is replicated across all other days in the schedule for which such pattern may be expected to be applicable. By way of example and not by way of limitation, Table 2 illustrates one particularly useful set of pattern-matching rules and associated setpoint replication rules.

TABLE 2

| If Today Was... | And the Detected Match Is With... | Then Replicate The Matched Setpoint Onto... |
|---|---|---|
| Tue | Yesterday | All Days Mon-Fri |
| | Last Tuesday | Tuesdays Only |
| Wed | Yesterday | All Days Mon-Fri |
| | Last Wednesday | Wednesdays Only |
| Thu | Yesterday | All Days Mon-Fri |
| | Last Thursday | Thursdays Only |
| Fri | Yesterday | All Days Mon-Fri |
| | Last Friday | Fridays Only |
| Sat | Yesterday | All 7 Days of Week |
| | Last Saturday | Saturdays Only |
| Sun | Yesterday | Saturdays and Sundays |
| | Last Sunday | Sundays Only |

TABLE 2-continued

| If Today Was . . . | And the Detected Match Is With . . . | Then Replicate The Matched Setpoint Onto . . . |
|---|---|---|
| Mon | Yesterday Last Monday | All 7 Days of Week Mondays Only |

For one preferred embodiment, in carrying out step 4236, the replicated setpoints are assigned the same effective time of day, and the same temperature value, as the particular current day pattern-candidate setpoint for which a pattern was detected. However, the scope of the present teachings is not so limited. In other preferred embodiments, the replicated setpoints can be assigned the effective time of day of the historical pattern-candidate setpoint that was involved in the match, and/or the temperature value of that historical pattern-candidate setpoint. In still other preferred embodiments, the replicated setpoints can be assigned the average effective time of day of the current and historical pattern-candidate setpoints that were matched, and/or the average temperature value of the current and historical pattern-candidate setpoints that were matched.

Subsequent to step 4236, at step 4238 the resulting replicated schedule of new setpoints is overlaid onto the current schedule of pre-existing setpoints. Also at step 4238, any NRT-tagged setpoints resulting from step 4230, supra, are overlaid onto the current schedule of pre-existing setpoints. At step 4240, the overlaid new and pre-existing setpoints are then mutually filtered and/or shifted in effective time using methods similar to those discussed supra for step 4046 of FIG. 8B. The results are then established at step 4242 as the newest version of the current schedule.

Examples of how setup interviews may be used in conjunction with pre-existing HVAC schedules and automated schedule learning are discussed in the following section.

HVAC Schedule Establishment in a VSCU Unit

This "HVAC Schedule Establishment in a VSCU Unit" subsection includes four subsections: (A) selecting pre-existing HVAC schedules based on a setup interview, (B) using automated schedule learning to update a pre-existing HVAC schedule selected based on a setup interview, (C) selecting HVAC schedules shared on a social networking service, and (D) using automated schedule learning to update a selected HVAC schedule that were shared on a social networking service (A) Selecting Pre-Existing HVAC Schedules Based on a Setup Interview HVAC schedules may be programmed for VSCU unit 100. According to some embodiments, the user's responses to the questions at the initial setup interview (e.g., the setup interview mentioned above) are used to automatically "snap" that household onto one of a plurality of pre-existing HVAC schedules or template schedules, i.e., a schedule of time intervals (e.g., weekdays and weekends) and set point temperatures or temperature selections for each time interval, stored in the VSCU unit and corresponding to some of the most common schedule paradigms, e.g., household life categories or business categories. Examples of the setup interview are discussed below.

According to some embodiments, the initial setup interview includes the following interactive questioning flow. The VSCU unit display format will look similar to FIGS. 7A-7C, with a first prompt being "Set-up VSCU for a: {Home} {Business}" where the notional "{X}" is used herein to denote that "X" is one of the user choices. If the user chooses "Home" then a first set of questions is asked, whereas if the user chooses "Business" then a second set of questions is asked. The first set of questions proceeds as follows: "Are you home at noon? {Usually} {Not Usually}" followed by "Are you home at 4 PM? {Usually} {Not Usually}" followed by "Do you have electric heat?" {Electric} {Not Electric} {I Don't Know}" followed by a request for location information such as the ZIP code and street address of the home. The second set of questions applicable to a business proceeds as follows: "Is this business open evenings? {Usually} {Not Usually}" followed by "Open Saturdays? {Usually} {Not Usually}" followed by "Open Sundays? {Usually} {Not Usually}" followed by "Do you have electric heat?" {Electric} {Not Electric} {I Don't Know}" followed by a request for location information such as the ZIP code and the street address of the business. It is to be appreciated that the above questions and selective answers are presented by way of example only, and not by way of limitation, and that many other questions and selective answers can be provided in addition to, or as an alternative to, these examples without departing from the scope of the present teachings.

According to some embodiments, the user's responses to the questions at the initial setup interview are used to automatically "snap" that household onto one of a plurality of pre-existing template schedules, i.e., a schedule of time intervals and set point temperatures for each time interval, stored in the VSCU unit and corresponding to some of the most common household or business schedule paradigms. Examples of different household schedule paradigms, each of which can correspond to a pre-existing HVAC schedule or template schedule, can include: working couple without kids; working couple with infants or young children; working family; working spouse with stay-at-home spouse; young people with active nightlife who work freelance from home; retired couple; and solo retiree. Examples of different business schedule paradigms, each of which can have its own pre-existing HVAC schedule or template schedule, can include: office buildings, businesses open only on the weekdays and daycare center. The template schedules to which the household is "snapped" at system initialization based on the setup interview (or at some other time upon user request) serve as convenient starting points for the operational control of the HVAC system for a large number of installations. The users can then modify their template schedules (e.g., using the user on the VSCU unit itself, the web interface, or smart phone interface, etc.) to suit their individual desires. The VSCU units may also modify these template schedules automatically based on automated schedule learning, i.e., learned occupancy patterns and manual user temperature control setting patterns. By way of nonlimiting example, a typical HVAC schedule or template schedule for a working family would be, for heating in wintertime "Mo Tu We Th Fr: [7:00 68] [9:00 62] [16:00 68] [22:00 62] Sa Su [7:00 68] [22:00 62]" (meaning that, for all five weekdays the set point temperatures will be 68 degrees from 7 AM-9 AM, then 62 degrees from 9 AM-4 PM, then 68 degrees from 4 PM-10 PM, then 62 degrees from 10 PM-7 AM, and that for both weekend days the set point temperatures will be 68 degrees from 7 AM-10 PM, then 62 degrees from 10 PM-7 AM), and for cooling in summertime, "Mo Tu We Th Fr: [7:00 75] [9:00 82] [16:00 78] [22:00 75] Sa Su [7:00 75] [9:00 78] [22:00 75]." In other embodiments, permissible swing temperature amounts, humidity ranges, and so forth can also be included in the template schedules.

According to some embodiments, the ZIP code of the household or business is asked at a point near the beginning of the setup interview, and then different setup interview questions can be asked that are pre-customized for different geographical regions based on the ZIP code. This is useful because the best set of interview questions for Alaskan homes or businesses, for example, will likely be different than the best set of interview questions for Floridian homes, for example.

The setup interview may include one or more closed-end questions, as described above, or open-ended questions. Specific embodiments of steps and features related to the setup interview are shown in the following figures.

Figure 11A:
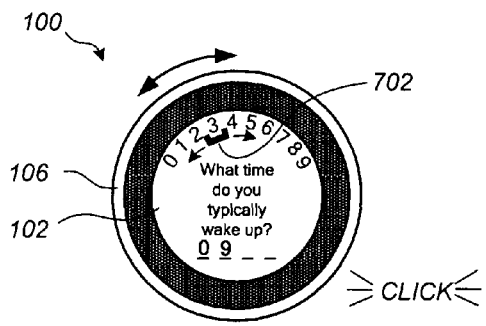
FIGS. 11A-11E illustrate generating input options and receiving input as part of a setup interview for programming an HVAC schedule for a VSCU unit or a thermostat according to an embodiment of the present invention.

FIGS. 13A-13E illustrate generating input options and receiving input as part of a setup interview for programming an HVAC schedule for a VSCU unit (e.g., VSCU unit 100) or thermostat according to an embodiment of the present invention. FIG. 11A illustrates a schedule interface including a generated input option, i.e., the visual inquiry: "What time do you typically wake up?". Responsive to a display of digits 0-9 distributed around a periphery of the circular display monitor 102 along with a selection icon 702, the user turns the outer ring 106 to move the selection icon 702 to the appropriate digit, and then provides an inward click command to enter that digit in order to provide a response to the input option. For example, FIG. 11A illustrates a received input that may correspond to a partial response indicating the hour (9 am, as the response may be provided in the 24 hour time format) but the minute has yet to be entered.

Figure 11B:
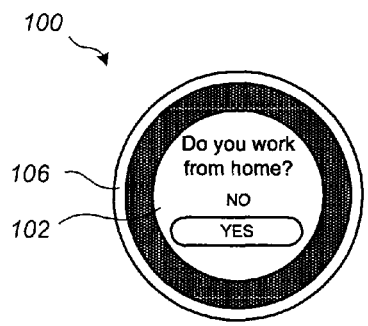
Figure 11C:
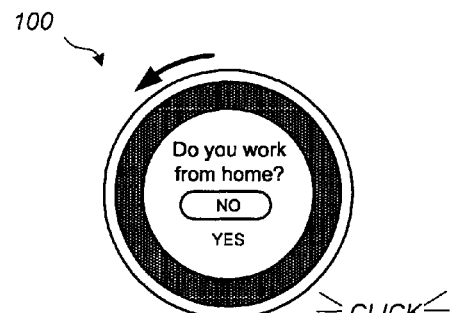

FIGS. 11B-11C illustrate a similar input functionality provided by the schedule interface of the VSCU unit 100 for answering another visual inquiry—"Do you work from home?"—during the setup interview. For example, the user rotates the outer ring 106 until the desired answer—YES or NO—is highlighted, and then provides an inward click command to enter that answer.

Figure 11D:
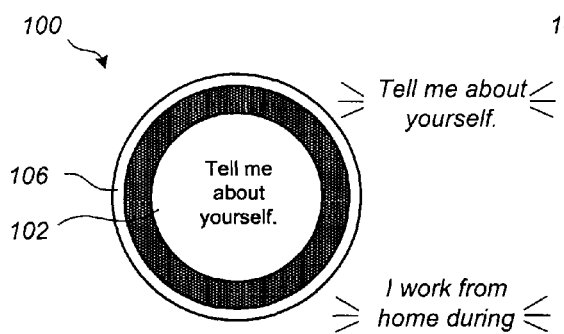
Figure 11E:
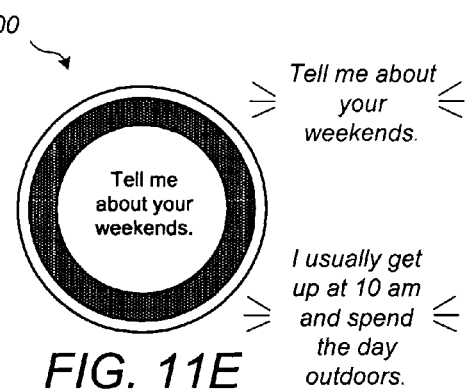

FIGS. 11D-11E illustrate an audio input option generated at the schedule interface. A visual version of this input option may be simultaneously generated at the schedule interface, as shown in FIGS. 11D-11E. FIG. 11D illustrates a schedule interface including a generated input option—an audible inquiry: "Tell me about yourself?". Responsive to the audibly generated input option, a user may respond, e.g., "I work from home during the week". As illustrated in FIG. 11E, subsequent input options may be generated based on the received input, e.g., the received input as shown in FIG. 11D. For example, following the input received at FIG. 11D, a follow-up question may be generated at the schedule interface as shown in FIG. 11E. The user has provided input corresponding to a weekday time interval at FIG. 11D, but input corresponding to the weekend time interval may also be useful in selecting a pre-existing HVAC schedule stored on VSCU unit 100 or a server accessible by VSCU unit 100. Accordingly, FIG. 11E illustrates a schedule interface including a generated input option—the audible inquiry: "Tell me about your weekends?". Responsive to the audibly generated input option, a user may respond, e.g., "I usually get up at 10 am and spend the day outdoors".

Alternatively, a schedule interface may be web-based. An example of a web-based schedule interface is shown in the following figures.

Figure 12A:
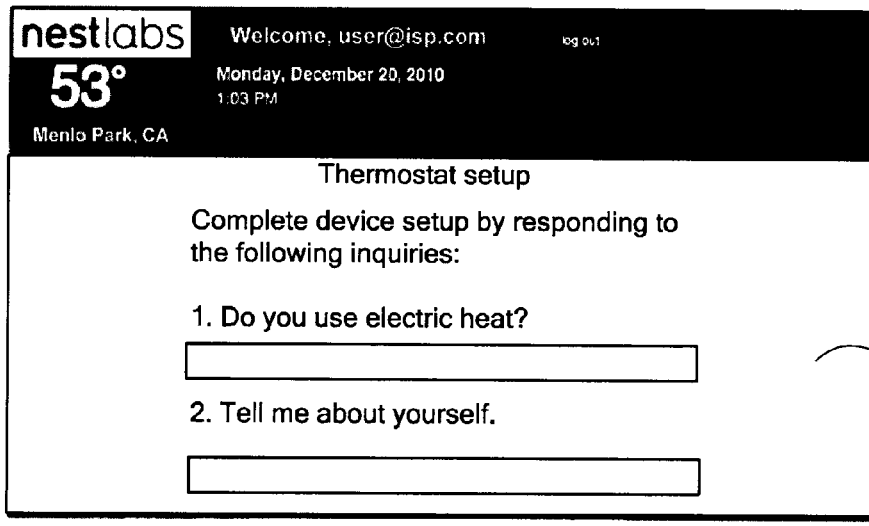
FIGS. 12A and 12B illustrate examples of remote, web-based schedule interfaces presented to the user on their data appliance for managing a VSCU unit, according to embodiments of the present invention.
Figure 12B:

FIGS. 12A and 12B illustrate examples of remote, web-based schedule interfaces that may be presented to the user on their data appliance for managing a VSCU unit 100 according to embodiments of the present invention. As will be discussed in greater detail below, a thermostat management account may be provided at VSCU unit 100 or at a thermostat management server or servers. A web-based schedule interface may be accessed at the thermostat management account via opening a browser 4400 to a URL associated with a thermostat management server using internet-accessible devices. Alternatively, a stand-alone application or "app" designed to be downloaded and run on a specific device such as a smart-phone 4405 or a tablet device running the Apple iOS operating system, Android operating system, or others and may be used to access the thermostat management account.

Input options and input corresponding to responses to the input options may be generated and received, respectively, at browser 4400 of an internet-enabled device, e.g., desktop computers and notebook computers. Similarly, as shown in FIG. 12B, input options and input corresponding to responses to the input options may be generated and received, respectively, at an app 4410 of an internet-enabled mobile device, e.g., smartphone or tablet. The web-based schedule interfaces of FIGS. 12A and 12B may also generate the input options generated at VSCU unit 100 in FIGS. 11A-11E or other input options enumerated herein.

VSCU unit 100, the devices of the web based interfaces of FIGS. 12A and 12B, and/or the thermostat management server may utilize speech recognition software and hardware and an inference engine that includes artificial intelligence tools. The inference engine may be capable of executing a series of logical steps to generate input options, processing received input and selecting HVAC schedules based on the received input as interpreted by the speech recognition software and hardware and corresponding pre-existing HVAC schedules stored on the VSCU unit 100 to the thermostat management server. A search engine may also be used to locate information on the Internet related to the received input in order to provide additional information to the inference engine. The inference engine not only may be used to select an HVAC schedule, but also to determine additional input options that can be generated in order receive input relevant to selecting an HVAC schedule.

Figures 1, 13A:
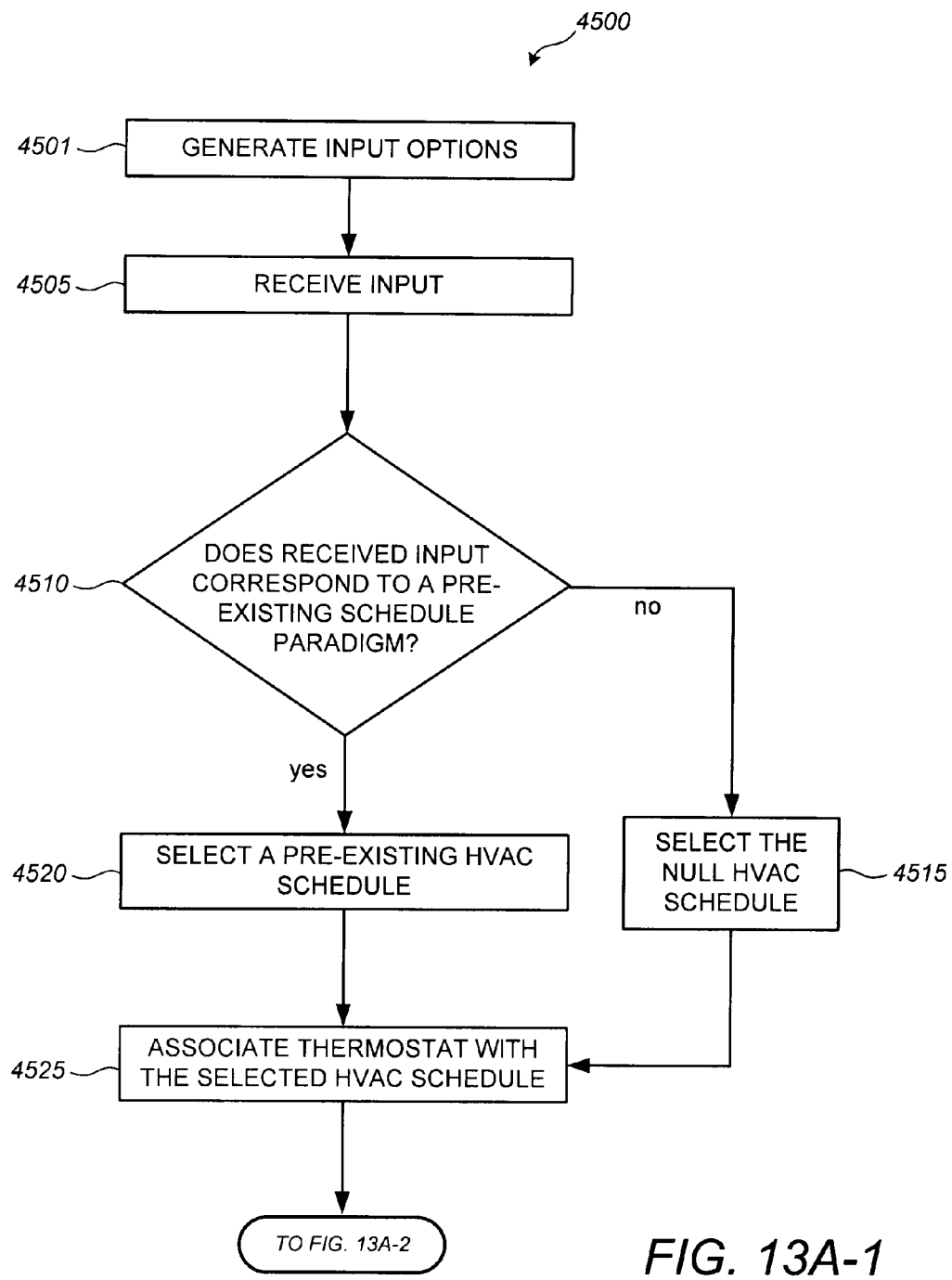
Figures 2, 13A:
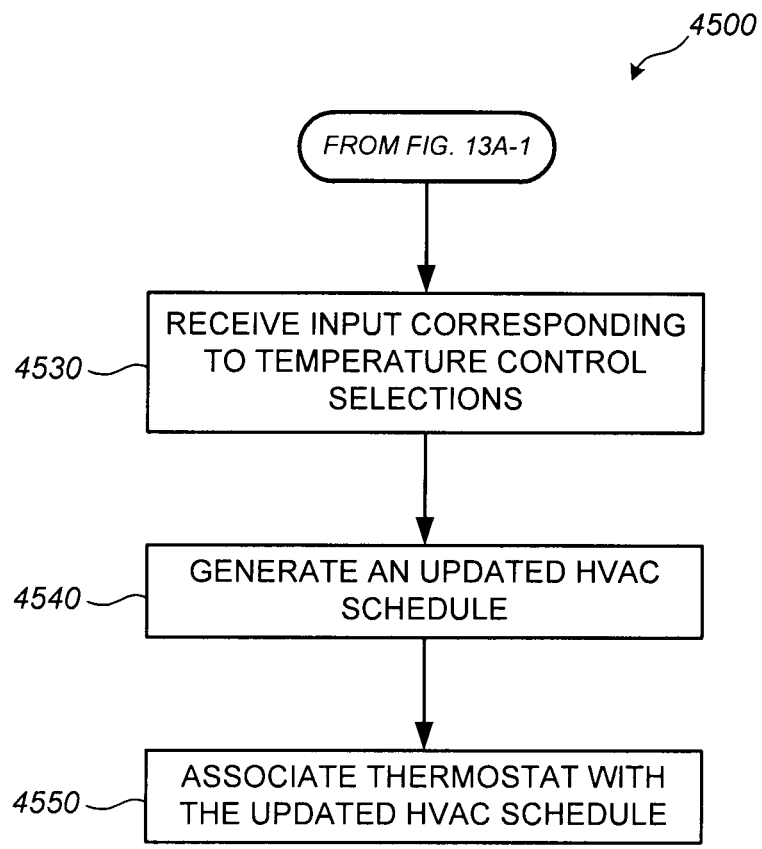

FIG. 13A-1 illustrates steps of a method 4500 for selecting a pre-existing HVAC schedule for a thermostat based on a setup interview according to embodiments of the present invention. At step 4501, input options may be generated at a schedule interface of the device. As discussed previously in greater detail, the input options may be audio input options (e.g., a voice prompt) and/or a visual input options (e.g., questions provided at a display of VSCU unit 100). These input options may correspond to a number of different inquiries, e.g., the open-ended and closed-ended questions enumerated above. Additional input options (e.g., follow-up questions) may be generated based on input received at the next step of method 4500-step 4505.

At step 4505, input may be received corresponding to responses to the input options of 4505. For example, a user may provide manual input (e.g., input as described with regard to FIGS. 7A-7C) or audio input (e.g., user may communicate responses using his or her voice) at the schedule interface. Again, as discussed above, this input may be provided at the VSCU unit 100 or at a web based interface.

At decision step 4510, if the received input does not correspond to a pre-existing schedule paradigm, then step 4515 is the next step of method 4500. That is, a null HVAC schedule may be selected at step 4515 if the received input does not correspond to a pre-existing schedule paradigm (e.g., schedule paradigms enumerated herein). The received input may not correspond to a pre-existing schedule paradigm for a number of reasons, e.g., the environment in which the thermostat is implemented is not common or the received inputs were not representative of the environment in which the thermostat is implemented. The null HVAC schedule may be one of the pre-existing HVAC schedules stored on the thermostat or on a server accessible by the thermostat. The null HVAC schedule may be a very common HVAC schedule such that it would a good starting point schedule regardless of the particulars of the environment in which the thermostat, e.g., VSCU unit 100, is implemented.

At decision step 4510, if the received input does correspond to a pre-existing schedule paradigm, then step 4520 is the next step of method 4500. At step 4520, an HVAC schedule is selected from the pre-existing HVAC schedules based on the input received at step 4505. For example, as discussed above, the received inputs may correspond to a schedule paradigm that corresponds to one of the pre-existing HVAC schedules. Thus, the received inputs may correspond to a pre-existing HVAC schedule that may be selected at step 4520. Examples of schedule paradigms and HVAC schedules are discussed above. Following step 4515 or step 4520, depending on step 4510, method 4500 may proceed to step 4525.

At step 4525, the thermostat may be associated with the HVAC schedule selected at step 4520 or 4515. That is, the selected HVAC schedule may be run or initiated on the thermostat. In some cases, a user may be given the option to confirm the selection of the HVAC schedule selected at step 4520 or 4515. The user or a server may also modify the selected HVAC schedule before it is initiated on the thermostat. For example, individual temperature selections may be modified, deleted or added to the selected HVAC schedule before it is initiated.

The HVAC schedule selected at step 4520 or 4515 may also be modified after the HVAC schedule is initiated at step 4525. An example of how the selected schedule may be updated is discussed in the following section.

(B) Using Automated Schedule Learning to Update a Pre-Existing HVAC Schedule Selected Based on a Setup Interview An implementation of automated schedule learning, as described above, may be included in the aforementioned VSCU unit 100. For example, VSCU unit 100 may include intelligent features that learn about users, beginning with a setup dialog (e.g., the setup interview as mentioned above) in which the user answers a few simple questions, and then continuing, over time, using multi-sensor technology to detect user occupancy patterns and to track the way the user controls the temperature using schedule changes and immediate-temperature control selections or inputs.

FIG. 13A-2 illustrates steps of a method 4500 for updating a selected HVAC schedule initiated on a thermostat using automated schedule learning according to embodiments of the present invention. This method of updating may be used to customize a pre-existing HVAC schedule or template schedule to the demands of a user and/or the environment in which a thermostat is implemented. As discussed below, the automated control learning portion of method 4500 may include three main steps.

At a step 4530, input is received corresponding to template control selections. Temperature control selections or setpoints may be manually provided by a user at a control interface. Similar to the schedule interface discussed above, the control interface may be a web-based interface or provided at a display of the thermostat. The temperature control selections may be made at the control interface, e.g., the interface described with respect to FIGS. 3A-5C. This input may be received during a time period subsequent to step 4525. The time period may be any length of time, e.g., a day, a week or a month.

At a step 4540, an updated HVAC schedule may be generated based on the HVAC schedule selected at step 4520 or 4515 and temperature control selections receiving during step 4530. Generating the updated HVAC schedule may include a number of subs-steps and may be characterized by different learning phases. For example, generating may include the following sub-steps: processing, replicating, overlaying, mutually filtering, clustering, harmonizing, comparing, and establishing. These subsets are further explained and variations thereof are provided in the paragraphs above corresponding to FIGS. 8A-10B. The generating of updated HVAC schedules may be accomplished under different modes of automated control learning, e.g., aggressive and steady state learning phases. These phases are further explained and variations thereof are provided in the paragraphs above corresponding to FIGS. 8A-10B.

At step 4550, the thermostat may be associated with the updated HVAC schedule generated at step 4540. That is, the updated HVAC schedule may be run or initiated on the thermostat. In some cases, a user may be given the option to confirm the selection of the HVAC schedule generated at step 4540. The user or a server may modify the updated HVAC schedule before it is initiated on the thermostat. For example, individual temperature selections may be modified, deleted or added to the updated HVAC schedule before it is initiated.

Although method 4500 of FIGS. 13A-1 and 13A-2 was discussed at least in part as being performed by a user, a server may also be used to perform method 4500.

(C) Selecting HVAC Schedules Shared on a Social Networking Service

Thermostats, e.g., VSCU unit 100, may include wired and wireless network connectivity as previously mentioned above. This network connectivity can be used to connect to third party social networking services, third-party on-line gaming services, and other on-line services. These services may serve as a forum for sharing and downloading HVAC schedules for a thermostat, e.g., VSCU unit 100. Examples of features and capabilities of embodiments of VSCU unit 100 are described in the following paragraphs.

Figure 14A:
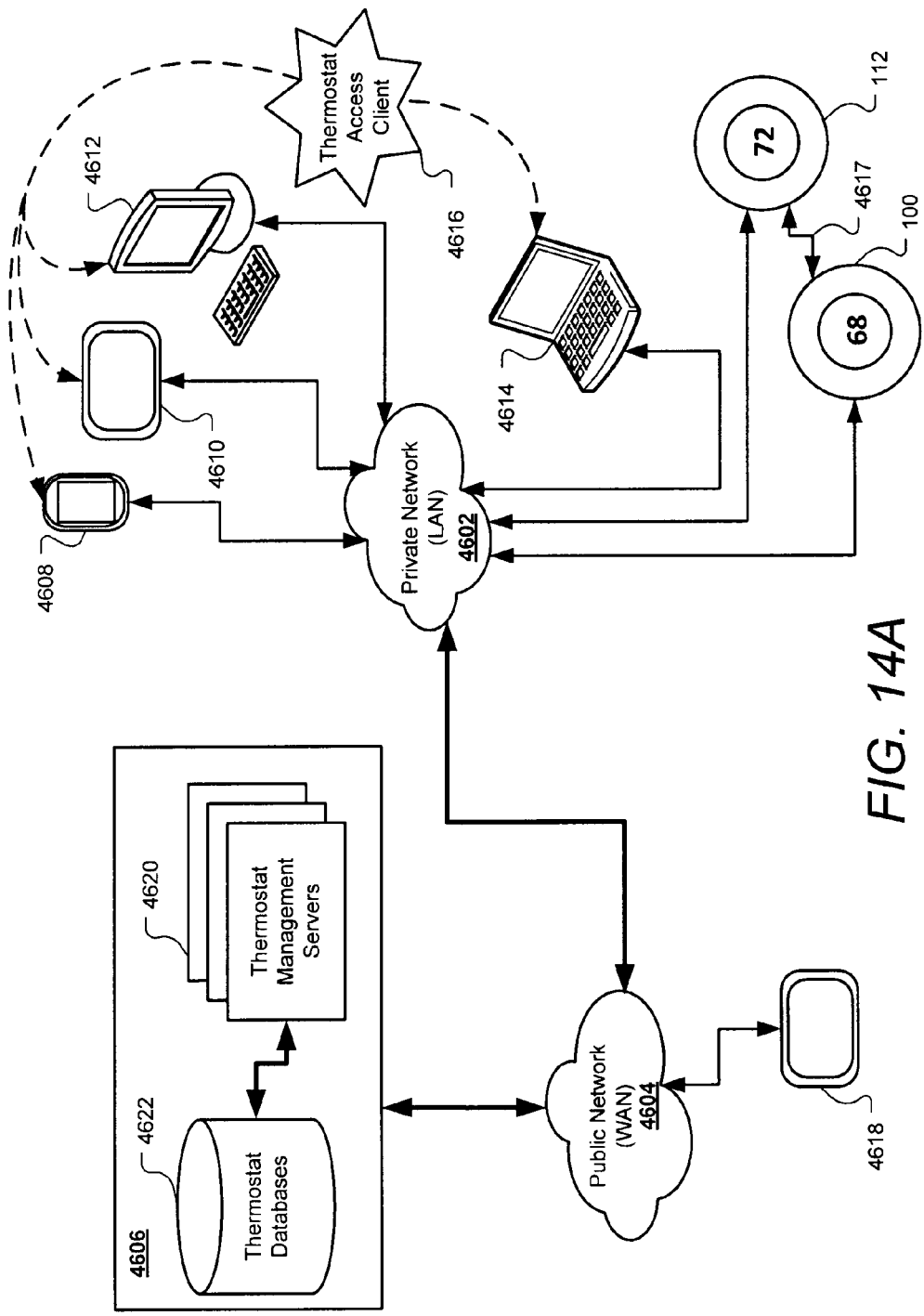
FIG. 14A illustrates thermostats and computers on a private network connected to a cloud-based thermostat management system designed in accordance with some embodiments.

FIG. 14A illustrates thermostats and computers on a private network 4602 connected to a cloud-based thermostat management system 4606 designed in accordance with some embodiments. In one embodiment, private network 4602 is designed to provide network connectivity primarily within and near an enclosure. Private network 4602 additionally provides network connectivity for various devices such a smartphone 4608, tablet 4610, computer 4612, and laptop 4614, as well as VSCU unit 100 and a remote VSCU unit 112. A router (not shown) in private network 4602, such as integrated router, may provide wired and wireless connectivity for these devices using a network protocol such as TCP/IP. Preferably, VSCU unit 100 and remote VSCU unit 112 are connected wirelessly to private network 4602, for at least the reason that wired connections to the locations of the thermostats may not available, or it may be undesirable to incorporate such physical connections in either VSCU unit 100 or remote VSCU unit 112. For some embodiments, it is also possible for VSCU unit 100 and remote VSCU unit 112 to communicate directly with each other and other devices wireless using an ad hoc network 4617 preferably setup directly between the devices and bypassing private network 4602.

The embodiments described herein are advantageously configured to be compatible with a large variety of conventional integrated routers that service a large population of homes and businesses. Thus, by way of example only and not by way of limitation, the router (not shown) that services the private network 4602 of FIG. 14A can be, for example, a D-Link DIR-655 Extreme N Wireless Router, a Netgear WNDR3700 RangeMax Dual Band Wireless USB Gigabit Router, a Buffalo Technology Nfiniti WZR-HP-G300NH Wireless-N Router, an Asus RT-N16 Wireless Router, Cisco Linksys E4200 Dual Band Wireless Router, or a Cisco Linksys E4200 Dual Band Wireless Router. Without loss of generality, some descriptions further hereinbelow will refer to an exemplary scenario in which VSCU unit 100 and/or remote VSCU unit 112 are used in a home environment. However, it is to be appreciated that the described embodiments are not so limited, and are applicable to use of such thermostat(s) in any of a variety of enclosures including residential homes, business, vacation homes, hotels, hotel rooms, industrial facilities, and generally anywhere there is an HVAC system to be controlled.

Thermostat access client 4616 is a client application designed in accordance with aspects of the present invention to access the thermostat management system 4606 over public network 4604. The term "thermostat management system" can be interchangeably referenced as a "cloud-based management server" for the thermostats, or more simply "cloud server", in various descriptions hereinabove and hereinbelow. Because thermostat access client 4616 is designed to execute on different devices, multiple client applications may be developed using different technologies based on the requirements of the underlying device platform or operating system. For some embodiments, thermostat access client 4616 is implemented such that end users operate their Internet-accessible devices (e.g., desktop computers, notebook computers, Internet-enabled mobile devices, cellphones having rendering engines, or the like) that are capable of accessing and interacting with the thermostat management system 4606. The end user machine or device has a web browser (e.g., Internet Explorer, Firefox, Chrome, Safari) or other rendering engine that, typically, is compatible with AJAX technologies (e.g., XHTML, XML, CSS, DOM, JSON, and the like). AJAX technologies include XHTML (Extensible HTML) and CSS (Cascading Style Sheets) for marking up and styling information, the use of DOM (Document Object Model) accessed with client-side scripting languages, the use of an XMLHttpRequest object (an API used by a scripting language) to transfer XML and other text data asynchronously to and from a server using HTTP), and use of XML or JSON (Javascript Object Notation, a lightweight data interchange format) as a format to transfer data between the server and the client. In a web environment, an end user accesses the site in the usual manner, i.e., by opening the browser to a URL associated with a service provider domain. The user may authenticate to the site (or some portion thereof) by entry of a username and password. The connection between the end user entity machine and the system may be private (e.g., via SSL). The server side of the system may comprise conventional hosting components, such as IP switches, web servers, application servers, administration servers, databases, and the like. Where AJAX is used on the client side, client side code (an AJAX shim) executes natively in the end user's web browser or other rendering engine. Typically, this code is served to the client machine when the end user accesses the site, although in the alternative it may be resident on the client machine persistently. Finally, while a web-based application over Internet Protocol (IP) is described, this is not a limitation, as the techniques and exposed user interface technologies may be provided by a standalone application in any runtime application, whether fixed line or mobile. It is to be appreciated that although the TCP/IP protocol is set forth as the network protocol used for communications among the thermostat management system 4606, the thermostat access client 4614, and other devices for some embodiments, it is set forth by way of example and not by way of limitation, with the use of any other suitable protocol, such as UDP over IP in particular, may be used without departing from the scope of the present teachings.

In yet another embodiment, thermostat access client 4616 may be a stand-alone application or "app" designed to be downloaded and run on a specific device such as smartphone 4608 or a tablet 4610 device running the Apple iOS operating system, Android operating system, or others. Developers create these stand-alone applications using a set of application programming interfaces (APIs) and libraries provided by the device manufacturer packaged in software development toolkit or SDK. Once completed, the "app" is made available for download to the respective device through an application store or "app" store curated by the app store owners to promote quality, usability and customer satisfaction.

In one embodiment, thermostat management system 4606 illustrated in FIG. 14A may be accessed over public network 4604 by computer devices on private network 4602 running thermostat access client 4616. Thermostat access client 4616 accesses a thermostat management account (not illustrated) provisioned by thermostat management system 4606, on behalf of the computer devices, in order to access or control VSCU unit 100 or remote VSCU unit 112. In addition, a computer device on private network 4602 such as computer 4612 may use the thermostat access client 4616 and thermostat management account on to gather data from VSCU unit 100 and remote VSCU unit 112.

VSCU unit 100 and remote VSCU unit 112 may be accessed remotely from numerous different locations on the private network 4602 or public network 4604. As will be described in further detail hereinbelow, upon installation a thermostat such as VSCU unit 100 first registers with the thermostat management system 4606 and then requests the thermostat management system create a pairing between the thermostat and a corresponding thermostat management account. Thereafter, a device such as a tablet 4618 may be connected to public network 4604 directly or through a series of other private networks (not shown) yet still access these thermostats, while outside the private network where they are located, by way of thermostat management system 506. In one embodiment, a tablet 4618 running the Apple iOS operating system may remotely access to these thermostats through the thermostat management system 4606 and thermostat management account using an iOS "app" version of thermostat access client 4616. Pairing thermostats with the thermostat management account allows tablet 4618 and other computer devices to remotely control, gather data, and generally interact with thermostats such as VSCU unit 100 and remote VSCU unit 112.

In one embodiment, thermostat management system 4606 distributes the task of communication and control with the thermostats to one or more thermostat management servers 4620. These thermostat management servers 4620 may coordinate communication, manage access, process data and analyze results using data produced by thermostats such as VSCU unit 100 and remote VSCU unit 112. Intermediate and final results from computations on these servers 4620, as well as raw data, may be stored temporarily or archived on thermostat databases 4622 for future reference and use. Thermostat management servers 4620 may also send a portion of the data along with control information, and more generally any of a variety of different kinds of information, back to VSCU unit 100 and remote VSCU unit 112. Results from the thermostat management servers 4620 may also be stored in one or more thermostat databases 4622 for subsequent access by a device such as tablet 4618 running thermostat access client 4616.

These thermostat management servers 4620 each may perform one or several discrete functions, may serve as redundant fail-over servers for these different discrete functions or may share performance of certain discrete functions in tandem or in a cluster as well as other combinations performing more complex operations in parallel or distributed over one or more clusters of computers. In some embodiments, one of the thermostat management servers 4620 may correspond directly to a physical computer or computing device while in other embodiments, the thermostat management servers 4620 may be virtualized servers running on one or more physical computers under the control of a virtual machine computing environment such as provided by VMWARE of Palo Alto, Calif. or any other virtual machine provider. In yet another embodiment, the thermostat management servers 4620 and thermostat databases 4622 are provisioned from a "cloud" computing and storage environment such as the Elastic Compute Cloud or EC2 offering from Amazon.com of Seattle, Wash. In an EC2 solution, for example, the thermostat management servers 4620 may be allocated according to processor cycles and storage requirements rather than according to a number of computers, either real or virtual, thought to be required for the task at hand.

Figure 14B:
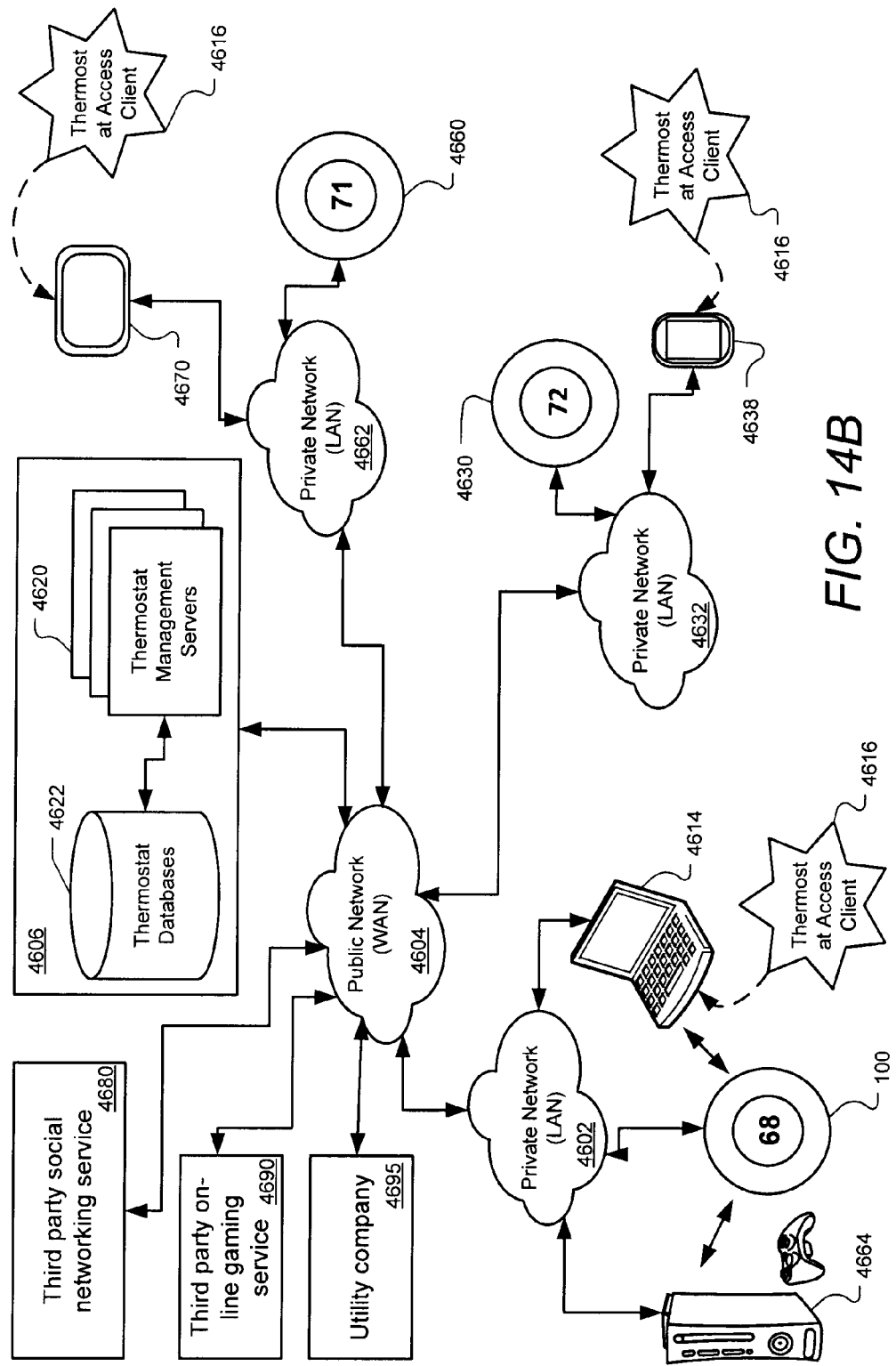
FIG. 14B illustrates a plurality of thermostats and other devices on plurality of private networks, according to some embodiments.

FIG. 14B illustrates a plurality of thermostats and other devices on plurality of private networks, according to some embodiments. Connected to the private network 4602, in addition to the VSCU unit 100 and computer 4614, are a number of other devices such as video game console 4664. Through connection to private network 4604 the VSCU unit 100 is able to interact with and serve as a "hub" for many appliances, devices and systems, as will be described in greater detail infra in relation to FIG. 16. Also shown are other private networks 4632 and 4662 each having user-friendly network-connected thermostat connected thereto. Each of the thermostats has the same or similar features as described with respect to VSCU unit 100. In particular, connected to private network 4632 are user-friendly network-connected thermostat 4630 and a smart phone 4638 running a version of the thermostat access client 4616. Connected to private network 4662 are user-friendly network-connected thermostat 4660 and a tablet 4670 running a version of the thermostat access client 4616. In this way, as will be described in greater detail herein, the respective users of the thermostats 100, 4630 and 4670 can share information (e.g. regarding the thermostats), and even compete with one another. As would be appreciated by one skilled in the art, although the computer 4614, smart phone 4638, and tablet 4670 are illustrated in FIG. 14B as being connected directly through their respective private local area networks 4602, 4632, and 4662 to the respective thermostats 100, 4630, and 4660 for clarity of presentation, it is not required that the devices running the thermostat access client 4616 be connected directly to their private local area networks to access their respective thermostats, but rather these devices can generally establish data communication with their respective thermostats from anywhere in the world where there is an available Internet connection through which the thermostat management system 4606 can be accessed.

Also shown connected to the public network 4604 is a third party social networking service 4680, a third-party on-line gaming service 4690, and a utility company 4695. Social networking service 4680 is an online service, platform, or site such as Facebook and Twitter that focuses on building and reflecting of social networks or social relations among people, who, for example, share interests and/or activities. The social network services are web-based and thereby provide means for users to interact over the Internet, such as e-mail and instant messaging. The service 4680 allows users to share ideas, activities, events, and interests. Preferably, the social networking service 4680 contains category places (such as former school year or classmates), means to connect with friends (usually with self-description pages), and a recommendation system linked to trust. Besides Facebook and Twitter which are used worldwide, other examples of service 4680 include, Nexopia, Bebo, VKontakte, Hi5, Hyves, Draugiem.lv, StudiVZ, iWiW, Tuenti, Nasza-Klasa, Decayenne, Tagged, XING, Badoo, Skyrock, Orkut, Mixi, Multiply, Wretch, renren, Cyworld, LinkedIn and Google+. Social network service 4680, according to some embodiments, allows the users to share and review various settings, features and algorithms that pertain to the thermostats. According to some embodiment the users can compete with each as a means of encouraging energy-savings behavior.

On-line gaming service 4690 are site(s), server(s), and/or service(s) that provide or facilitate video game play. In general on-line games can range from simple text based games to games incorporating complex graphics and virtual worlds populated by many players simultaneously. Many on-line games have associated online communities, making on-line games a form of social activity beyond single player games.

Examples of types of video games that can be facilitated using service 4690 include one or more of the following games and/or series of games: action games, such as shooter games, first-person shooter games (e.g. Doom, Team Fortress, Halo, Killzone, Metroid Prime, Unreal Tournament, Call of Duty, and TimeSplitters), third-person shooter games, massively multiplayer online games (e.g. Happy Farm, World of Warcraft, Final Fantasy), and fighting games; adventure games; action-adventure games (Assassin's Creed); role-playing games (Pokémon, Final Fantasy and Dragon Quest), simulation games (e.g. The Sims, Alter Ego, Animal Crossing, Harvest Moon, Jones in the Fast Lane, Little Computer People, Miami Nights: Singles in the City, Shin Megami Tensei: Persona, Singles: Flirt Up Your Life, and Tokimeki Memorial); social simulation games (e.g. FrontierVille, CityVille, Gardens of Time, FarmVille and The Sims Social); strategy games (e.g. Civilization, Heroes of Might and Magic, Panzer General, Age of Wonders); on-line collectable card games (e.g. Magic: The Gathering Online, Alteil, Astral Masters and Astral Tournament) music games (e.g. Guitar Hero, Audition Online, and X-Beat); dance games (e.g. Dance Dance Revolution); party games; puzzle games; sports games (e.g. FIFA, NBA Live, Madden Football, NHL, and Tiger Woods); racing games (e.g. Forza, Gran Turismo, and Mario Kart); trivia games; video games directed to different target age groups ranging from games intended for children, to games intended for teens, to games intended for adults; and educational games.

According to some embodiments, incentives and/or rewards can be awarded to users to provide encouragement to adopt energy-saving behaviors, as facilitated by the network-connected thermostat and associated home energy network platform as described herein. Examples of incentives and/or rewards include: points, credits, lives, money (e.g. coins or cash), status, cheat codes, unlock codes, hit or health points, experience points or levels, gifts, games items (such as weapons, buildings, farm animals, and cars), decorations, game players (e.g. draft picks) or allies, and game-related merchandise (such as souvenirs, clothing, toys, license plate covers, and action figures).

Figure 15:
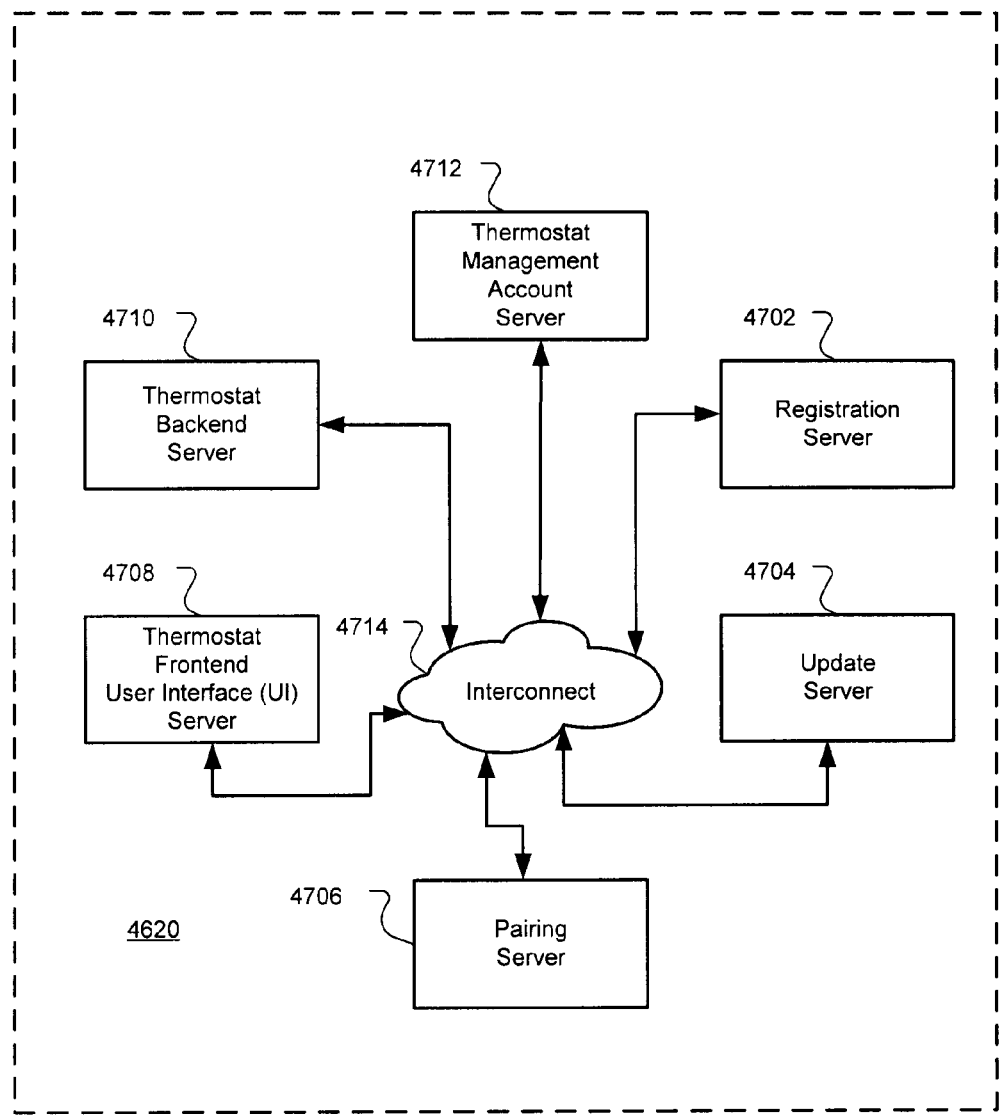
FIG. 15 illustrates one combination of thermostat management servers used to implement a thermostat management system in accordance with some embodiments.

FIG. 15 illustrates one combination of thermostat management servers 4620 used to implement a thermostat management system 4606 in accordance with some embodiments. In one embodiment, the thermostat management system 4606 includes a registration server 4702, an update server 4704, a pairing server 4706, a thermostat frontend user interface (UI) server 4708, a thermostat backend server 4710, and a thermostat management account server 4712. Interconnect 4714 may connect servers using one or more high-speed network connections, a shared back plane, a combination of local and remote high-speed connections as well as one or more virtualized connections. While the configuration of thermostat management servers 4620 is exemplary, it is should not be considered limiting in any way and it is contemplated that the distribution of functions may be handled through a different combination of servers and distribution of function over those servers.

In some embodiments, the thermostat management servers 4620 making up this thermostat management system 4606 may manage thermostats located in multiple enclosures across various geographic locations and time zones. Each enclosure may use one or several thermostats in accordance with embodiments of the present invention to control one or several HVAC systems, such as HVAC system 120 in FIG. 2B. In some cases, there may be an increased need from the thermostat management system 4606 for certain functions and therefore more servers to deliver these functional capabilities. It may be appreciated that the design of thermostat management system 4606 and use of the thermostat management servers 4620 may be scaled to meet these demands on the system and efficiently track and organize the data from these multiple enclosures and thermostats for processing, analysis, control and machine-learning purposes.

One embodiment of registration server 4702 provides a number of services related to registering a thermostat on the thermostat management system 4606 and preparing it for pairing with a thermostat management account. In operation, the registration server 4702 may be first accessed by a thermostat when the thermostat is wired to the HVAC of an enclosure and then connected to the Internet through a private network. To make the thermostat known on system 4620, the thermostat sends thermostat metadata from the private network to the public network, such as the Internet, and then onto processing by registration server 4702. Preferably, the thermostat metadata includes a unique thermostat identifier, such as one that is assigned at the time of manufacturing. As the communication that sends the thermostat metadata passes through the network address translator (NAT) of the router (not shown) that serves the associated private network (4602, 4632, 4662), it is appended with the public network address of that router, which is thus the public address that is "used" by the thermostat to communicate over the public network. The thermostat identifier is used to identify the thermostat from other thermostats being registered by registration server 4702 and may be based, in part or in whole, on a media access control (MAC) address assigned to the NIC of the thermostat. As one security measure against registering unauthorized devices, registration server 4702 may compare the MAC address in the thermostat metadata against a list of valid MAC addresses provided by the manufacturer of the thermostat or NIC component. In accordance with one embodiment, the thermostat registration is complete when the registration server 4702 provisions an entry in a thermostat registration pool and marks the thermostat entry ready to be paired with a thermostat management account. Entries in the thermostat registration pool may be referenced by their unique thermostat identifier, the public network address that they used (or, more particularly, the public address of the private network router through which they connect to the Internet), and optionally other relevant metadata associated with the thermostat.

In some embodiments, update server 4704 attempts to update software, firmware and configuration updates to each of the thermostats registered in the thermostat registration pool. If metadata from entries in the registration pool exclude versioning information, update server may need to further query each thermostat for current versions installed. Update server 4704 may access entries in the registration pool and then use corresponding network addresses in each entry to connect to the associated thermostat over the public network or private network, or both.

If newer software versions exist than currently used on a thermostat, update server 4704 proceeds to send software updates to the thermostat over the public network. For example, update server may use file transfer protocols such as ftp (file transfer protocol), tftp (trivial file transfer protocol) or more secure transfer protocols when uploading the new software. Once uploaded, installation and update of the software on the thermostat may occur immediately through an auto-update option on the thermostat or manually through the interface of the thermostat as requested by a user.

One embodiment of pairing server 4706 facilitates the association or "pairing" of a thermostat with a thermostat management account on thermostat management account server 4712. The term "thermostat management account" can be used interchangeably with "user account" herein unless specified otherwise. Once the thermostat is paired with a user account, a rich variety of network-enabled capabilities are enabled as described further herein and in one or more of the commonly assigned incorporated applications, supra. For example, once pairing has been achieved, a person with access to the thermostat management account may access the thermostat (through the thermostat management system 4606 using the thermostat access client 4616) for a variety of purposes such as seeing the current temperature of the home, changing the current setpoint, changing the mode of the thermostat between "home" and "away", and so forth. Moreover, the thermostat management system 4606 can then start tracking the various information provided by the thermostat which, in turn, enables a rich variety of cloud-based data aggregation and analysis that can be used to provide relevant reports, summaries, updates, and recommendations to the user either through the thermostat display itself, through the thermostat access client 4616, or both. A variety of other capabilities, such as demand-response actions in which the thermostat management server sends an energy alert and/or sends energy-saving setpoint commands to the thermostats of users who have enrolled in such programs, can be carried out.

In view of the importance of establishing a pairing between the thermostat and a thermostat management account, there is provided an ability for a fallback method of pairing, which can be termed a "manually assisted" method of pairing, that can take effect and be carried out in the event that the convenient auto-pairing methods described further hereinbelow cannot be securely and reliably carried out for a particular installation. The manually assisted method may use an alphanumeric "passcode" to pair the thermostat to the thermostat management account. Typically, the passcode is sent to the thermostat over a public network, like the Internet, and displayed on the display area of the thermostat. Authorization to access the thermostat is provided if the user obtaining the passcode from the display on the thermostat then enters it into a pairing dialog presented when the user logs into their thermostat management account. Pairing server 4706 pairs the thermostat with the user's thermostat management account if the user enters that same passcode that was displayed on their thermostat display.

According to a preferred "auto-pairing" method, the pairing server 4706 may automatically pair or "auto-pair" a thermostat management account to a thermostat if both are located on the same private network. If the thermostat and thermostat management account are associated with the same private network, embodiments of the present invention presume the thermostat is at the user's home, office, or other area where the user should also have control of the device. To make this determination automatically, the pairing server 4706 compares the public network address that was used to register the thermostat over the Internet with the public network address used by the computer device that has most recently been used to access the thermostat management account. Since the thermostat and computer device only have private network addresses, the router on the private network they share inserts the same public network address into their packets thus allowing the two devices to access servers, services, and other devices on the Internet. "Auto-pairing" takes advantage of this fact and automatically pairs devices sharing the same public network address. This is particularly advantageous from a user standpoint in that the user is not bothered with the need to enter a passcode or other alphanumerical identifier in order to achieve the pairing process, and avoids the concern that a user may inadvertently enter incorrect codes or identifiers into the system. Details on auto-pairing and manually assisted pairing are described in further detail later herein.

Thermostat front end user-interface (UI) server 4708 facilitates the generation and presentation of intuitive, user-friendly graphical user-interfaces that allow users to remotely access, configure, interact with, and control one or more of their network-connected thermostats 100/112 from a computer web browser, smartphone, tablet, or other computing device. The user-friendly graphical user-interfaces can also provide useful tools and interfaces that do not necessarily require real-time connectivity with the thermostats 100/112 with examples including, for some embodiments, providing user interfaces for displaying historical energy usage, historical sensor readings and/or occupancy patterns, allowing the user to learn about and/or enroll in demand-response programs, provide social networking forums that allow users to interact with each other in informative, competitive, fun ways that promote energy savings, provide access to local information including weather, public safety information, neighborhood calendar events, and local blogs, and more generally provide services and information associated with a comprehensive "energy portal" functionality. Examples of intuitive, user-friendly graphical user-interfaces provided by the UI server 4708 according to one or more preferred embodiments are described further in co-pending U.S. patent application Ser. No. 13/317,423.

In some embodiments, a thermostat access client user-interface displays an image of a house representing a primary enclosure paired to the thermostat management account in the thermostat management system. Thermostat front end UI server 4708 may further instruct the thermostat access client, such as thermostat access client 4616 in FIGS. 14A and 14B, to display images visually representative of one or more thermostats 100/112 inside the primary enclosure. By default, each of the one or more thermostat images may also display a current temperature measurement in the enclosure. In some embodiments, the user-interface may also further display an image of an additional house, or houses, representing a secondary enclosure having additional thermostats that are also paired to the thermostat management account. The image of the additional house may appear smaller, out of focus or generally deemphasized visually in relationship to the image of the house representing the primary enclosure. Additional enclosures beyond the secondary enclosure can also be displayed in the user interface and should also appear visually deemphasized compared with the image displayed for the primary enclosure. Further information on the thermostat access client and user-interface are described in more detail in co-pending U.S. patent application Ser. No. 13/317,423.

Thermostat backend server 4710 manages the storage of data used by various thermostat management servers in the thermostat management system 4606. In some embodiments, thermostat backend server 4710 may manage storage of the thermostat registration pool data used by the registration server 4702 or may organize and store new software updates and releases for the update server 4704. In another embodiment, thermostat backend server 4710 may also store heating and cooling related data (i.e., date and time HVAC system was in either heating or cooling mode within the enclosure), sensor information, battery-level data, alarms, etc. associated with an enclosure that was sent to the thermostat management system 4606 by thermostats registered therewith, and in some embodiments and provide pre-computed heating and cooling schedules, applications, and other data for download over the public network for use by the thermostats.

In some embodiments, thermostat management account server 4712 is used to create new accounts and update existing accounts on thermostat management system 4606. To access their thermostat over a thermostat access client 4616 and enjoy the benefits of thermostat connectedness, the user is first required to create of a thermostat management account ("user account") on thermostat management account server 4712 using their thermostat access client 4616. Accordingly, users execute the thermostat access client 4616 on a computer or other computer device to access the thermostat management account server 612. The thermostat management account server 4712 should receive at least the zip code and/or city and state for the enclosure in which the thermostat is (or will be) installed, such that weather information provided by a weather service can be accessed and downloaded to the thermostat, which can be used as part of its optimal enclosure characterization and HVAC control algorithms. Optionally, a variety of other information including a user's contact information, enclosure street addresses, and so forth can also be received. Primary options associated with the thermostat management account server 4712 include pairing one or more thermostats to the correct thermostat management account through pairing operations provided by pairing server 4706. However, even if the account is not yet paired with a thermostat, the user may use the thermostat management account to access local information including weather, public safety information, neighborhood calendar events, local blogs and more information based upon the user's contact information, locale and other interests.

Figure 16:
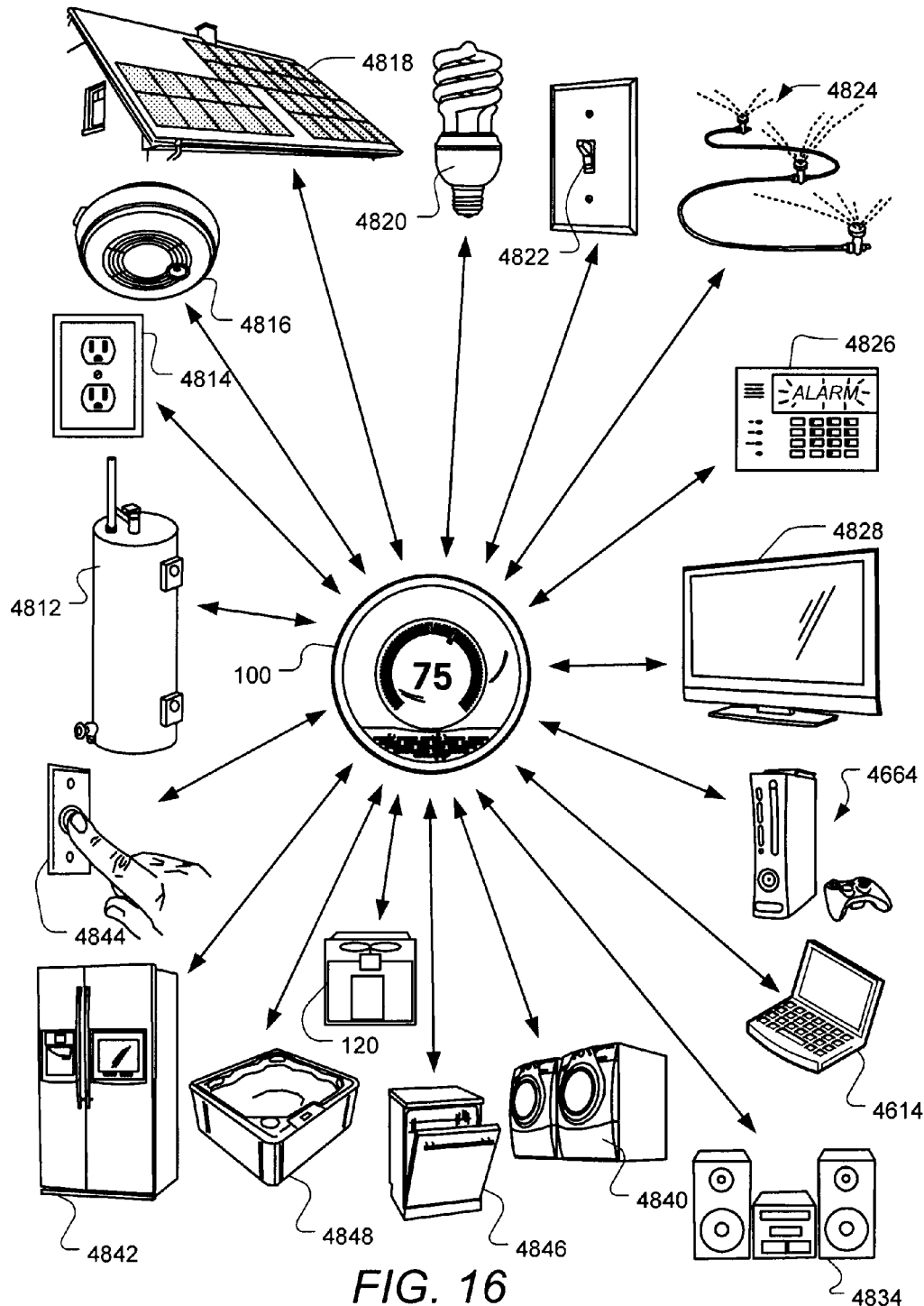
FIG. 16 is a diagram illustrating a network-connected user-friendly learning thermostat serving as a hub for managing, controlling or use, or facilitating the managing, controlling or use of various systems and devices in an energy efficient manner, according to some embodiments.

FIG. 16 is a diagram illustrating a network-connected user-friendly learning thermostat serving as a hub for managing, controlling or use, or facilitating the managing, controlling or use of various systems and devices in an energy efficient manner, according to some embodiments. VSCU unit 100 is shown serving as an HVAC-centric home energy hub based on an energy efficiency platform. According to some embodiments, VSCU unit 100 is connected or linked to (such as via a home network 4602 shown in FIGS. 14A and 14B) one or more household devices or systems, so as to allow management, control or use, or facilitating the managing, controlling or use thereof. Examples of household devices or systems include but are not limited to: a HVAC system, water heater 4812, electrical outlet(s) 4814, smoke and or carbon monoxide detector(s) 4816, solar panel array 4818, light(s) 4820, switch(es) 4822, sprinkler or irrigation system(s) 4824, home alarm system 4826, television(s) or display(s) 4828, video game console(s) 4664, computer 4614, stereo, sound system or audio system 4834, washer and dryer 4840, refrigerator 4842, doorbell 4844 and dishwasher 4846.

According to some embodiments, one or more of the household systems or devices connected or linked to VSCU unit 100 are compatible under license or other business arrangement with the thermostat unit manufacturer and/or thermostat data service provider. According to some embodiments, the VSCU unit 100 functional as central "energy hub" for the whole house. Especially for a residential context, it has been found that VSCU unit 100 is an advantageous way to instantiate such a "home energy network," at least because virtually all homes need to have a thermostat anyway. Once the VSCU unit 100 is installed (by replacement of an old thermostat, as part of new construction, etc.) and connected or paired (such as via local network 4602, public network 4604 and/or thermostat management system 4606 shown in FIGS. 14A, 14B and 15), it can effectively serve as the core for such a network. In this sense, a relatively seamless transition for most residences to the concept of a home energy network is provided, in that there is no extra hardware needed to be installed, plugged in, updated, and maintained, and likewise no need to have an always-on home computer loaded with an additional software (that in turn needs to be updated and maintained). Instead, the thermostat-centric home energy network is simply achieved by upgrading a home's old thermostat to the visually pleasing, easy-to-use VSCU unit 100. The various features and user interfaces of the thermostat-centric home energy network can be provided directly to the user's existing smartphones/tablets/browsers by virtue of the cloud-based thermostat management system 4606. At the user's own pace of implementation, which can correspond to natural product upgrade or replacement cycles, new devices such as those shown in FIG. 16 can be purchased and/or modified to contain a Wi-Fi and/or ZigBee communication capability and configured to communicate with the VSCU unit 100, which can then upload the various data to the cloud server, and can further receive and distribute control instructions from the cloud server to the various end devices. This can lead to one or more of the following exemplary advantageous uses. For example, using wireless communications the thermostat unit 100 can communicate with the dishwasher 4846, or the refrigerator 4842. If the user walks up to the dishwasher 4846 and attempts to start it, there can be a display on the dishwasher that says "Would you like to start the load now for $1, or wait until 2 AM and do the load for 20 cents?" The VSCU unit 100 serves and the conduit and core for such a platform. In one example of many advantages, with occupancy sensing the VSCU unit 100 can sense when the occupants are not home, and automatically command the refrigerator to turn up its set point by 2 degrees, and then command it to return to normal after the VSCU unit 100 has sensed that the occupants have returned. Similar functionalities can be provided in conjunction with any hot water heaters 4812, hot tubs or pool heaters 4848, and so forth that are equipped and licensed to be compatible with the VSCU unit 100. In another example occupancy information from VSCU unit 100 is used to manage outlets 4822 and lights 4816, for both intra-day and inter-day periods of non-occupancy. For inter-day periods, for example, the lights and certain outlets are controlled so as to provide for the appearance of occupancy to inexpensively and effectively increase home security. In another example, weather, climate, temperature, humidity and/or dew point, solar output, precipitation, and/or wind information that may be gathered already as part of the operation of VSCU unit 100 (for example from thermostat management system 4606) is used for improving energy and/or resource efficiency of sprinkler system 4824, hot-tub, spa or pools heating system 4848 and solar power array 4818. In a simple example, timing and watering days are adjusted due to forecast or detected rain and/or high temperatures. In another example, hot-tub, spa or pool heating system 4848 is also controlled according to occupancy information from VSCU unit 100, such as by reducing heating during long periods of non-occupancy and/or increasing heating during expected or detected occupancy or occupant arrivals. In another example, occupancy sensor information from VSCU unit 100 is used to supplement and increase the accuracy and reliability of home alarm system 4826. In another example, occupancy information from VSCU unit 100 is used to facilitate computer-related tasks on computer 4614 that maybe more efficient or less intrusive to carry out when the home is unoccupied, such as large data backups, software updates, and maintenance such as disk defragmentation. In another example, occupancy and/or installation information from VSCU unit 100 (such as whether the building is a home or business) can be used to adjust sensitivity to smoke detectors and/or carbon monoxide detectors 4816 so as to increase effectiveness while decreasing false alarms. In another example, water heater 4812 is adjusted to save energy during long periods of non-occupancy as determined by VSCU unit 100. According to some embodiments, the VSCU unit 100 works in connection with other home automation control systems such as INSTEON plug-in controllers for dimmers, lights, outlets, sprinklers, etc. For some cases, the VSCU unit 100 can achieve this control by virtue of programs and data that are stored at the VSCU unit 100 itself, optionally as updated by the cloud server as needed, while for other cases the VSCU unit 100 will be more of a communications conduit for data uptake to the cloud server and transmission of decisions made at the cloud server to the various network devices.

According to some embodiments, VSCU unit 100 is used in connection with video game console 4664 and/or computer 4614 to encourage adoption of energy-efficient behavior through the use of competition, game-related incentive or rewards, and/or exchange of thermostat-related settings or algorithms with other users.

As mentioned above, social network service 4680, according to some embodiments, may allow users to share and review various settings, features and algorithms that pertain to the thermostats. Social network service 4680 may also allow users to share HVAC schedules generated at a thermostat or elsewhere. On-line gaming service 4690 and other online forums or services may also allow users to share HVAC schedules.

Thermostat access client 4616 may access a thermostat management account (not illustrated) provisioned by thermostat management system 4606, on behalf of devices, in order to associate a pre-existing shared HVAC schedules with a VSCU unit 100. As mentioned above, thermostat access client 4616 may be a stand-alone application or "app" designed to be downloaded and run on a specific device such as smartphone 4608 or a tablet 4610 device running the Apple iOS operating system, Android operating system, or others. Thermostat access client 4616 may also be implemented such that end users operate their Internet-accessible devices (e.g., desktop computers, notebook computers, Internet-enabled mobile devices, cellphones having rendering engines, or the like) that are capable of accessing and interacting with the thermostat management system 4606 and the thermostat management account. The app or the browser may be used to access a social networking service 4680 or other online services to download shared HVAC schedules and the thermostat access client 4616 may be used to select the downloaded shared HVAC schedule and associate the selected HVAC schedule with the thermostat management account and ultimately the VSCU unit 100.

In some embodiments, a shared HVAC schedule may be downloaded based upon a setup interview, similar to the setup interview discussed in the paragraphs corresponding to FIGS. 1 IA-12B. For example, a setup interview may be used to provide a recommended list of shared HVAC schedules from which a shared HVAC schedule can be selected. Alternatively, a social profile may be analyzed (e.g., analyzed by the thermostat management account) in order to determine a schedule paradigm corresponding to the social profile, a zip code corresponding to the social profile, friends or contacts of the social profile and corresponding recommended HVAC schedules, or other information relevant to HVAC schedules. The determined information may correspond to shared HVAC schedules that can be selected and associated with a thermostat.

In other embodiments, a shared HVAC schedule may be downloaded based upon efficiency metrics corresponding to the shared HVAC schedules. For example, stand-alone performance metrics (SPM) and other metrics, which may be generated as part of a competition or otherwise, result in metrics related the HVAC schedules shared by the user and even the user themselves. Examples of the how to calculate metrics and the ecosystem for generating metric sharing communities are described in the following figures.

Figure 17:
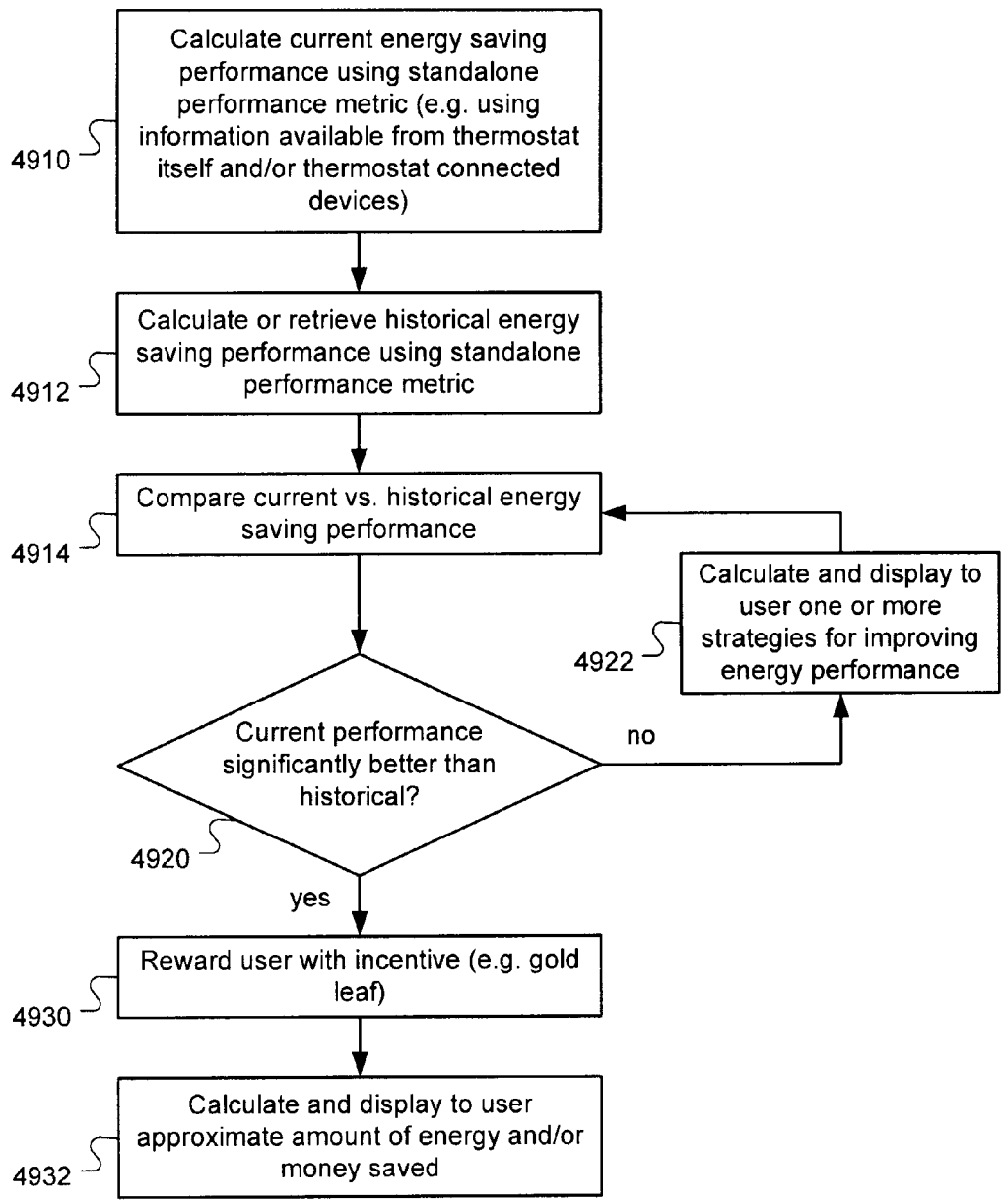
FIG. 17 is a flow chart illustrating aspects of encouraging adoption of energy efficient behavior using performance metrics through self-competition, that is, where a user is competing against their own historical record, according to some embodiments.
Figure 18:
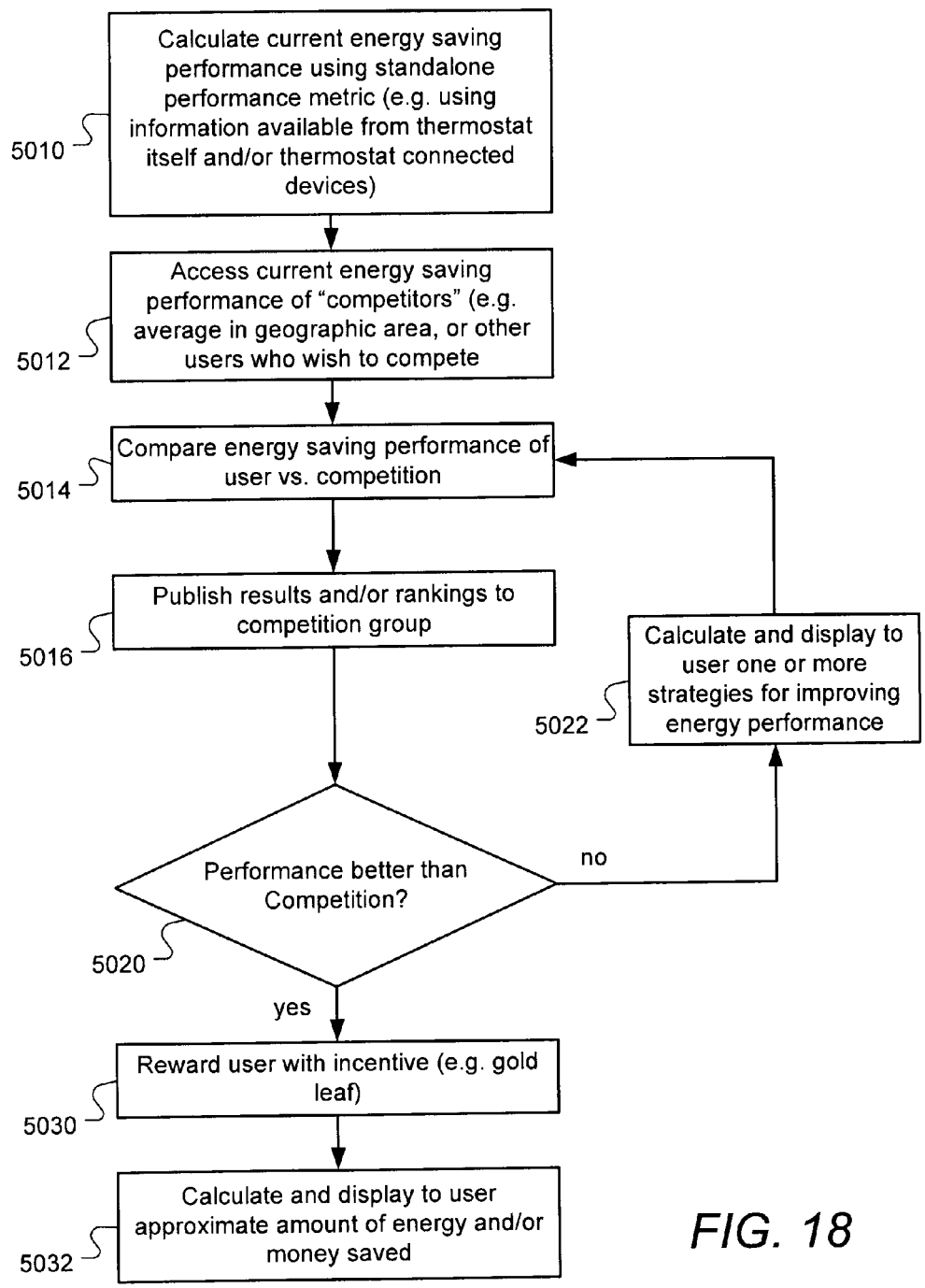
FIG. 18 is a flow chart illustrating aspects of encouraging adoption of energy efficient behavior using performance metrics through competition with others, according to some embodiments.

FIGS. 17-18 illustrate examples of encouraging adoption of energy efficient behavior using performance metrics that are based on data that is sensed or governed only by the thermostats themselves in their course of operation, termed herein stand-alone performance metrics (SPM). Competition based on SPM data is particularly advantageous in that it does not require cooperation from external data providers, such as electric utility smart-meter information that might be outside the ecosystem of the VSCU unit 100, and therefore is more readily implemented by a provider of the VSCU unit 100 and the cloud server support structure.

FIG. 17 is a flow chart illustrating aspects of encouraging adoption of energy efficient behavior using performance metrics through self-competition, that is, where a user is competing against their own historical record, according to some embodiments. In step 4910, according to some embodiments, the user's energy-saving performance is measured only by virtue of physical parameters that can be sensed or governed by the thermostat itself, in combination only with physical parameters that can be sensed or governed by the thermostats of their neighbors or other competition. By using such a stand-alone performance metric (SPM), the competition can be carried out by a provider of the thermostat and its associated cloud-based support system, without requiring cooperation from other vendors such as smart-meter providers. In step 4912, historical or baseline performance is either calculated or retrieved (e.g. from a database with thermostat management system 4606 in FIGS. 14A and 14B). In step 4914 the current performance is compared with the historical performance. In decision step 4920, if the current performance is not significantly greater (e.g. greater by more than a predetermined threshold percentage, such as 1-5%) than the historical performance, control passes back up to comparison step 4914. Optionally, in step 4922, one or more strategies for helping or encouraging the use to improve performance is calculated and displayed to the user either via the access client and/on device or on the VSCU unit 100 display. If the performance is significantly improved, then in step 4930 the user is rewarded with an incentive, such as s gold leaf displayed on the VSCU unit 100 or on the access client. According to some embodiments, other rewards or incentives, such as financial or video game rewards, are awarded. According to some embodiments, the length of time during which the improved behavior is adapted and/or the amount of performance increase is used to determine the amount of awards or rewards. For example, according to some embodiments the gold leaf award is only given if the user has maintained the energy efficient settings for more than one month. In step 4932, the amount of energy and/or money saved is calculated and/or displayed to the user.

According to some embodiments, an SPM is based only on the percentage of time that their HVAC system is cycled on ("on-time percentage" or "OTP"), wherein the performance metric is higher (better) when the on-time percentage is lower. For other embodiments, the user's energy-saving performance is measured only by virtue of physical parameters that can be sensed or governed by the thermostats themselves in combination with weather information that can be readily accessed based on the user's geographical information, such as ZIP code. For these embodiments, the standalone performance metric preferably is modified to take into account the outside weather, such as the outside temperature.

In one example, for a heating scenario, the SPM "M" can have the formula:

$$M = \frac{1}{1.0*OTP[T > 50° \ F.] + 0.6*OTP[30° \ F. < T \le 50° \ F.] + 0.3*OTP[T \le 30° \ F.]}$$

where OTP[T>50° F.] is the on-time percentage when the outside temperature is greater than 50 F, and OTP[30° F.<T≤50° F.] is the on-time percentage when the outside temperature is between 30 F-50 F, and so forth.

According to some other embodiments, the performance metrics can be more complex, including both HVAC performance and other energy performance metrics, such as can be acquired from homes with smart meters connected to the cloud.

FIG. 18 is a flow chart illustrating aspects of encouraging adoption of energy efficient behavior using performance metrics through competition with others, according to some embodiments. In step 5010, according to some embodiments, the user's energy-saving performance is measured using an SPM. In step 5012, current energy performance is either calculated or retrieved (e.g. from a database with thermostat management system 4606 in FIGS. 14A and 14B) for the user's competitors. According to one embodiment, the competitors are other users of similar network connected thermostats in the same local area (e.g. as could be determined by Zip code). According to some other embodiments, the competition group could be a custom group that is selected via the use of a third-party social networking site 4680 in FIG. 14B. For example, a competition group could be formed using Facebook or a similar service by asking friends or other users to "join" the competition group. In step 5014 the user's performance is compared against the performance of the competition group. According to some embodiments, the comparison in step 5014 could be performed in several ways, for example on ranking could be calculated in terms of current energy efficiency or some absolute or relative efficiency metric, while another ranking could be calculated in terms of most improved when compared with their own historical performance values. In other examples, the comparison in step 5014 could also include rankings with certain sub groups defined by metrics such as home size, type (apartment vs. single family home, geographic region, etc.) In step 5016, the results of the comparison or ranking in step 5014 may be published or distributed to the members of the defined competition group(s). In decision step 5020, if the user's performance is no better than the competition, control passes back up to comparison step 5014. The metric for "better" in decision 5020 can be made in several ways, especially when the competition group is large. For example, the threshold for an award or reward could be given for the top 20% of the group in terms of absolute efficiency and most improved. According to other examples, the awards could be given by high or top placings in one or more defined sub-groups. Optionally, in step 5022, one or more strategies for helping or encouraging the use to improve performance is calculated and displayed to the user either via the access client and/or device or on the VSCU unit 100 display. If the performance is worthy of an award, reward or other recognition, then in step 5030 the user is rewarded or recognized, which can include distributing the news of the winner(s), runners, up, etc. to the other members of the competition group. According to some embodiments, other rewards or incentives, such as financial or video game rewards are awarded. In step 5032, the amount of energy and/or money saved is calculated and/or displayed to the user or to other members of the competition group.

In addition to the efficiency metrics described in relation to FIGS. 17 and 18, other shared HVAC schedule efficiency metrics may include: the average (e.g., weekly, monthly) HVAC cost per square feet or cubic feet of a residence, business or other location; the average (e.g., weekly, monthly) hours a HVAC system is in operation per square feet or cubic feet of a residence, business or other location.

In some embodiments, the thermostat management account will allow user search for shared HVAC schedules on a social network service based on a corresponding metric score, or any other information relevant to selecting a shared HVAC schedule.

Specific embodiments of steps and features related to downloading HVAC schedules from social networking services are shown in the following figures.

Figures 1, 19A:
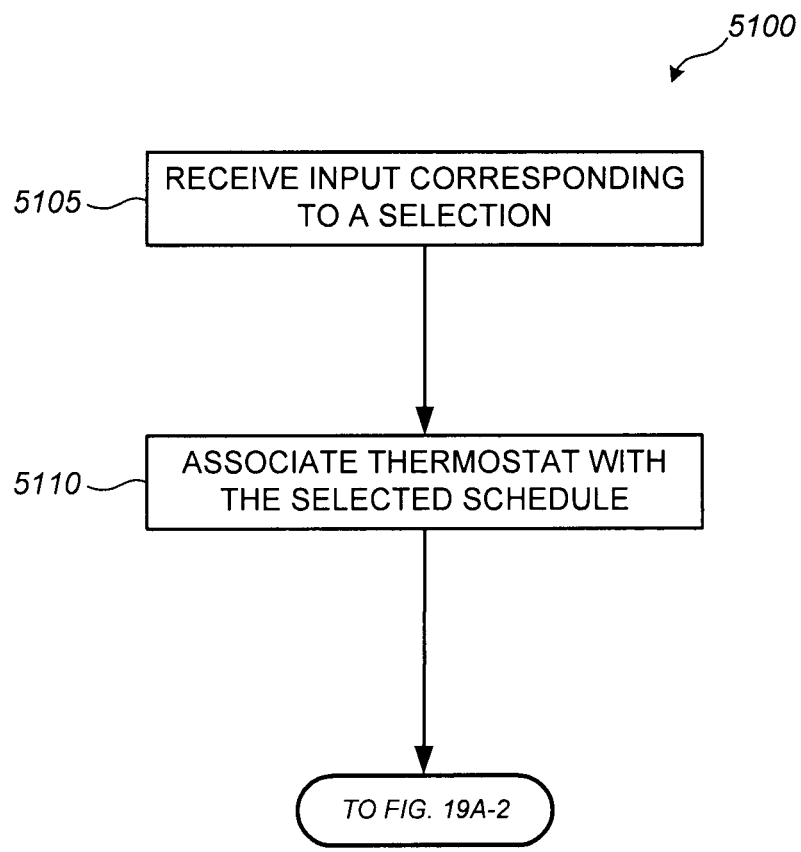
Figures 2, 19A:
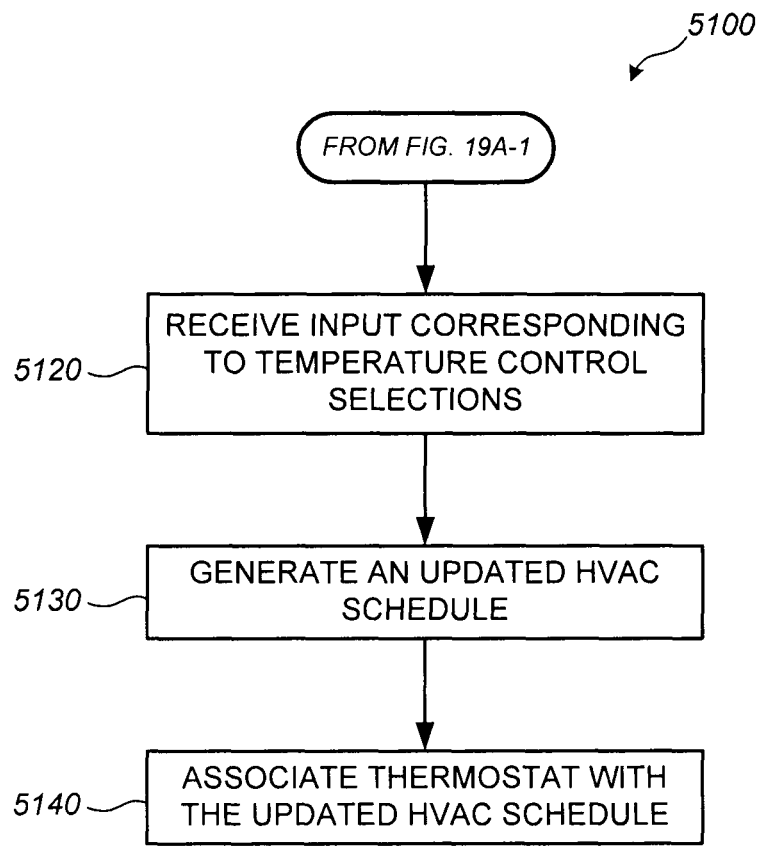

FIG. 19A-1 illustrates steps of a method 5100 for selecting HVAC schedules shared on a social networking service according to embodiments of the present invention. At step 5105, input may be received corresponding to a selection of a pre-existing HVAC schedule. The selected pre-existing HVAC schedule may be a HVAC schedule that was shared on a social networking service. The pre-existing HVAC schedule may be selected from a list of pre-existing HVAC schedules or a list of pre-existing schedules recommended based on the selection factors discussed above. Again, as discussed above, this input may be provided at the VSCU unit 100 or at a web based interface (e.g., an app or a web browser).

At step 5110, the thermostat may be associated with the pre-existing HVAC schedule selected at step 5105. That is, the selected HVAC schedule may be run or initiated on the thermostat of VSCU unit. The user or a server may modify the selected pre-existing HVAC schedule before it is initiated on the thermostat. For example, individual temperature selections may be modified, deleted or added to the selected HVAC schedule before it is initiated.

The selected pre-existing HVAC schedule may also be modified after the HVAC schedule is initiated at step 5100. An example of how the selected schedule may be updated is discussed in the following section.

(D) Using Automated Schedule Learning to Update a Selected HVAC Schedule that was Shared on a Social Networking Service As mentioned previously, an implementation of automated schedule learning, as described above, may be included with the aforementioned VSCU unit 100. For example, VSCU unit 100 may include intelligent features that learn about the users over time, using multi-sensor technology to detect user occupancy patterns and to track the way the user controls the temperature using schedule changes and immediate-temperature control selections or inputs.

FIG. 19A-2 illustrates steps of a method 5100 for updating a selected HVAC schedule initiated on a thermostat using automated schedule learning according to embodiments of the present invention. This method of updating may be used to customize a pre-existing HVAC schedule or template schedule to the demands of a user and/or the environment in which a thermostat is implemented. As discussed below, the automated control learning portion of method 5100 may include three main steps.

At a step 5120, input is received corresponding to template control selections. The temperature control selections may be provided at the control interface, e.g., as described with respect to FIGS. 3A-5C. The input may be received during a time period subsequent to step 5100. The time period may be any length of time, e.g., a day, a week or a month.

At a step 5130, an updated HVAC schedule may be generated based on the pre-existing HVAC schedule selected at step 5105 and temperature control selections receiving during step 5120. Generating the updated HVAC schedule may include a number of subs-steps and may be characterized by different learning phases. For example, generating may include the following sub-steps: processing, replicating, overlaying, mutually filtering, clustering, harmonizing, comparing, and establishing. These subsets are further explained and variations thereof are provided in the paragraphs above corresponding to FIGS. 8A-10B. The generating of updated HVAC schedules may be accomplished under different modes of automated learning, e.g., aggressive and steady state learning phases. These phases are further explained and variations thereof are provided in the paragraphs above corresponding to FIGS. 8A-10B.

At step 5140, the thermostat may be associated with the updated HVAC schedule generated at step 5130. That is, the updated HVAC schedule may be run or initiated on the thermostat. In some cases, a user may be given the option to confirm the selection of the HVAC schedule generated at step 5130. The user or a server may modify the updated HVAC schedule before it is initiated on the thermostat. For example, individual temperature selections may be modified, deleted or added to the updated HVAC schedule before it is initiated.

Although method 5100 of FIGS. 19A-1 and 19A-2 was discussed at least in part as being performed by a user, a server may also be used to perform method 5100. And although method 511 was discussed at least in part to HVAC schedules shared on a social network service, HVAC schedules shared on an online gaming service or other online forum.

The updated HVAC schedules generated at steps 5130 and 4540 above can be shared, similar to the way iTunes music play lists can be shared, optionally in a social networking context. For example, updated schedules can be shared on Facebook or MySpace or any other of the social networking services and online gaming services enumerated above. These updated schedules can be selected and initiated on other thermostats according to steps 5105 and 5110 above. Social network service 4680, according to some embodiments, may allow the users to review shared HVAC schedules. According to some embodiment the users can compete with each to receive the best reviews as a means of encouraging energy-savings behavior.

Another example of sharing updated HVAC schedules is shown in the following figure.

Figure 20:
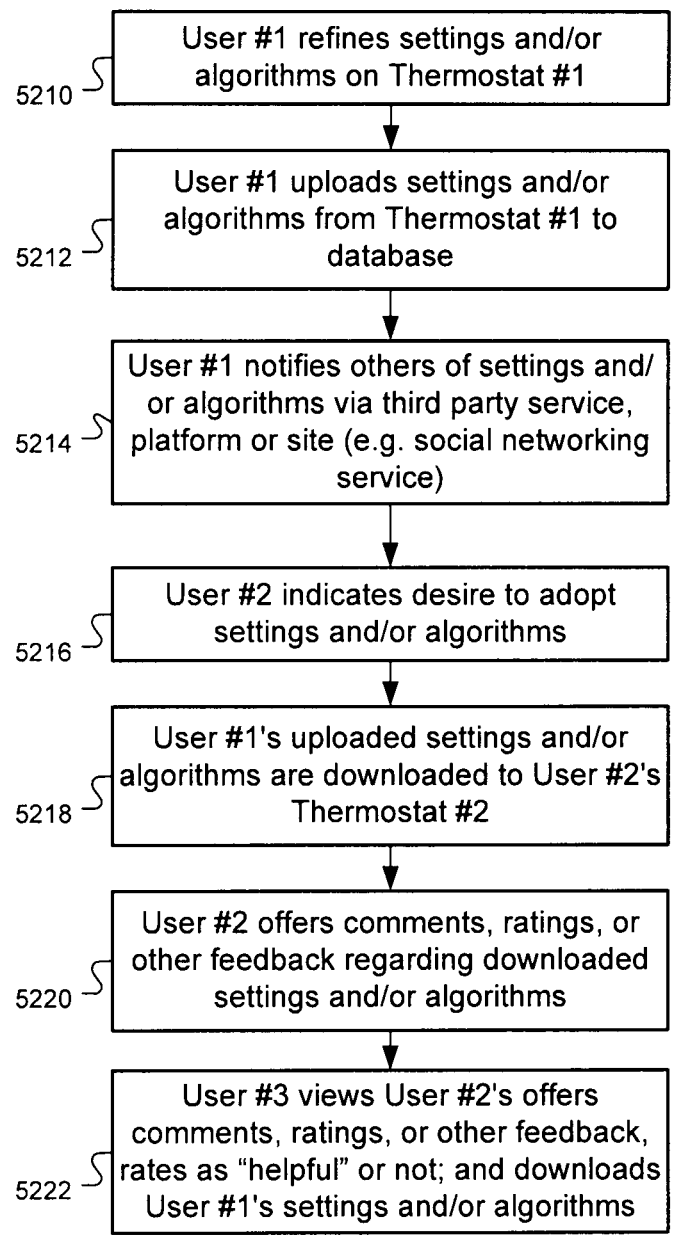
FIG. 20 is a flow chart illustrating aspects of encouraging adoption of energy efficient behavior through the sharing or thermostat settings (e.g., updated HVAC schedules) and/or algorithms, according to some embodiments.

FIG. 20 is a flow chart illustrating aspects of encouraging adoption of energy efficient behavior through the sharing or thermostat settings (e.g., updated HVAC schedules) and/or algorithms, according to some embodiments. In these examples, the sharing of thermostat settings and/or algorithms is facilitated using the thermostat access client 4616, thermostat management system 4606 and/or third party services such as services 4680 or 4690 shown in FIG. 14B, supra. Such sharing advantageously allows the user be able to click and download settings, such a particular the schedule. The selected setting is automatically loaded on the user's thermostat and the user does not need to be manually entered by the user. The types of settings shared in these examples can include simple settings such as a setpoint schedule found to be particularly useful to some users, to more advanced and/or obscure settings such as adjustments to sensor sensitivity. Examples of algorithms that might be shared include algorithms related to thermostat learning, auto-away/auto-arrival, and thermodynamic modeling of the thermostat's building or enclosure. In some examples the shared settings and/or algorithms are user-generated and in other examples the manufacturer of the thermostat generates them.

The sharing of settings and algorithms may be particularly useful among members of a specific demographic. For example, swing/non-standard shift workers may benefit from adopting a program setpoint schedule that more accurately reflects their occupancy and sleep patterns. In another example, swing/non-standard shift workers may benefit from occupancy algorithms that are more sensitive to occupancy detection during the nighttime. An example of such an algorithm may include decreasing the number of consecutive buckets of PIR sensor activity needed to activate an auto-away and/or auto arrival. For further details of thermostat sensing systems, see co-pending International Patent Application No. PCT/US11/61479, supra. For further details of auto-away and auto-arrival algorithms, see co-pending International Patent Application No. PCT/US11/61437, supra. Another example of types of algorithms that might be shared among thermostat owners relates to detection of the activity of household pets. In some cases, for example in mild climates it may be useful for the auto-away and auto-arrival algorithms to ignore the detection of pets, while in more extreme climates it may be useful not to ignore pets. Certain settings and/or algorithms may further be suited to households with large or small pets, for example settings relating to the PIR sensor angle of sensitivity may be set differently to ignore or detect occupancy and/or activity of certain sizes of pets. In another example, a first user may post a particular algorithm or setting for review by others. Other thermostat users may review the efficacy of algorithm or setting or even suggest changes. Yet other thermostat users may decide to adopt the posted algorithm or setting depending on such reviews.

In step 5210, a first user refines settings and/or algorithms in his or her thermostat. In step 5212, the first user uploads the settings and/or algorithms to a database, such as database 4622 shown in FIGS. 14A and 14B. In step 5214 the first user notifies others of the settings and/or algorithms. In some examples, this notification is via a third party service such as social networking service 4680 shown in FIG. 14B. In other examples, the notification is through a the thermostat access client 4616 and thermostat management services 4606, and potentially in the form of a forum or bulletin board accessible by registered users of network-connected thermostats. In step 5216 a second user sees the first user's notification and decides to adopt the first user's uploaded settings or algorithms. In step 5218 the second user downloads the settings and/or algorithms to his or her thermostat. In step 5220 the second user, after using the downloaded settings and/or algorithms for some time, offers comments, ratings or other feedback. In some examples, the feedback is posted publicly for other to see. In step 5222, a third user views second user's feedback and based on it decides to download the settings and/or algorithms. In some examples, the first user may modify the settings and/or algorithms in response to the second user's feedback, thereby improving the settings and/or algorithms. In some examples, users are asked to rate the shared material on a ratings scale of one to five stars, and other users may indicate whether or not they found another's review to be helpful.

Various modifications may be made without departing from the spirit and scope of the invention. Indeed, various user interfaces for operating thermostats, HVACSs and other devices have been provided yet the designs are meant to be illustrative and not limiting as to the scope of the overall invention. While methods and systems have been described for establishing HVAC schedules, it is contemplated that these methods may be applied to any to other schedules, e.g., watering schedules, indoor/outdoor lighting schedules, and security schedules. It is to be further appreciated that the term thermostat, as used hereinabove and hereinbelow, can include thermostats having direct control wires to an HVAC system, and can further include thermostats that do not connect directly with the HVAC system, but that sense an ambient temperature at one location in an enclosure and cooperatively communicate by wired or wireless data connections with a separate thermostat unit located elsewhere in the enclosure, wherein the separate thermostat unit does have direct control wires to the HVAC system. According to some embodiments, one or more of the above teachings is advantageously combined with one or more teachings of one or more of the following commonly assigned applications, each of which is incorporated by reference herein: International Application No. PCT/US12/00007 filed Jan. 3, 2012; U.S. Ser. No. 13/434,560 filed Mar. 29, 2012; and U.S. Ser. No. 13/624,875 filed Sep. 21, 2012. Accordingly, the invention is not limited to the above-described embodiments, but instead is defined by the appended claims in light of their full scope of equivalents.

What is claimed is:

1. A computer-implemented method for programming an HVAC schedule for a thermostat, comprising:

generating, by a computerized system, one or more input options on a schedule interface, wherein the one or more input options correspond to one or more questions posed to a user;

receiving, by the computerized system, input corresponding to one or more responses to the one or more input options, wherein the input is received at the schedule interface;

selecting, by the computerized system, an HVAC schedule with which to initialize the thermostat from a plurality of template HVAC schedules stored on the thermostat, wherein:

the selection of the template HVAC schedule is based on the received input, the template HVAC schedule is associated with a defined user type category corresponding to the one or more responses to the one or more questions, and the template HVAC schedule includes a set of time intervals and a set of pre-defined temperature settings that are based on the defined user type category;

associating, by the computerized system, the thermostat with the selected HVAC schedule, wherein associating includes initiating the selected HVAC schedule on the thermostat for a first time period;

receiving, during the first time period subsequent to the association, input of one or more real-time user setpoints that each indicate a setpoint temperature, wherein:

each setpoint temperature is effectuated immediately by the thermostat upon reception of the corresponding real-time user setpoint of the one or more real-time user setpoints; and the input corresponding to the one or more real-time user setpoints is received on a control interface;

generating an updated HVAC schedule for the first time period based at least in part on the selected HVAC schedule and the one or more real-time user setpoints, said generating comprising:

processing the received one or more real-time user setpoints together with one or more times at which the one or more real-time user setpoints were made to compute one or more candidate setpoints representative of user-desired temperatures and associated setpoint times for future instances of said first time period; and mutually filtering the one or more candidate setpoints with the selected HVAC schedule according to a predetermined filtering algorithm to generate the updated schedule; and associating the thermostat with the updated HVAC schedule, wherein associating includes initiating the updated HVAC schedule on the thermostat for the first time period.

2. The computer-implemented method of claim 1, wherein the schedule interface is a web-based interface or provided at a display of the thermostat.

3. The computer-implemented method of claim 1, wherein the one or more input options are visually or audibly generated.

4. The computer-implemented method of claim 1, wherein the received input is an audio input.

5. The computer-implemented method of claim 1, wherein the plurality of template HVAC schedules is stored on a server accessible by the thermostat.

6. The computer-implemented method of claim 1, wherein the received input can correspond to one or more of a plurality of template schedule paradigms, and wherein the plurality of template schedule paradigms correspond to one or more of the template HVAC schedules stored on the thermostat.

7. The computer-implemented method of claim 6, wherein the inquiries include one or more of the following: "Do children live at this residence?", "Tell me about yourself", and "Is this business open on the weekends?".

8. The computer-implemented method of claim 6, wherein the defined user type category includes one or more of the following: working couple without kids, working spouse with stay-at-home spouse, young people with active nightlife who work from home, office building, and businesses open only on the weekdays.

9. The computer-implemented method of claim 6, wherein one or more of the input options is generated based on at least one of the one or more responses.

10. The computer-implemented method of claim 6, wherein the plurality of template HVAC schedules includes a null HVAC schedule, and wherein the null HVAC schedule is the selected HVAC schedule when the received input does not correspond to one or more of the plurality of template schedule paradigms.

11. The computer-implemented method of claim 1, further comprising:

associating the thermostat with the selected HVAC schedule, wherein associating includes initiating the selected HVAC schedule on the thermostat for a second time period;

receiving, during the second time period subsequent to the association, further input corresponding to one or more additional temperature control selections, wherein the further input is received on a control interface;

generating an updated HVAC schedule for the second time period based at least in part on the selected HVAC schedule and the one or more real-time user setpoints of the first time period, and the one or more additional temperature control selections of the second time period; and associating the thermostat with the updated HVAC schedule, wherein associating includes initiating the updated HVAC schedule on the thermostat for the second time period.

12. The computer-implemented method of claim 1, wherein generating the updated HVAC schedule based on the selected HVAC schedule and the one or more real-time user setpoints further comprises:

processing the received one or more real-time user setpoints to detect one or more intended new temperature selections, the detected one or more real-time user setpoints correspond to one of the time intervals;

replicating the detected one or more intended new temperature selections throughout the corresponding time intervals;

overlaying the replicated one or more intended new temperature selections and the detected one or more intended new temperature selections onto the selected HVAC schedule; and mutually filtering the overlayed new temperature selections and temperature selections of the selected HVAC schedule to generate the updated schedule.

13. The computer-implemented method of claim 12, wherein processing the received one or more real-time user setpoints to detect the one or more new temperature selections for the time period comprises:

clustering temperature control selections of the received one or more real-time user setpoints into clusters, wherein each of the clusters corresponds to a temperature selection at a point in time within one of the time intervals, wherein each of the received one or more real-time user setpoints correspond to a point in time, and wherein the received one or more real-time user setpoints that occur at nearby points in time are clustered into the same cluster;

harmonizing the one or more real-time user setpoints of each of the one or more of the clusters according to predetermined harmonization rules to generate single candidate temperature selections representative of each one of the clusters;

comparing one or more of the single candidate temperature selections to others of the single candidate temperature selections that correspond to similar points of time within the times intervals to detect patterns of similar candidates over multiple time intervals; and establishing one or more of the single candidate temperature selections as one or more of the one or more intended new temperature selections if a pattern-establishing threshold of a number of similar candidates is met.

14. The computer-implemented method of claim 13, wherein generating the updated HVAC schedule based on the selected HVAC schedule and the one or more real-time temperature control selections is characterized by one or more of aggressive and steady state learning phases, the pattern-establishing threshold of the steady state learning phase being larger than the pattern-establishing threshold of the aggressive state learning phase, wherein, if the null schedule is the selected HVAC schedule, the aggressive state learning phase is applied before the steady state learning phase is applied, and wherein, if the null schedule is not the selected HVAC schedule, only the steady state learning phase is applied.

15. A computer-implemented method for programming an HVAC schedule for a thermostat, comprising:
receiving, by a computer system, input corresponding to a selection of a pre-existing HVAC schedule, wherein the pre-existing HVAC schedule was shared on a social networking service,
associating, by a computer system, the thermostat with the selected pre-existing HVAC schedule, wherein associating includes initiating the selected pre-existing HVAC schedule on the thermostat for a first time period;
receiving, during a time period subsequent to the association, input of one or more real-time user setpoints that each indicate a setpoint temperature, wherein:
each setpoint temperature is effectuated immediately by the thermostat upon reception of the corresponding real-time user setpoint of the one or more real-time user setpoints; and
the input is received on a control interface;
generating an updated HVAC schedule based on the selected pre-existing HVAC schedule and the one or more real-time user setpoints wherein generating the updated HVAC schedule based on the selected pre-existing HVAC schedule and the one or more real-time user setpoints comprises:
processing the received one or more real-time user setpoints together with one or more times at which said temperature control selections were made to compute one or more candidate setpoints representative of user-desired temperatures and associated setpoint times for future instances of said first time period; and
mutually filtering said one or more candidate setpoints with said selected HVAC schedule according to a predetermined filtering algorithm to generate the updated schedule; and
associating, by the computer system, the thermostat with the updated HVAC schedule, wherein associating includes initiating the updated HVAC schedule on the thermostat.

16. The computer-implemented method of claim 15, wherein the selection of the pre-existing HVAC schedule is based on one or more of the following: a social profile corresponding to the pre-existing HVAC, a location where the pre-existing HVAC schedule was generated, one or more responses to one or more input options, and a metric of efficiency corresponding to the pre-existing HVAC schedule.

17. The computer-implemented method of claim 15, wherein the selected pre-existing HVAC schedule was included on a list of recommended pre-existing HVAC schedules, and wherein the list of recommended pre-existing HVAC schedules was generated based on one or more of the following: a social profile corresponding to the pre-existing HVAC, a location where the pre-existing HVAC schedule was generated, one or more responses to one or more input options, and a metric of efficiency corresponding to the pre-existing HVAC schedule.

18. The computer-implemented method of claim 15, social networking service is an online gaming service.

19. The computer-implemented method of claim 15, further including sharing the updated HVAC schedule on a social network service.

20. The computer-implemented method of claim 15, wherein the selected pre-existing HVAC schedule includes time intervals with temperature selections corresponding to each of the time intervals.

21. The computer-implemented method of claim 20, wherein generating the updated HVAC schedule based on the selected pre-existing HVAC schedule and the one or more real-time user setpoints comprises:
detecting one or more intended new temperature selections from the received one or more real-time user setpoints, the detected one or more intended new temperature selections corresponding to one of the time intervals;
replicating the detected one or more intended new temperature selections throughout the corresponding time intervals;
overlaying the replicated one or more intended new temperature selections and the detected one or more intended new temperature selections onto the selected pre-existing HVAC schedule; and
mutually filtering the overlayed new temperature selections and temperature selections of the selected pre-existing HVAC schedule according to generate the updated schedule.

22. The computer-implemented method of claim 21, wherein processing the received one or more real-time user setpoints to detect the one or more new temperature selections for the time period comprises:
clustering temperature control selections of the received one or more real-time user setpoints into clusters, wherein each of the clusters corresponds to a temperature selection at a point in time within one of the time intervals, wherein each of the received one or more real-time user setpoints correspond to a point in time, and wherein the received one or more real-time user setpoints that occur at nearby points in time are clustered into the same cluster;
harmonizing the one or more real-time user setpoints of each of the one or more of the clusters according to predetermined harmonization rules to generate single candidate temperature selections representative of each one of the clusters;
comparing one or more of the single candidate temperature selections to others of the single candidate temperature selections that correspond to similar points of time within the times intervals to detect patterns of similar candidates over multiple time intervals; and
establishing one or more of the single candidate temperature selections as one or more of the one or more intended new temperature selections if a pattern-establishing threshold of a number of similar candidates is met.

23. The computer-implemented method of claim 22, wherein generating the updated HVAC schedule based on the selected HVAC schedule and the one or more real-time user setpoints is characterized by a steady state learning phase.

24. The computer-implemented method of claim 1, wherein the computerized system is part of the thermostat.

25. The computer-implemented method of claim 15, wherein the computer system is part of the thermostat.

* * * * *